US012199031B2

(12) United States Patent
Zhu

(10) Patent No.: US 12,199,031 B2
(45) Date of Patent: Jan. 14, 2025

(54) INTERCONNECTION STRUCTURE, CIRCUIT AND ELECTRONIC APPARATUS INCLUDING THE INTERCONNECTION STRUCTURE OR CIRCUIT

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 574 days.

(21) Appl. No.: 17/594,753

(22) PCT Filed: May 30, 2019

(86) PCT No.: PCT/CN2019/089286
§ 371 (c)(1),
(2) Date: Oct. 28, 2021

(87) PCT Pub. No.: WO2020/224018
PCT Pub. Date: Nov. 12, 2020

(65) Prior Publication Data
US 2022/0246520 A1 Aug. 4, 2022

(30) Foreign Application Priority Data
May 5, 2019 (CN) .......................... 201910369630.9

(51) Int. Cl.
*H01L 23/522* (2006.01)
*H01L 21/768* (2006.01)
*H01L 23/528* (2006.01)

(52) U.S. Cl.
CPC ...... *H01L 23/5226* (2013.01); *H01L 23/5283* (2013.01); *H01L 21/76877* (2013.01); *H01L 21/76897* (2013.01)

(58) Field of Classification Search
CPC ............. H01L 23/5226; H01L 23/5283; H01L 21/76877; H01L 21/76897;
(Continued)

(56) References Cited

U.S. PATENT DOCUMENTS 6,355,950 B1 3/2002 Livengood et al.
9,054,308 B1 6/2015 Zhang et al.
(Continued)

FOREIGN PATENT DOCUMENTS

CN 1770442 A 5/2006
CN 101933136 A 12/2010
(Continued)

OTHER PUBLICATIONS

German Office Action dated Jul. 17, 2023 in German Application No. 11 2019 007 288.9, 9 pages.
(Continued)

*Primary Examiner* — Jonathan Han
(74) *Attorney, Agent, or Firm* — Knobbe, Martens, Olson & Bear, LLP

(57) ABSTRACT

An interconnection structure for semiconductor devices formed on a substrate may be arranged under the semiconductor devices. The interconnection structure includes at least one via layer and at least one interconnection layer alternately arranged in a direction from the semiconductor device to the substrate, wherein each via layer includes via holes respectively arranged under at least a part of the semiconductor devices, and each interconnection layer includes conductive nodes respectively arranged under at least a part of the semiconductor devices, and in a same interconnection layer, a conductive channel is provided between at least one conductive node and at least another node; and the via holes in each via layer and the conductive nodes in each interconnection layer corresponding to the via
(Continued)

holes at least partially overlap with each other in the direction from the semiconductor device to the substrate.

28 Claims, 75 Drawing Sheets

(58) Field of Classification Search
CPC ......... H01L 21/823431; H01L 27/0886; H01L 29/78642; H01L 21/823871; H01L 21/823475; H01L 23/5386
See application file for complete search history.

(56) References Cited

U.S. PATENT DOCUMENTS

| | | | |
|---|---|---|---|
| 2006/0049468 | A1 | 3/2006 | Cheng et al. |
| 2006/0113568 | A1* | 6/2006 | Chan ................... H01L 29/7843 257/E21.633 |
| 2007/0020445 | A1 | 1/2007 | Liu et al. |
| 2008/0227289 | A1 | 9/2008 | Nejad et al. |
| 2014/0042612 | A1* | 2/2014 | Liu ..................... H01L 23/5226 257/734 |
| 2014/0071763 | A1 | 3/2014 | Shikata et al. |
| 2016/0155744 | A1 | 6/2016 | Rhie |
| 2017/0256451 | A1 | 9/2017 | Boemmels et al. |
| 2017/0294342 | A1 | 10/2017 | Lu et al. |
| 2018/0374896 | A1 | 12/2018 | Kalnitsky et al. |
| 2020/0219804 | A1* | 7/2020 | Jezewski ............. H01L 23/5226 |

FOREIGN PATENT DOCUMENTS

| | | |
|---|---|---|
| CN | 102468284 A | 5/2012 |
| CN | 103579096 A | 2/2014 |
| CN | 104347591 A | 2/2015 |
| CN | 106571305 A | 4/2017 |
| CN | 107026146 A | 8/2017 |
| CN | 109285836 A | 1/2019 |
| CN | 109300874 A | 2/2019 |
| DE | 10 2016 117 561 A1 | 5/2017 |
| TW | 200822297 A | 5/2008 |
| TW | 201023364 A | 6/2010 |
| TW | 201318076 A | 5/2013 |
| TW | 201816982 A | 5/2018 |
| WO | WO2017112035 A1 | 6/2017 |

OTHER PUBLICATIONS

International Search Report with Translation for International Application No. PCT/CN2019/089286 dated Feb. 1, 2020 in 7 pages.
Office Action for Chinese Application No. 201910369630.9 dated Oct. 23, 2021 in 5 pages.
Office Action for Taiwan Application No. 108129018 dated Dec. 28, 2020 in 10 pages.

* cited by examiner

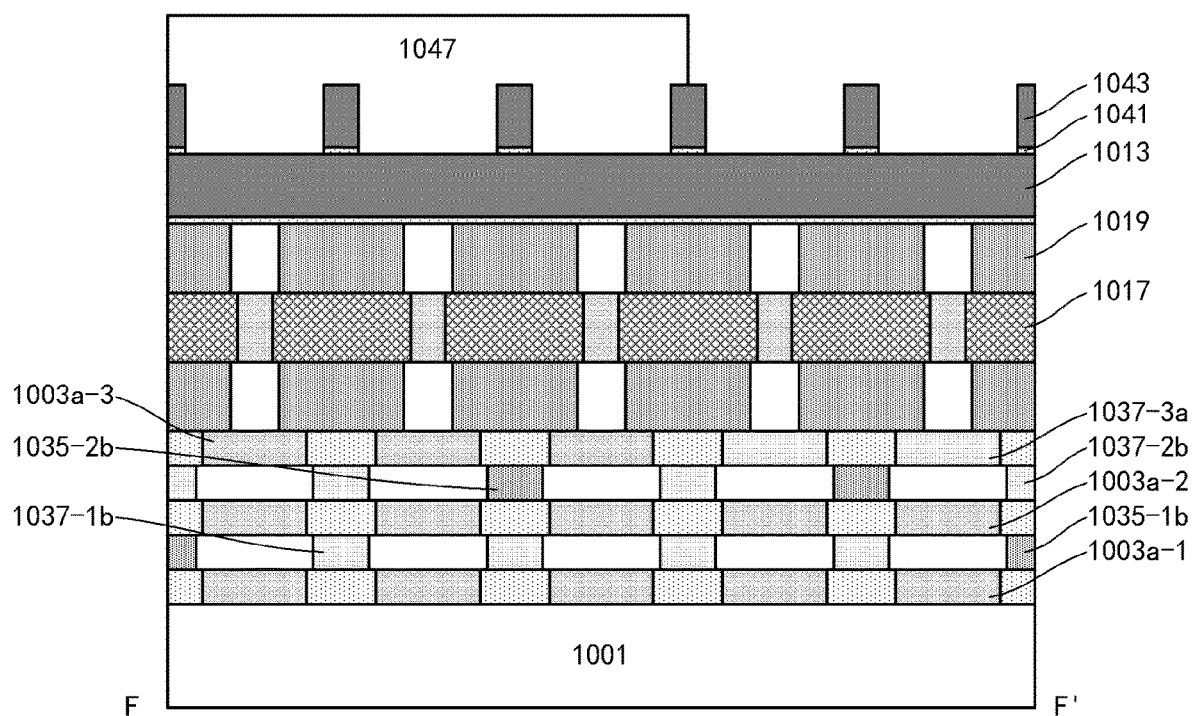
FIG. 25(e)
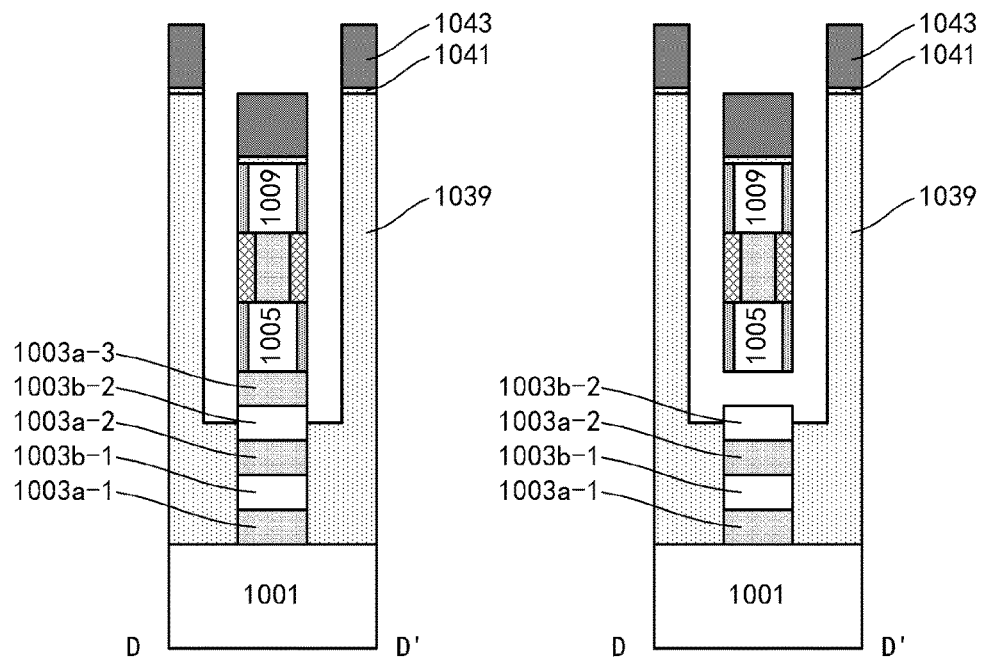
FIG. 25(f-1)      FIG. 25(f-2)

INTERCONNECTION STRUCTURE, CIRCUIT AND ELECTRONIC APPARATUS INCLUDING THE INTERCONNECTION STRUCTURE OR CIRCUIT

CROSS REFERENCE TO RELATED APPLICATION(S)

This application is a Section 371 National Stage Application of International Application No. PCT/CN2019/089286 filed on May 30, 2019, which claims the priority of the Chinese patent application 201910369630.9 entitled "INTERCONNECTION STRUCTURE, CIRCUIT AND ELECTRONIC APPARATUS INCLUDING THE INTERCONNECTION STRUCTURE OR CIRCUIT" filed on May 5, 2019, the contents of which are hereby incorporated herein by reference.

TECHNICAL FIELD

The disclosed technology relates to the field of semiconductor, and in particular to an interconnection structure between device layers, a circuit including an interconnection between device layers, and an electronic apparatus including such the interconnection structure or the circuit.

BACKGROUND

An interconnection between device layers may reduce a parasitic resistance and capacitance, which may reduce a resistance and capacitance (RC) delay and a power consumption of an integrated circuit (IC). In addition, it is also possible to increase an integration density of the IC and thus reduce a cost for manufacturing the IC. However, it is difficult to interconnect between device layers, because an interconnection process is not compatible with a device integration process.

SUMMARY

In view of this, an example purpose of the disclosed technology is at least partly to provide an interconnection structure among device layers, a circuit including interconnections among device layers, and an electronic apparatus including such the interconnection structure or the circuit.

According to an aspect of the disclosed technology, an interconnection structure for a plurality of semiconductor devices formed on a substrate may be arranged under the plurality of semiconductor devices is provided. The interconnection structure also includes at least one via layer and at least one interconnection layer alternately arranged in a direction from the semiconductor device to the substrate, wherein each via layer includes via holes respectively arranged under at least a part of the plurality of semiconductor devices, and each interconnection layer includes conductive nodes respectively arranged under at least a part of the plurality of semiconductor devices, and in a same interconnection layer, a conductive channel is provided between at least one conductive node and at least another node; and the via holes in each via layer and the conductive nodes in each interconnection layer corresponding to the via holes at least partially overlap with each other in the direction from the semiconductor device to the substrate.

According to another aspect of the disclosed technology, a circuit is provided, including: a substrate; an interconnection structure arranged on the substrate, wherein the interconnection structure includes at least one via layer and at least one interconnection layer alternately arranged in a direction substantially perpendicular to a surface of the substrate, and an uppermost layer of the interconnection structure is a via layer; and a plurality of semiconductor devices arranged on the interconnection structure; wherein each via layer includes via holes arranged at positions of at least a part of points in a two-dimensional lattice arranged in rows and columns; each interconnection layer includes main body portions arranged at positions of at least a part of points in a two-dimensional lattice, and extension portions extending from the main body portions in a row direction or a column direction, and the extension portions facing each other of at least a part of adjacent main body portions are in contact, and source/drain regions of at least a part of the plurality of semiconductor devices are in contact with corresponding via holes in the uppermost via layer.

According to another aspect of the disclosed technology, a method for manufacturing an interconnection structure for a semiconductor element is provided, including: providing a first stack of at least one first sacrificial layer and at least one second sacrificial layer alternately stacked on a substrate, wherein an uppermost layer of the first stack is the first sacrificial layer; providing a device active material layer on the first stack; providing a first hard mask layer on the device active material layer, wherein the first hard mask layer has a grid pattern defined by lines extending in a first direction and lines extending in a second direction that cross each other, and the grid pattern includes nodes defined by intersections between the lines and bridging portions between the nodes; defining an active region of a semiconductor device in the device active material layer by using the first hard mask layer; patterning the first stack by using the first hard mask layer, so that each layer in the first stack has a grid pattern corresponding to the first hard mask layer, and therefore includes nodes and bridging portions between the nodes; and defining an interconnection structure in the first stack, wherein the defining an interconnection structure in the first stack includes: at least partially removing each bridging portion of each first sacrificial layer, so that the nodes of each first sacrificial layer are separated from each other; and removing one or more nodes of the first sacrificial layer according to a layout of the interconnection structure; and cutting off one or more bridging portions in each second sacrificial layer according to a layout of the interconnection structure, and forming a conductive material at an area of the remaining portions of each first sacrificial layer and each second sacrificial layer.

According to another aspect of the disclosed technology, an electronic apparatus is provided, including the interconnection structure or the circuit described above.

BRIEF DESCRIPTION OF THE DRAWINGS

Through the following description of the embodiments of the disclosed technology with reference to the accompanying drawings, the above and other objectives, features, and advantages of the disclosed technology may be more apparent. In the accompanying drawings:

FIGS. 1 to 52(d) show schematic diagrams of some stages in a process for manufacturing a vertical semiconductor device according to the embodiments of the disclosed technology, in which FIGS. 1, 2(b), 3, 4(b), 5(b), 6(b), 7(b), 8(b), 10(b), 11(b), 12(c), 13(b), 14(c), 15(c), 16(b), 17(b), 18(b), 19(b), 20(b), 21(b), 22(b), 23(c), 24(b), 25(c) are cross-sectional views along line BB', FIGS. 4(a), 5(a), 6(a), 7(a), 9(b), 10(*a*), 11(*a*), 12(*b*), 13(*a*), 14(*b*), 15(*b*), 16(*a*), 17(*a*), 18(*a*), 19(*a*), 20(*a*), 21(*a*), 22(*a*), 23(*b*), 24(*a*), 25(*b*), 30, 31(*a*), 32(*b*), 33(*a*), 34(*a*), 35(*b*), 36, 37, 38(*a*), 39(*a*), 40(*a*), 41, 42(*a*), 43(*b*), 44, 47(*a*), 49(*b*), 50(*a*), 51(*a*), 52(*b*) are cross-sectional views along line AA', FIGS. 23(*d*), 24(*c*), and 25(*d*) are cross-sectional views along line CC', FIGS. 25(*e*), 26, 47(*b*), 49(*c*), 50(*b*), 51(*b*), 52(*c*) are cross-sectional views along line FF', FIGS. 25(*f*-1), 25(*f*-2), 25(*f*-3), 25(*f*-4), 27(*b*), 28(*a*), 29(*a*), 31(*b*-1), 31(*b*-2), 33(*b*-1), 33(*b*-2), 34(*b*), 38(*b*), 39(*b*), 40(*b*) are cross-sectional views along line DD', FIGS. 27(*c*), 28(*b*), 29(*b*), 49(*d*), 50(*c*), 51(*c*) are cross-sectional views along line EE', FIGS. 42(*b*), 45, 46, 47(*c*), 48 are cross-sectional views along line GG', FIGS. 50(*d*), 51(*d*), 52(*d*) are cross-sectional views along line 1-1';

FIG. 67 is a cross-sectional view along line BB', and FIGS. 68(*b*), 69(*b*) and 70(*b*) are cross-sectional views along line GG'.

Throughout the drawings, the same or like reference numerals indicate the same or like components.

DETAILED DESCRIPTION OF EMBODIMENTS

Figure 1:
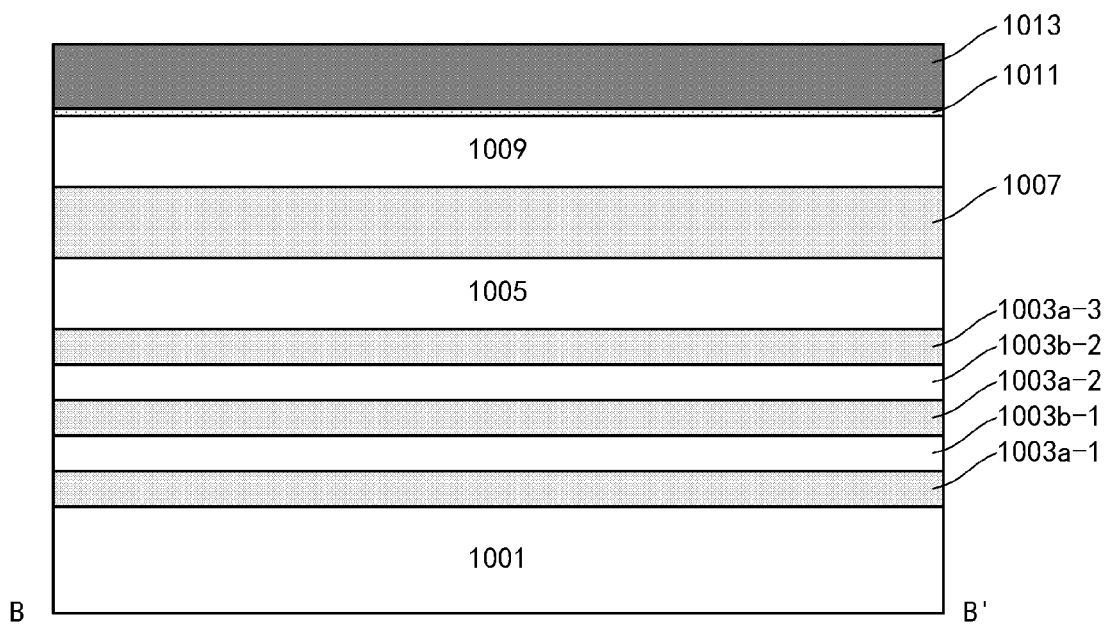

Hereinafter, embodiments of the disclosed technology will be described with reference to the accompanying drawings. However, it should be understood that these descriptions are only exemplary, and are not intended to limit the scope of the disclosed technology. In addition, in the following description, descriptions of well-known structures and technologies are omitted to avoid unnecessarily obscuring the concept of the disclosed technology.

Various schematic structural diagrams according to the embodiments of the disclosed technology are shown in the accompanying drawings. These drawings are not drawn to scale, some details are enlarged and some details may be omitted for clarity of presentation. The shapes of various regions and layers, as well as the relative size and positional relationships between them shown in the drawings are only exemplary. In practice, there may be deviations due to manufacturing tolerances or technical limitations. Regions/layers with different shapes, sizes, and relative positions may be additionally designed as needed by those skilled in the art.

In the context of the disclosed technology, when a layer/element is referred to as being "on" another layer/element, the layer/element may be directly on the another layer/element, or there may be an intermediate layer/element between them. In addition, if a layer/element is located "on" another layer/element in one orientation, the layer/element may be located "under" the another layer/element when the orientation is reversed.

According to the embodiments of the disclosed technology, an interconnection structure is provided. Different from forming an interconnection structure such as a metallization layer above a semiconductor device after the semiconductor device is formed on a substrate in the related art, an interconnection structure according to the embodiments of the disclosed technology may be arranged under the device, for example, between the device and the substrate. The interconnection structure may include at least one via layer and at least one interconnection layer that are alternately stacked. Each via layer is provided with a via hole, so as to realize an electrical connection between a layer below the via layer and a layer above the via layer (both the layer below the via layer and the layer above the via layer are interconnection layers). Conductive channels are provided in each interconnection layer to realize a routing within the interconnection layer. Generally speaking, a side of the interconnection structure closest to the device is the via layer, so as to draw the electrical connection from the corresponding device.

In each via layer, the via hole may be respectively located below the corresponding semiconductor device (especially an active region of the semiconductor device, such as a source/drain region). For example, this is because the via hole and the semiconductor device may be defined with a substantially same pattern as described below. Thus, the via hole and the corresponding semiconductor device (especially the active region of the semiconductor device, such as the source/drain region) may at least partially overlap in an etching direction, and may even be substantially aligned with each other, such as center-aligned. Of course, in each via layer, it is not necessary that the via holes are formed under all the semiconductor devices (more specifically, the source/drain regions), but the via holes are formed only under a part of the source/drain regions (which may be referred to as a "first group of source/drain regions"), and insulation portions may be formed under another part of the source/drain regions (which may be referred to as a "second group of source/drain regions"). A layout of the via holes and the insulation portions in the via layers may be determined according to a connection layout required by the circuit design.

Similarly, in each interconnection layer, there may be a conductive node under the corresponding semiconductor device (especially the active region of the semiconductor device, such as the source/drain region). Similarly, for example, this is because the conductive node and the semiconductor device may be defined by a substantially same pattern as described below. Thus, the conductive node and the corresponding semiconductor device (especially the active region of the semiconductor device, such as the source/drain region) may at least partially overlap in the etching direction, or even be substantially aligned with each other, such as center-aligned. Similarly, in each interconnection layer, it is not necessary that the conductive nodes are formed under all the semiconductor devices (more specifically, the source/drain regions), but the conductive nodes are formed under only a part of the source/drain regions.

In each interconnection layer, the conductive channels extend between corresponding conductive nodes. According to the embodiments of the disclosed technology, the conductive channels may extend hop-by-hop between adjacent conductive nodes, and there is no conductive channel directly connecting non-adjacent conductive nodes (the so-called "directly connecting" refers to connecting without passing through other conductive nodes).

For each via hole, a layer above the via hole and a layer below the via hole may have corresponding conductive nodes that contact with the via hole, so as to realize an electrical connection between the layer above the via hole and the layer below the via hole. For each conductive node, there may be no corresponding via holes in a layer above the conductive node and a layer below the conductive node, so that the conductive node may be used as an intermediate node in a conductive channel; alternatively, the layer above the conductive node and/or the layer below the conductive node may have corresponding via holes that contact with the conductive node to realize the electrical connection between the layer above the conductive node and the layer below the conductive node.

Thus, each layer in the interconnection structure may exhibit a layout similar to that of a semiconductor device. Here, the layout is called "array", such as a two-dimensional array arranged in rows and columns (of course, there may be other forms of arrays), and elements in the layout (for example, the semiconductor device in the device layer, the via hole in the via layer, or the conductive node in the interconnection layer) are called "nodes". An array of each via layer and an array of the device layer may be substantially the same, but some nodes may be lost (as described below, these nodes may be provided with insulation portions). An array of each interconnection layer and the array of the device layer may be substantially the same, but some nodes may be lost.

In some embodiments, in each interconnection layer, the conductive nodes may be formed at all the nodes. For an unneeded conductive node, the insulating portions may be provided at corresponding positions in a via layer above the unneeded conductive node and in a via layer below the unneeded conductive node, and the conductive channels between the unneeded conductive node and adjacent conductive nodes may be cut off to make the unneeded conductive node an isolated dummy node. This may make a treatment of the conductive nodes in the interconnection layers consistent, thereby making the process easier to perform.

Therefore, the interconnection structure may be a three-dimensional (3D) grid structure as a whole. The conductive channels in each interconnection layer may extend along sides of the grid (for example, in a row or column direction) in the array.

This interconnection structure is particularly suitable for a vertical semiconductor device. The vertical semiconductor device may include an active region extending in a vertical direction (for example, a direction substantially perpendicular to a surface of the substrate). Each node in the interconnection structure may be located below the active region of each vertical semiconductor device in the vertical direction, and may be aligned in the vertical direction, such as center-aligned.

The vertical active region may include: source/drain regions located at an upper end and a lower end, respectively; and a channel region between the source/drain regions. A conductive channel may be formed between the source/drain regions through the channel region. Such the active region may be provided by, for example, a first source/drain layer, a channel layer, and a second source/drain layer that are sequentially stacked. The source/drain regions may be substantially formed in the first source/drain layer and the second source/drain layer, and the channel region may be substantially formed in the channel layer. The active region, especially the channel layer, may exhibit a shape of a nanowire, thereby obtaining a nanowire device.

Alternatively, the active region, especially the channel layer, may exhibit a shape of a nano sheet, thereby obtaining a nano sheet device.

The channel layer may be made of a single crystal semiconductor material to improve device performance. Of course, the first and second source/drain layers may also be made of a single crystal semiconductor material. In this case, the single crystal semiconductor material of the channel layer and the single crystal semiconductor material of the source/drain layers may be eutectic.

According to the embodiments of the disclosed technology, such the semiconductor device may be a conventional field effect transistor (FET). In the case of FET, the source/drain regions on both sides of the channel region may have doping of a same conductivity type (for example, n-type or p-type). A conductive channel may be formed between the source/drain regions respectively at both ends of the channel region through the channel region. Alternatively, such the semiconductor device may be a tunneling FET. In the case of tunneling FET, the source/drain regions on both sides of the channel region may have doping of different conductivity types (for example, n-type and p-type, respectively). In this case, charged particles such as electrons may tunnel from the source region through the channel region and enter the drain region, thereby forming a conduction path between the source region and the drain region. Although a conduction mechanism in conventional FETs and a conduction mechanism in tunneling FETs are not the same, however, they both exhibit electrical properties that may control the conduction between the source/drain regions through a gate. Therefore, for conventional FETs and tunneling FETs, the terms "source/drain layers (source/drain regions)" and "channel layer (channel region)" are unified to describe, although there is no "channel" in a usual sense in tunneling FETs.

A gate electrode may be formed around at least part of a periphery of the channel region. The gate electrode may be self-aligned to the channel layer. For example, a sidewall of the gate electrode close to the channel layer may be aligned with a peripheral sidewall of the channel layer so as to occupy a substantially same range in the vertical direction. In this way, an overlap of the gate electrode and the source/drain regions may be reduced or even avoided, which helps to reduce a parasitic capacitance between the gate and the source/drain electrodes.

In order to facilitate a connection between the gate electrodes in different devices and applying electrical signals to the gate electrodes, each gate electrode may include an extension portion extending outward from a main body portion in addition to the main body portion surrounding the channel region. The extension portion may also extend along the side of the grid (for example, in the row or column direction) in the array. Extension portions facing each other of at least some of adjacent gate electrodes may contact with each other, thereby being electrically connected to each other.

According to the embodiments of the disclosed technology, a contact plug for introducing an electrical signal into the interconnection structure may also be provided. For example, a contact plug is in contact with a corresponding via hole in a via layer uppermost of the interconnection structure, so as to apply the electrical signal to the interconnection structure. Thus, the contact plug may also be located at a corresponding node in the array. According to the embodiments of the disclosed technology, the contact plug may be formed by converting the active region at the corresponding node into a conductive material (for example, a silicide obtained by a silicification process), and then the contact plug may be self-aligned to the corresponding node (in other words, the via hole at the corresponding node). That is, in the array of the device layer, some nodes may be real active regions of the device, and other nodes may be contact plugs.

According to the embodiments of the disclosed technology, a contact plug for applying an electric signal to the gate electrode may also be provided. For a purpose of process consistency, this contact plug may also be formed by converting the active region at the corresponding node into a conductive material as described above (to form the "main body portion"). In addition, in addition to the main body portion at the node, the contact plug may further include an extension portion extending from the main body portion so as to be in contact with the gate electrode. The extension portion may also extend along the side of the grid (for example, in the row or column direction) in the array.

According to the embodiments of the disclosed technology, the semiconductor device may also be in other forms, such as a fin field effect transistor (FinFET) or a planar semiconductor device, and their fins or active regions may extend along a lateral direction (for example, a direction substantially parallel to the surface of the substrate). For example, the fins or active regions may extend along the side of the grid (for example, in the row or column direction) in the array. The source/drain regions of the device may be located at the node of the array. In this way, through the interconnection structure formed below, the electrical connection to at least part of the source/drain regions in the device array may be achieved.

Such the interconnection structure may be, for example, manufactured as follows.

According to the embodiments of the disclosed technology, a first stack of alternately stacked first sacrificial layers and second sacrificial layers may be provided on a substrate. The first stack is then used to form an interconnection structure. Here, for ease of description, a sacrificial layer defining a position of a via layer is referred to as the first sacrificial layer, and a sacrificial layer defining a position of an interconnection layer is referred to as the second sacrificial layer. Therefore, the uppermost sacrificial layer of the first stack may be one of the first sacrificial layers. The first sacrificial layer and the second sacrificial layer may have etching selectivity with respect to each other.

A semiconductor material that is subsequently used to form an active region of a device may be provided on the first stack. For example, in the case of forming a vertical semiconductor device, a second stack of a first source/drain layer, a channel layer, and a second source/drain layer that are sequentially stacked may be provided. The channel layer may have etching selectivity with respect to the first source/drain layer and the second source/drain layer. In addition, the first source/drain layer and the second source/drain layer may include a same semiconductor material. At least adjacent layers between the first stack and the second stack (i.e., an uppermost layer of the first stack and a lowermost layer of the second stack) have etching selectivity with respect to each other. For example, these layers may be formed by epitaxial growth. Due to the respective epitaxial growth, at least a pair of adjacent layers may have a clear crystal interface. In addition, each layer, especially each layer in the second stack, may be respectively doped, so that at least a pair of adjacent layers may have a doping concentration interface.

To facilitate patterning, a hard mask layer may be provided on the semiconductor material of the active region, such as on top of the second stack. The hard mask layer may exhibit a grid pattern. For example, the hard mask layer may include lines arranged in rows and columns. Here, intersections of the rows and columns in the hard mask layer are referred to as "nodes", and lines between the nodes are referred to as "bridging portions". If a grid pattern is formed in other layers, it may also be called as such. In the case of the vertical semiconductor device, the nodes of the grid pattern of the hard mask layer may define a main body position of the vertical active region, and a line width of each node may be increased to be thicker than that of each bridging portion. In the case of a FinFET or a planar semiconductor device, an approximate middle portion of the bridging portion in the grid pattern of the hard mask layer may define the channel region, and portions on both sides of the channel region (the node and the bridging portions surrounding the node) may define the source/drain regions.

The hard mask layer may be used to define the active region in the semiconductor material of the active region, such as in the second stack. For example, the pattern of the hard mask layer may be transferred to the second stack. In the case of the vertical semiconductor device, the active region may be located at corresponding positions of each node. At this time, a part corresponding to the bridging portions in the second stack may be removed (it may be replaced with a supporting material to provide structural support), and a part corresponding to the nodes in the second stack may be retained to form a plurality of separated active regions. Some active regions may be used to form the devices, and other active regions may be subsequently converted into conductive contact plugs, for example, by a silicide process.

Next, the mask layer may be used to define a frame of the interconnection structure in the first stack. This may be achieved by transferring the pattern of the hard mask layer to the first stack, and trimming the pattern in each layer according to a connection design of the interconnection structure.

In the via layer, a via hole that penetrates the via layer needs to be provided to achieve a connection between an interconnection layer above the via layer and an interconnection layer below the via layer. Such via hole may extend in the vertical direction without a need for a laterally extending configuration in the via layer. Therefore, the nodes of the hard mask layer may be used to define the pattern of the via hole in the first sacrificial layer. Specifically, the layout of the nodes may be transferred to the first sacrificial layer. For example, after the pattern of the hard mask layer is transferred to the first sacrificial layer, the bridging portions in the first sacrificial layer may be removed, and the nodes in the first sacrificial layer are retained. The nodes in the corresponding first sacrificial layer may be removed or retained according to a via hole layout in each via layer, so as to achieve the required via hole layout.

Conductive channels extending laterally in the interconnection layer need to be provided in the interconnection layer, so as to achieve a routing. Therefore, the bridging portions in the hard mask layer may be used to define orientations of the conductive channels in the second sacrificial layer. Specifically, the pattern of the hard mask layer may be transferred to the second sacrificial layer, and the nodes in the second sacrificial layer may be used as relay points between the bridging portions of the conductive channels. In addition, the nodes in the second sacrificial layer may also be in contact with the corresponding nodes in the first sacrificial layer, so as to achieve an interconnection between the upper and lower layers. According to the connection design in each interconnection layer, the bridging portions in the corresponding second sacrificial layer may be removed or retained, so as to achieve the required routing.

The trimming of the pattern in the first stack may be performed layer by layer, for example, from top to bottom in sequence. A shielding layer may be used to shield the first stack, and the shielding layer is gradually etched back downwardly to expose each layer in the first stack one by one. When processing a certain layer in the first stack, a layer below the certain layer may be shielded by the shielding layer to avoid being affected.

Generally, designs between each layer in the interconnection structure are not necessarily the same. As the shielding layer is gradually etched back, when a lower layer is processed, an upper layer may be exposed and being affected. In order to avoid affecting the upper layer when the lower layer is processed, a part in the first or second sacrificial layer that needs to be retained may be replaced with a different material. This may be achieved by an etch-fill-etch-fill (EFEF) method, which will be described in detail below.

The disclosed technology may be presented in various forms, some examples of which will be described below. In the following description, a selection of various materials is involved. In addition to considering material functions (for example, semiconductor materials are used to form active regions and dielectric materials are used to form electrical isolations), the selection of materials further considers the etching selectivity. In the following description, the required etching selectivity may be or may not be indicated. It should be clear to those skilled in the art that when it is mentioned below that a certain material layer is etched, if it is not mentioned that other layers are also etched or the drawing does not show that other layers are also etched, this type of etching may be selective, and the certain material layer may have etching selectivity relative to other layers exposed to the same etching recipe.

Figure 52A:
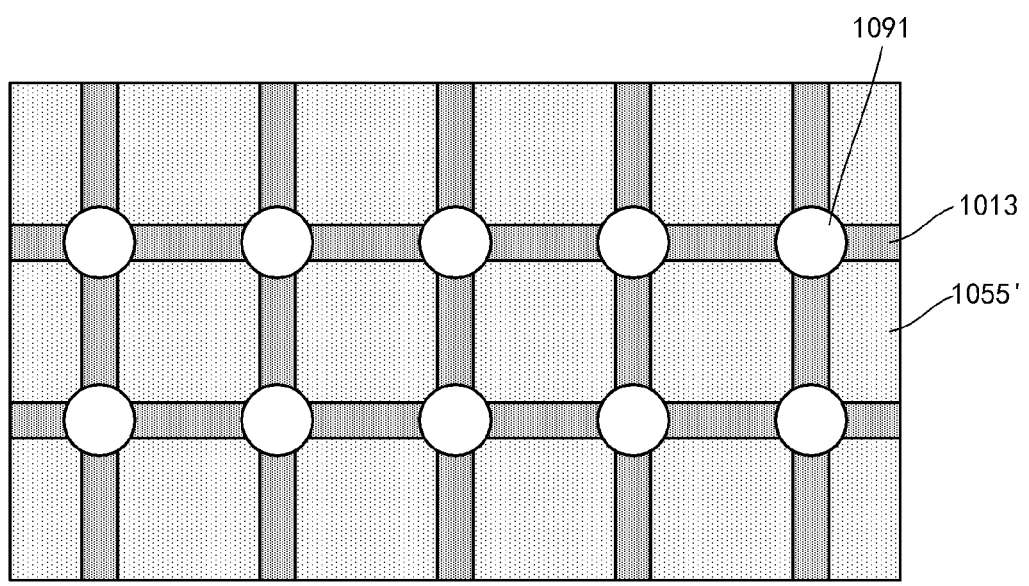
Figure 52B:
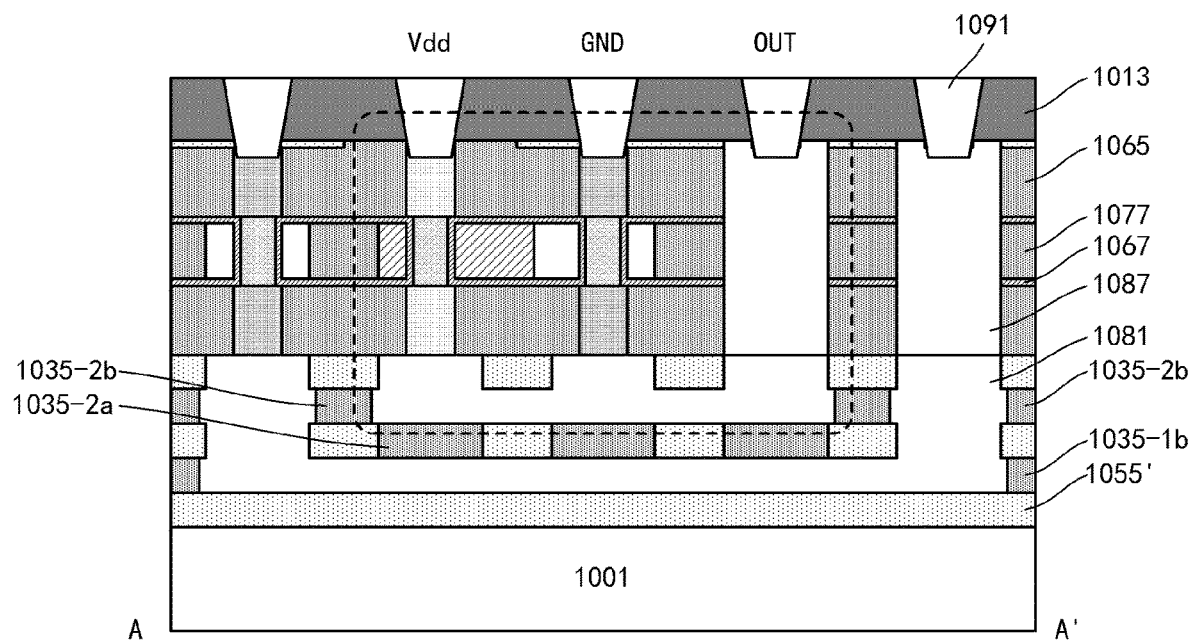
Figure 52C:
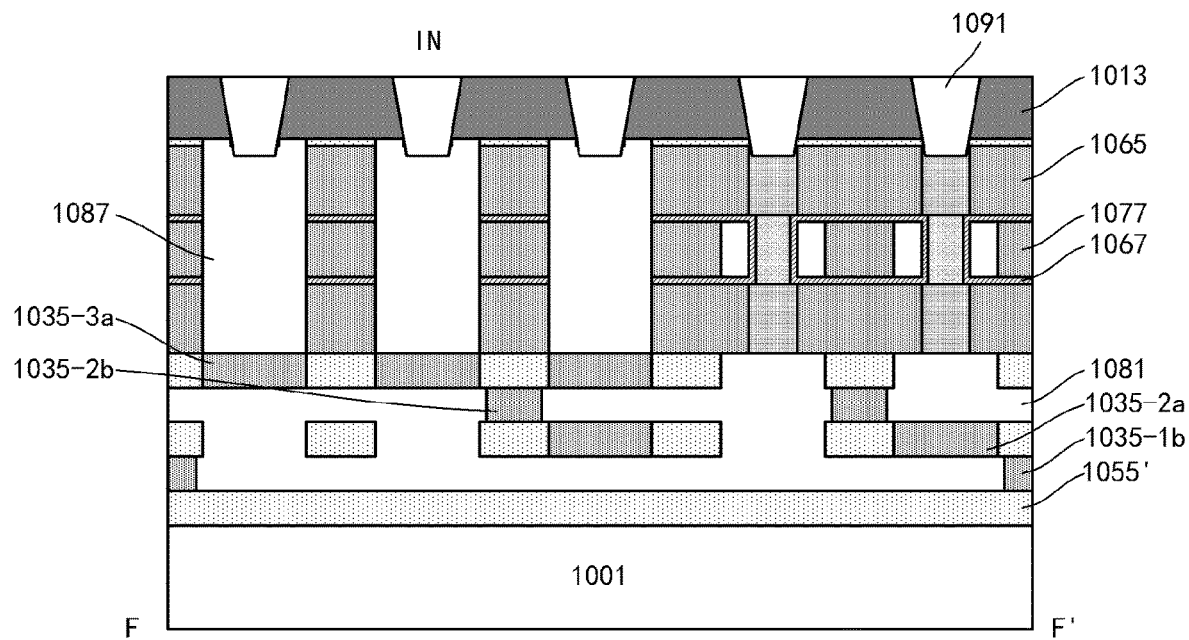
Figure 52D:
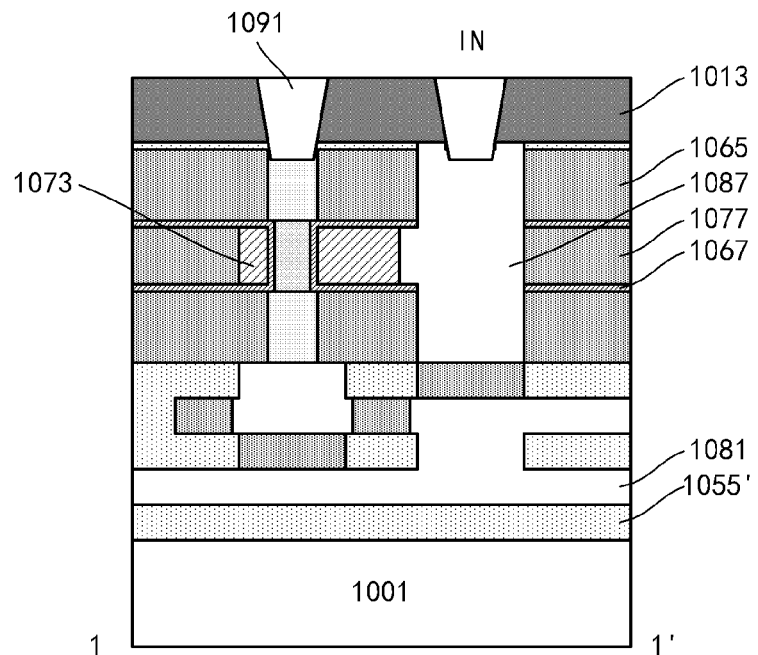

FIG. 1 to FIG. 52(d) show schematic diagrams of some stages in a process for manufacturing a vertical semiconductor device according to the embodiments of the disclosed technology.

As shown in FIG. 1, a substrate 1001 is provided. The substrate 1001 may be a substrate of various forms, including but not limited to, a bulk semiconductor material substrate such as a bulk Si substrate, a semiconductor-on-insulator (SOI) substrate, a compound semiconductor substrate such as a SiGe substrate, and the like. In the following description, for ease of description, a bulk Si substrate is taken as an example for description.

A well region may be formed in the substrate 1001. If a p-type device is to be formed, the well region may be an n-type well; and if an n-type device is to be formed, the well region may be a p-type well. The well region may be formed, for example, by injecting dopants of corresponding conductivity types (p-type dopants such as B or In, or n-type dopants such as As or P) into the substrate 1001 and then thermal annealing. There are many ways to provide such a well region in the art, which will not be repeated here.

A first stack of alternately arranged first sacrificial layers 1003a-1, 1003a-2, 1003a-3 and second sacrificial layers 1003b-1, 1003b-2 may be formed on the substrate 1001 by, for example, epitaxial growth. As described above, the first sacrificial layer and the second sacrificial layer may have etching selectivity with respect to each other. Since a material (generally a semiconductor material) of an active region may be formed on the first stack later, the first stack may be formed of a semiconductor material, to achieve a high-quality growth of the active region. For example, each of the first sacrificial layers 1003a-1, 1003a-2, and 1003a-3 may include SiGe, an atomic percentage of Ge is about 10 to 40%, and a thickness thereof is about 20 to 100 nm; and each of the second sacrificial layers 1003b-1, 1003b-2 may include Si with a thickness of about 20 to 100 nm. Each of the first sacrificial layers and the second sacrificial layers may have substantially the same thickness. A number of layers of the first sacrificial layers and the second sacrificial layers may be determined according to a number of via layers and interconnection layers in an interconnection structure to be formed, and is not limited to a number of the layers shown in the drawing. Here, a lowermost first sacrificial layer 1003a-1 may subsequently be replaced with an isolation layer, so as to achieve an electrical isolation between the interconnection structure and the substrate.

A second stack of a first source/drain layer 1005, a channel layer 1007, and a second source/drain layer 1009 may be formed on the first stack by, for example, epitaxial growth, and all of the first source/drain layer 1005, the channel layer 1007, and the second source/drain layer 1009 may be made of semiconductor materials. As described above, the channel layer and the first source/drain layer may have etching selectivity with respect to each other, and the channel layer and the second source/drain layer may have etching selectivity with respect to each other. In addition, in order to facilitate a respective processing of the first stack and the second stack, at least adjacent layers between the first stack and the second stack may have etching selectivity with respect to each other. For example, the channel layer 1007 may include SiGe, an atomic percentage of Ge may be about 10 to 40%, and a thickness thereof may be about 20 to 100 nm; and the first source/drain layer 1005 and the second source/drain layer 1009 may include Si, with a thickness of about 20 to 100 nm.

According to the embodiments, a contact layer may further be provided. For example, a contact interface layer may be formed between the first stack and the second stack by, for example, epitaxial growth. The contact interface layer may include, for example, silicon, and may be doped into n-type or p-type by, for example, in-situ doping, which is preferably the same as a doping type described below in conjunction with FIG. 25, and a doping concentration thereof is about 1E19 to 5E21 $cm^{-3}$. This may reduce a resistance between the source/drain electrode and the interconnection structure. Here, since the contact interface layer includes the same material (Si) as the first source/drain layer 1005, it may be subsequently processed the same as the first source/drain layer 1005. Alternatively or additionally, before forming the first stack, a contact layer is formed on the substrate by, for example, epitaxial growth. Likewise, the contact layer may include, for example, silicon, and may be doped into n-type or p-type by, for example, in-situ doping, which is preferably the same as the doping type described below in conjunction with FIG. 25, and a doping concentration thereof is about 1E19 to 5E21 $cm^{-3}$.

A hard mask layer may be formed on the second stack. The hard mask layer may include a stacked structure, such as a first sub-layer 1011 and a second sub-layer 1013. The first sub-layer 1011 may be used for protection and/or etching stop and other purposes. For example, the first sub-layer 1011 may include oxide (for example, silicon oxide) with a thickness of about 2 to 5 nm. The first sub-layer 1011 may be formed by deposition or thermal oxidation (a quality of an oxide formed by thermal oxidation is better). The second sub-layer 1013 may be used for masking and/or isolation and other purposes. For example, the second sub-layer 1013 may include nitride (for example, silicon nitride) or a low-k dielectric material (for example, silicon carbide-based materials) with a thickness of about 10 to 100 nm. The second sub-layer 1013 may be formed by deposition. Of course, materials of the hard mask layer are not limited to this, but may include materials that may be retained in various subsequent etching processes. In addition, the hard mask layer may also include more sub-layers to provide better etching selectivity.

Figure 2A:
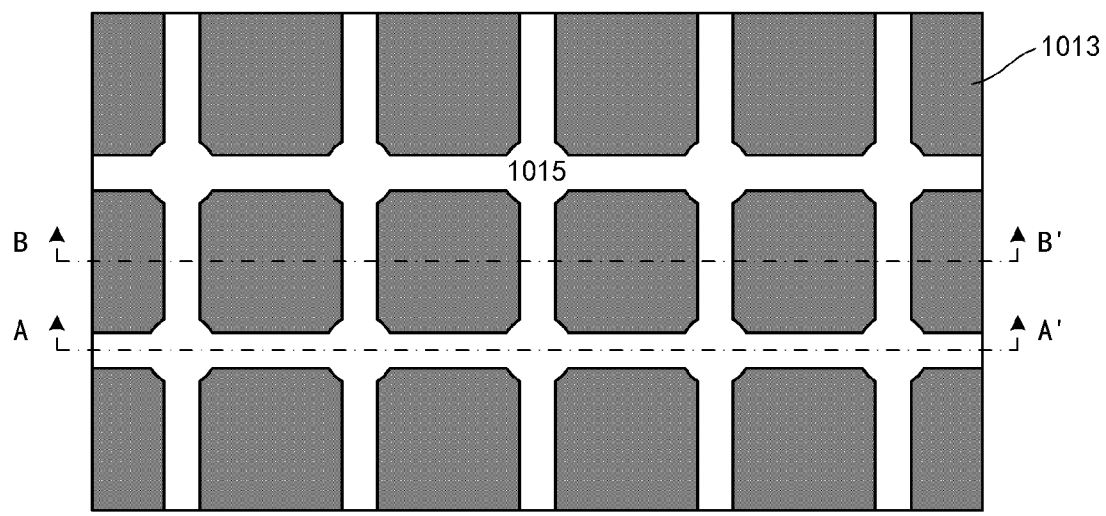
FIGS. 2(a), 8(a), 9(a), 12(a), 14(a), 15(a), 23(a), 25(a), 27(a), 32(a), 35(a), 43(a), 49(a), 52(a) are top views.
Figure 2B:
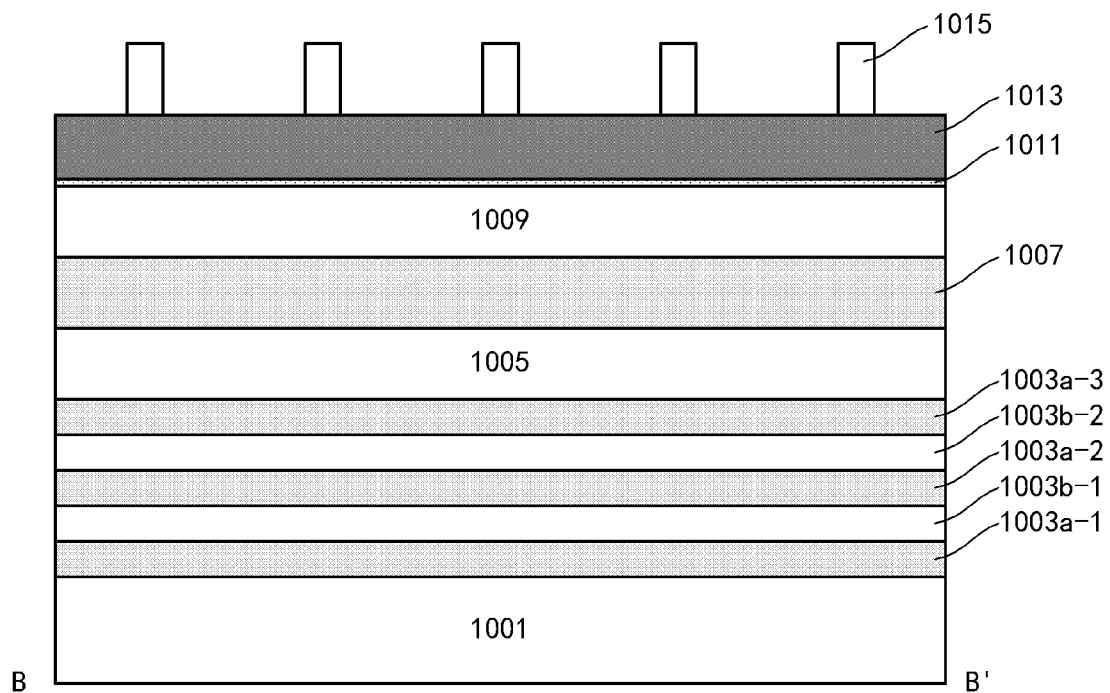

The hard mask layer may be patterned into a desired pattern. As described above, a grid pattern may be formed. To this end, as shown in FIG. 2(*a*) and FIG. 2(*b*), a photoresist 1015 may be formed on the hard mask layer. The photoresist 1015 is patterned into a grid pattern by photolithography (exposure and development). Nodes of the grid may be thickened, so as to define locations of the active regions. Here, the nodes of the grid are substantially circular, so that nanowire devices may be formed subsequently. Of course, the shapes of the grid nodes are not limited to this, but may be any other suitable shape, such as ellipse, rectangular, square, etc., or even a combination of different shapes (some nodes exhibit a shape, while others nodes exhibit another shape). In the case of forming rectangular or square nodes, a cross-spacer pattern transfer (xSIT) technology may be used, and then nanosheet devices may be formed.

Next, the active region may be defined. For example, this may be done as follows.

Figure 3:
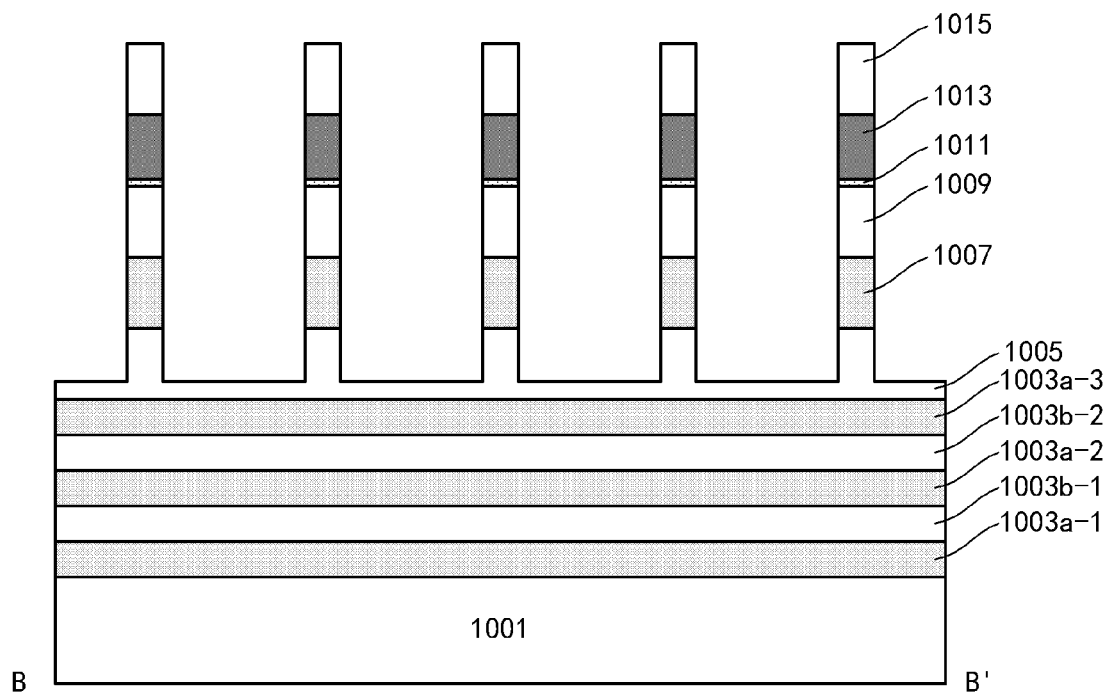

The pattern of the photoresist 1015 may be transferred to the hard mask layer and then to the second stack under the hard mask layer. Specifically, as shown in FIG. 3, the patterned photoresist 1015 may be used as a mask, and the hard mask layer (1013, 1011), the second source/drain layer 1009, the channel layer 1007, and the first source/drain layer 1005 are selectively etched in sequence, such as by using reactive ion etching (RIE). For example, RIE may be performed in a direction substantially perpendicular to a surface of the substrate, so that a pattern formed in the second stack and the pattern of the hard mask layer may be substantially aligned in a vertical direction.

In this example, the etching of the first source/drain layer 1005 does not proceed to a bottom surface of the first source/drain layer 1005. Thus, a thin layer of Si is left on a top surface of the first stack. Because in this example, both the first sacrificial layer 1003*a*-3 and the channel layer 1007 include SiGe, this thin layer of Si may then protect the first sacrificial layer 1003*a*-3 in the first stack when the channel layer 1007 is selectively etched. In the case that the first sacrificial layer 1003*a*-3 has etching selectivity with respect to the channel layer 1007, the etching of the first source/drain layer 1005 may further proceed to the bottom surface of the first source/drain layer 1005.

Currently, the second stack exhibits the same grid pattern as the hard mask layer. It is desirable to separate the second stack into active regions for individual devices at respective nodes. To this end, the first source/drain layer 1005, the channel layer 1007, and the second source/drain layer 1009 may be further selectively etched to remove bridging portions, and the nodes are retained. This is possible, because line widths of the nodes are relatively thick as described above.

Figure 4A:
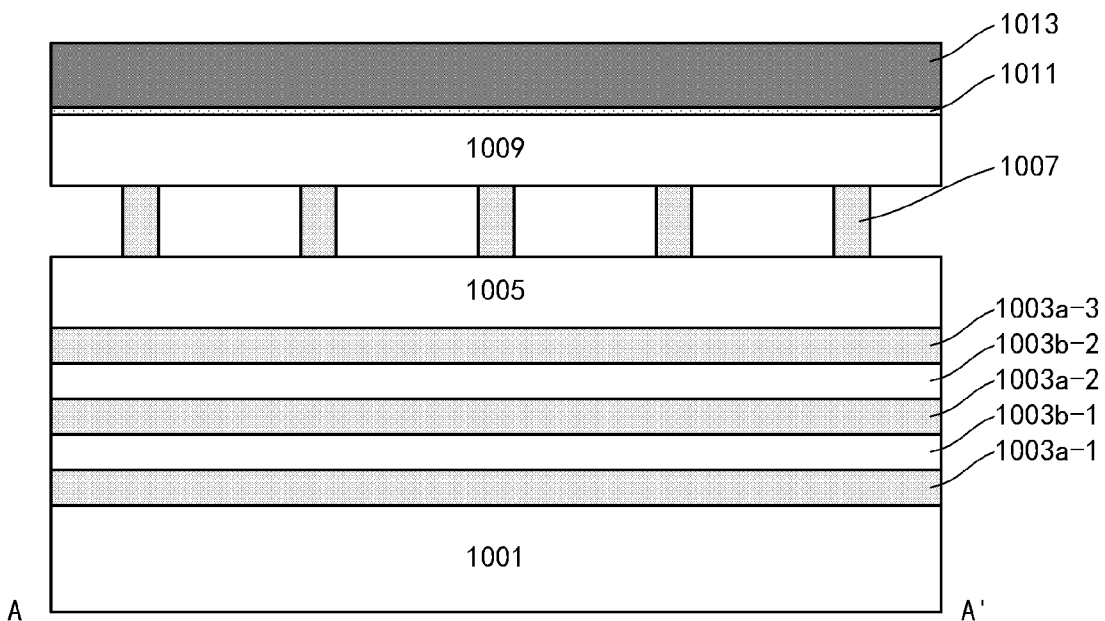
Figure 4B:
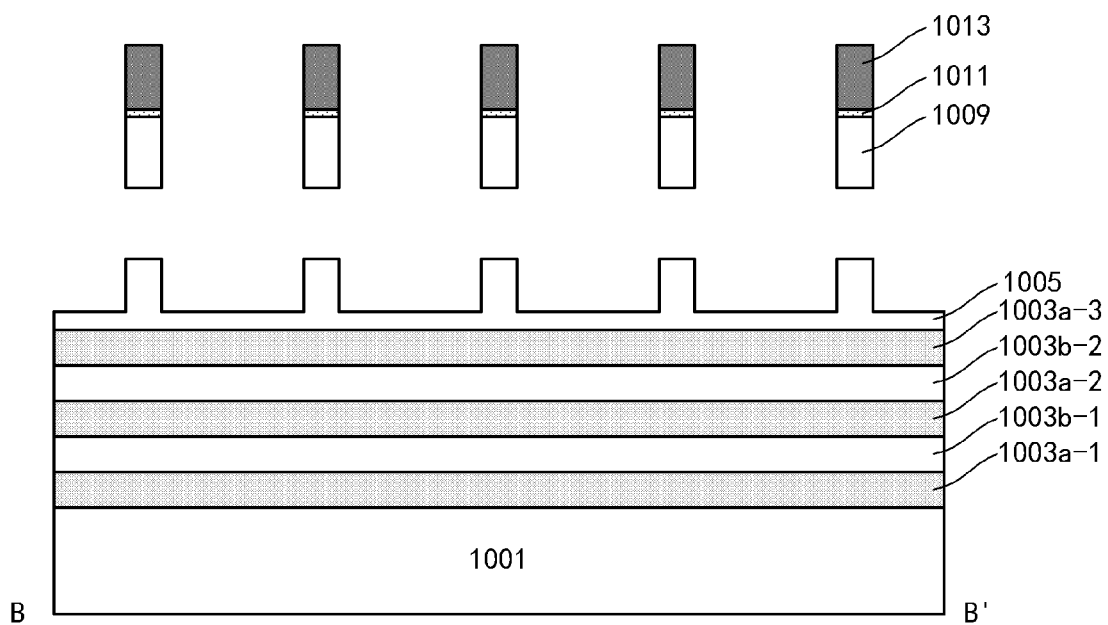

For example, as shown in FIG. 4(*a*) and FIG. 4(*b*), the channel layer 1007 (SiGe) may be further selectively etched relative to the first source/drain layer 1005 and the second source/drain layer 1009 (Si). An amount of the etching is controlled so that the bridging portions in the channel layer 1007 are removed (see FIG. 4(*b*)), while the nodes in the channel layer 1007 are retained (see FIG. 4(*a*)). As shown in FIG. 4(*a*), the channel layer 1007 is separated into a plurality of parts located at the respective nodes, and channels of the device may be formed in the plurality of parts located at the respective nodes. Outer peripheries of these separated parts are recessed inwardly with respect to outer peripheries of the respective nodes in the hard mask layer. In order to facilitate the control of the amount of the etching, atomic layer etching (ALE) may be used. Due to an existence of a continuous bottom of the first source/drain layer 1005, the first sacrificial layer 1003*a*-3 of SiGe which is the same as the channel layer 1007 may not be affected.

Figure 5A:
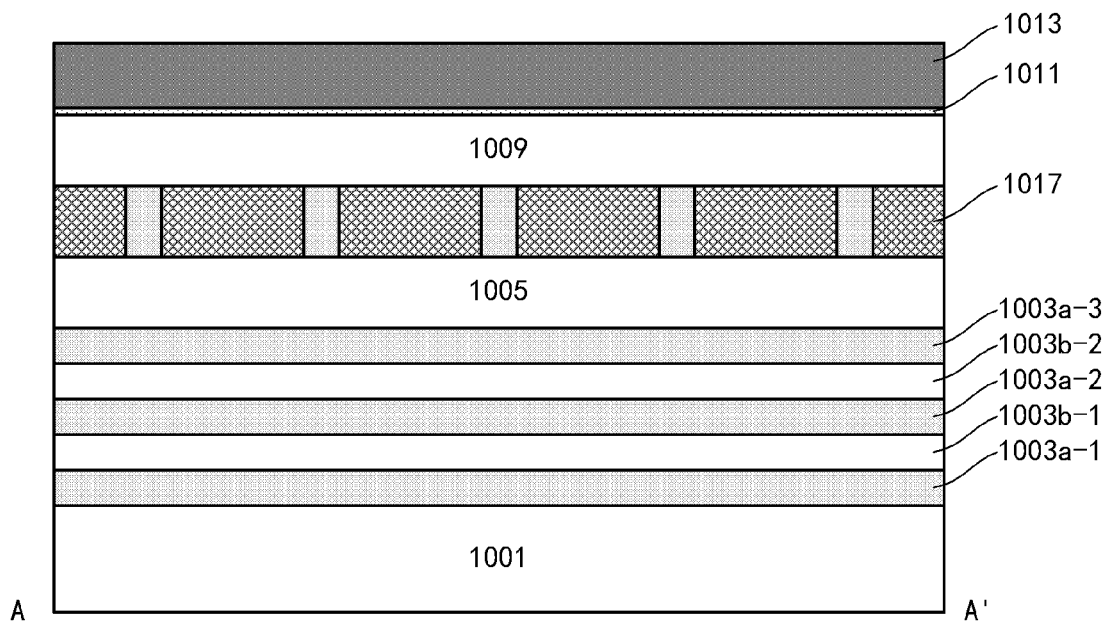
Figure 5B:
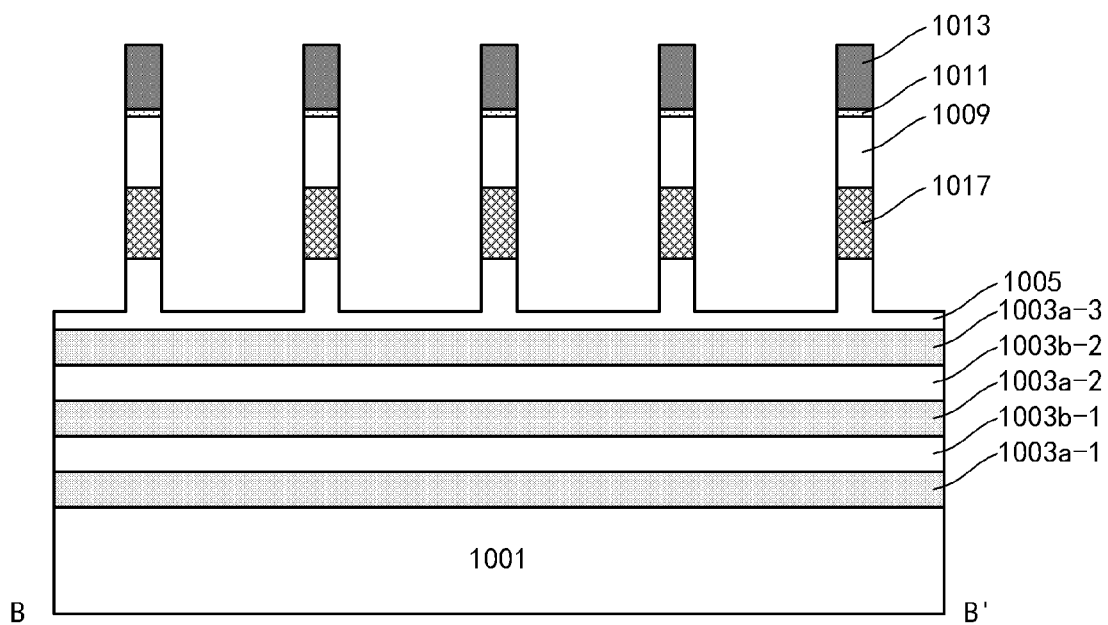

For purposes of structural support and protection of the channel layer, as shown in FIG. 5(*a*) and FIG. 5(*b*), a position holding layer 1017 may be formed in a gap of the second stack under the hard mask layer. For example, a dielectric material may be deposited on the structure shown in FIG. 4(*a*) and FIG. 4(*b*) with an amount sufficient to fill the gap of the second stack, and the hard mask layer is used as a mask to etch back, such as RIE the deposited dielectric material. The RIE may be performed in the direction substantially perpendicular to the surface of the substrate, so that the dielectric material may be left under the hard mask layer to form the position holding layer 1017. Therefore, the position holding layer 1017 is filled in positions where the bridging portions in the channel layer are originally located and in recesses formed by further selectively etching the nodes in the channel layer as described above, and the position holding layer is self-aligned to the channel layer, and surrounds a periphery of the channel layer to protect the channel layer. Here, a material of the position holding layer 1017, such as oxynitride (for example, silicon oxynitride) is selected, so that the position holding layer 1017 has etching selectivity with respect to the hard mask layer.

Figure 6A:
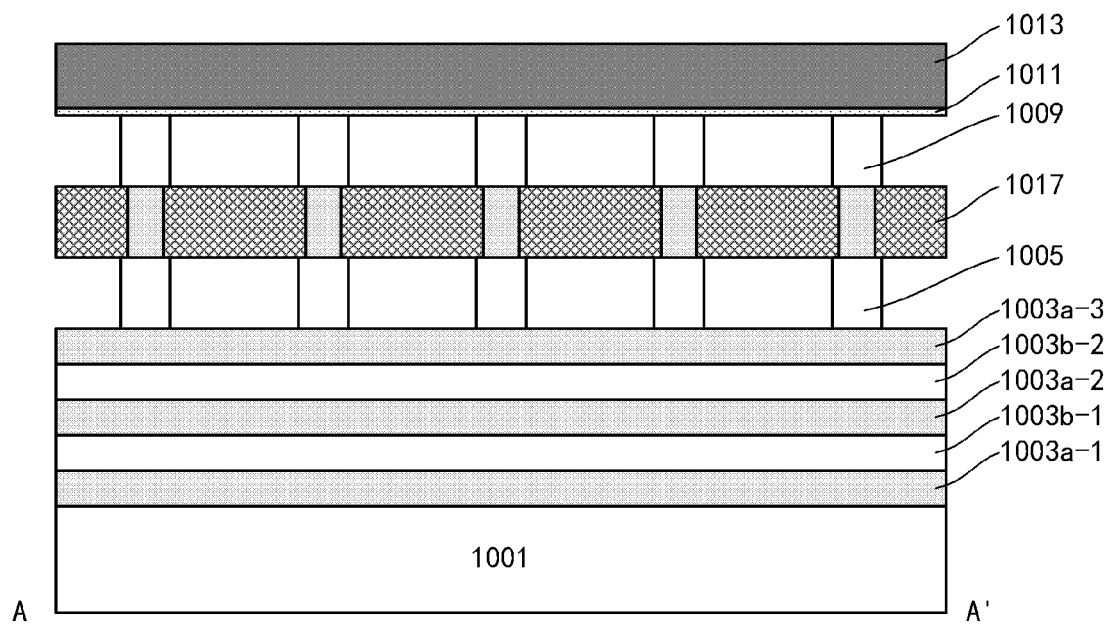
Figure 6B:
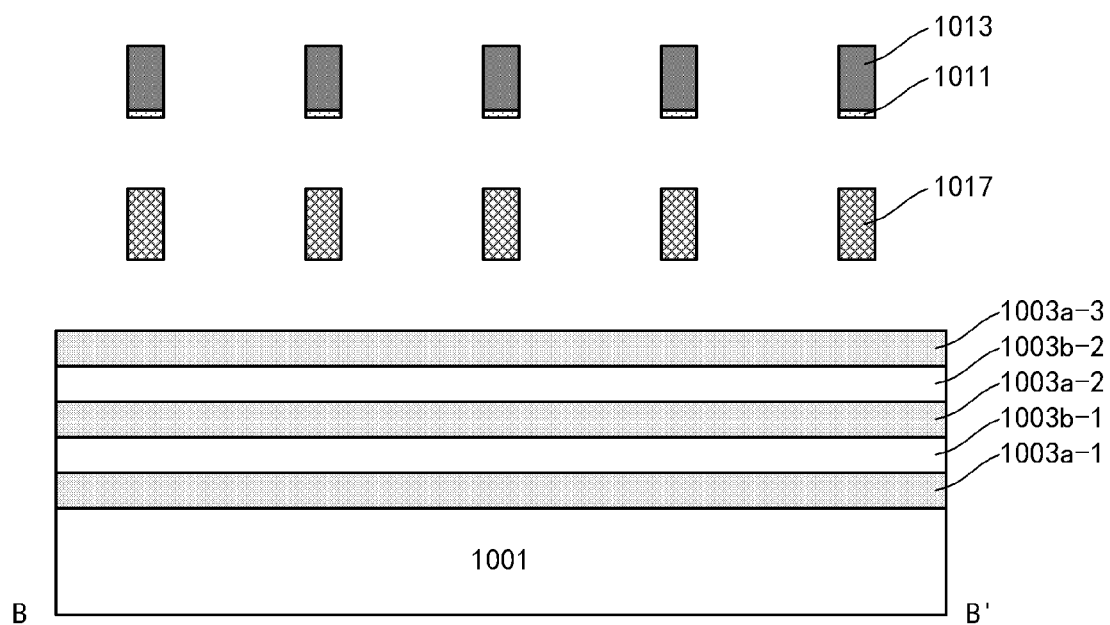

Similarly, as shown in FIG. 6(*a*) and FIG. 6(*b*), with respect to the channel layer 1007 and the first sacrificial layer 1003*a*-3 (SiGe), the first source/drain layer 1005 and the second source/drain layer 1009 (Si) may be further selectively etched. The amount of the etching is controlled so that bridging portions in the first source/drain layer 1005 and the second source/drain layer 1009 are removed (see FIG. 6(*b*)), and nodes in the first source/drain layer 1005 and the second source/drain layer 1009 are retained (see FIG. 6(*a*)). As shown in FIG. 6(*a*), the first source/drain layer 1005 and the second source/drain layer 1009 are both separated into a plurality of parts located at the respective nodes, and source/drain regions of the device may be formed in the plurality of parts. Outer peripheries of these separated parts are recessed inwardly with respect to the outer peripheries of the respective nodes in the hard mask layer. In order to facilitate the control of the amount of the etching, ALE may be used. In addition, a thickness of the continuous thin layer at the bottom of the first source/drain layer 1005 is small, so that the continuous thin layer may be removed during this further etching process, to expose the first sacrificial layer 1003*a*-3 for subsequent processing of the first stack.

Figure 7A:
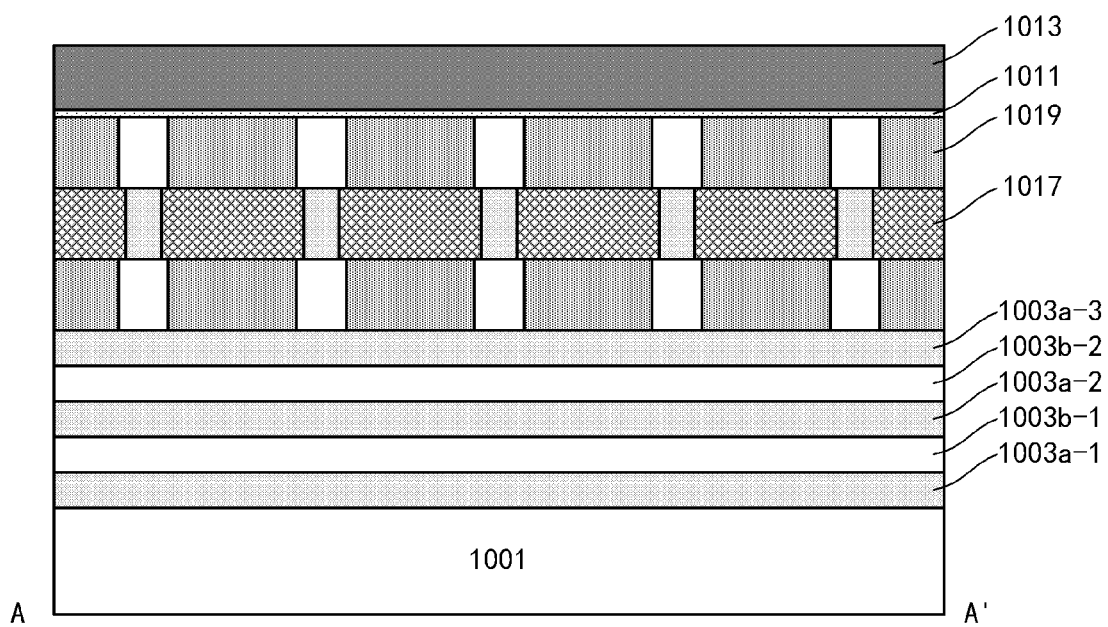
Figure 7B:
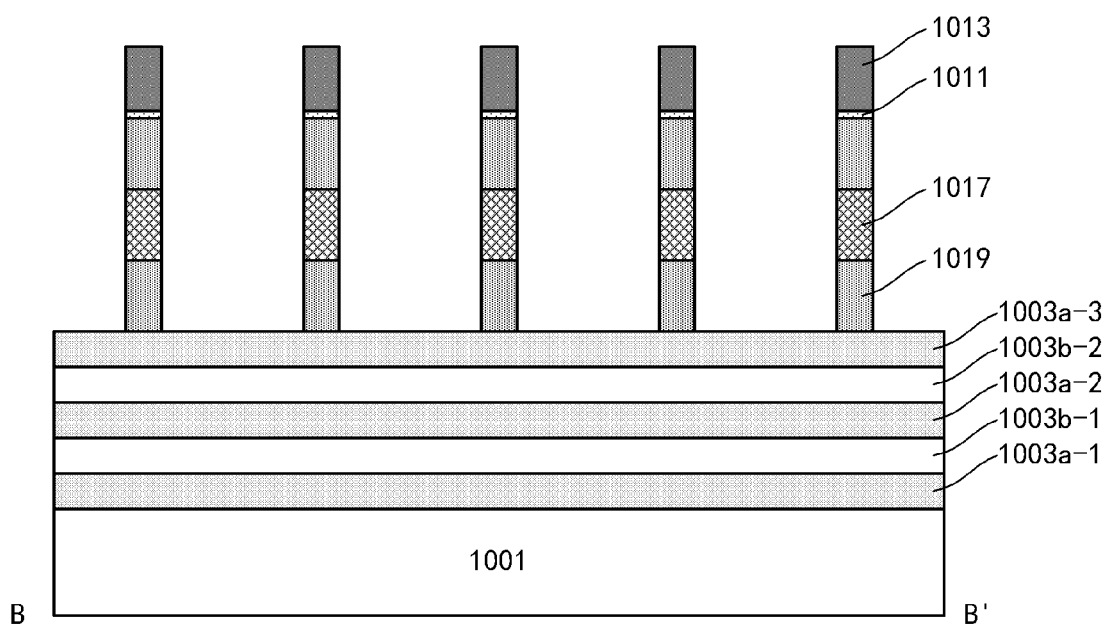

Similarly, for purposes of structural support and protection of the source/drain layer, as shown in FIG. 7(*a*) and FIG. 7(*b*), a position holding layer 1019 may be formed in a gap of the second stack under the hard mask layer. The position holding layer 1019 may be formed in the same way as the position holding layer 1017 is formed. Therefore, the position holding layer 1019 is filled in positions where the bridging portions of the first source/drain layer 1005 and the second source/drain layer 1009 are originally located and in recesses formed by the further selective etching of the node portions, the position holding layer is self-aligned to the first source/drain layer 1005 and the second source/drain layer 1009, and surrounds outer peripheries of the first source/drain layer 1005 and the second source/drain layer 1009 to protect the source/drain layers. Here, a material, such as SiC, of the position holding layer 1019 is selected, so that the position holding layer 1019 has etching selectivity with respect to the hard mask layer and the position holding layer 1017.

The respective separated portions of the etched first source/drain layer 1005, channel layer 1007, and second source/drain layer 1009 form a columnar shape (in this example, a cross-section thereof is a roughly circular columnar shape), which defines the active regions. The columnar active regions may extend substantially perpendicular to the surface of the substrate.

Subsequently, positions of conductive portions of the interconnection structure (the via hole, the conductive node, and the conductive channel described above) may be defined in the first stack.

Figure 8A:
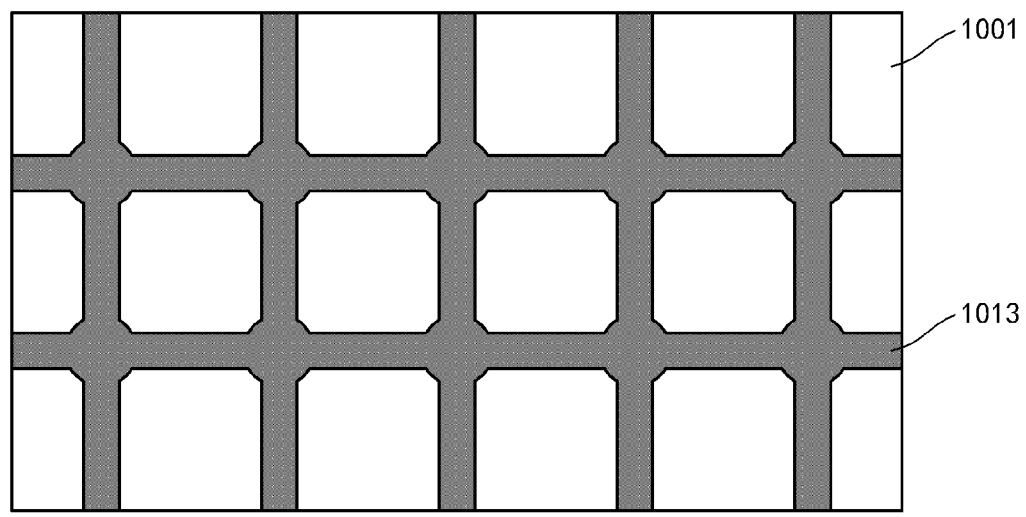
Figure 8B:
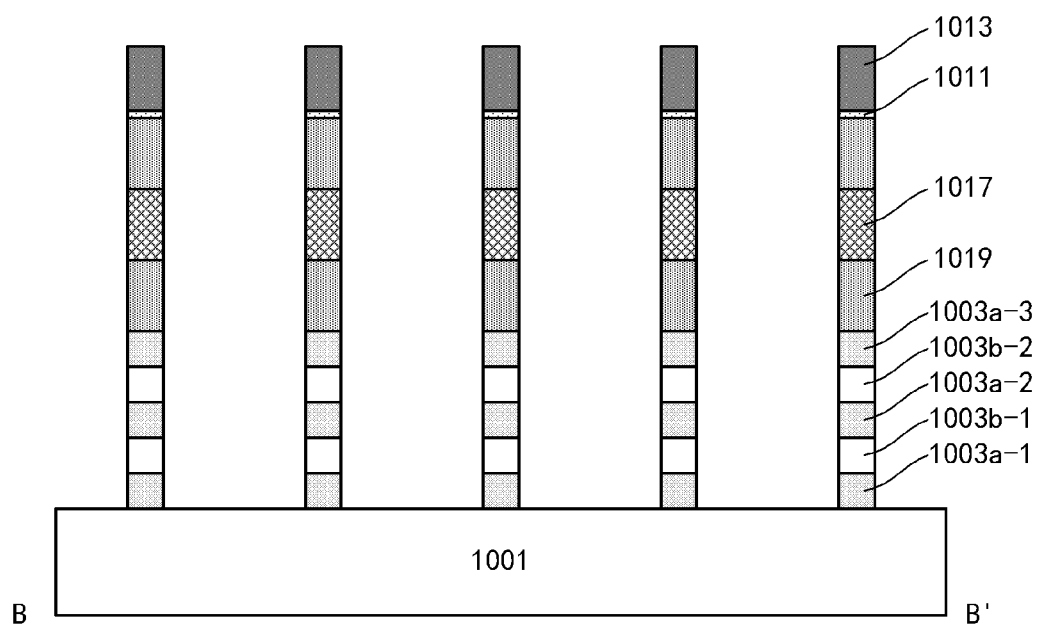

For example, the pattern of the hard mask layer may be transferred to the first stack. Since the second stack (together with the supporting material) above the first stack as described above has been patterned as the hard mask layer, this pattern transferring is possible. Specifically, as shown in FIG. 8(a) and FIG. 8(b), the hard mask layer (1013, 1011) may be used as a mask, and the first sacrificial layer 1003a-3, the second sacrificial layer 1003b-2, the first sacrificial layer 1003a-2, the second sacrificial layer 1003b-1 and the first sacrificial layer 1003a-1 are selectively etched such as by using RIE in sequence. For example, RIE may be performed in the direction substantially perpendicular to the surface of the substrate, so that the pattern formed in the first stack and the pattern of the hard mask layer may be substantially aligned in the vertical direction.

Figure 9A:
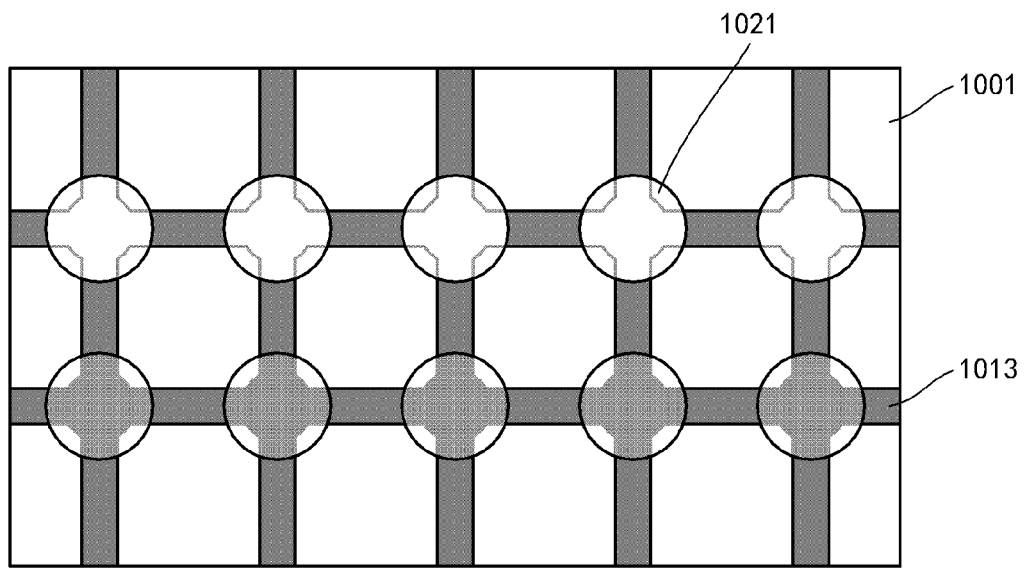
Figure 9B:
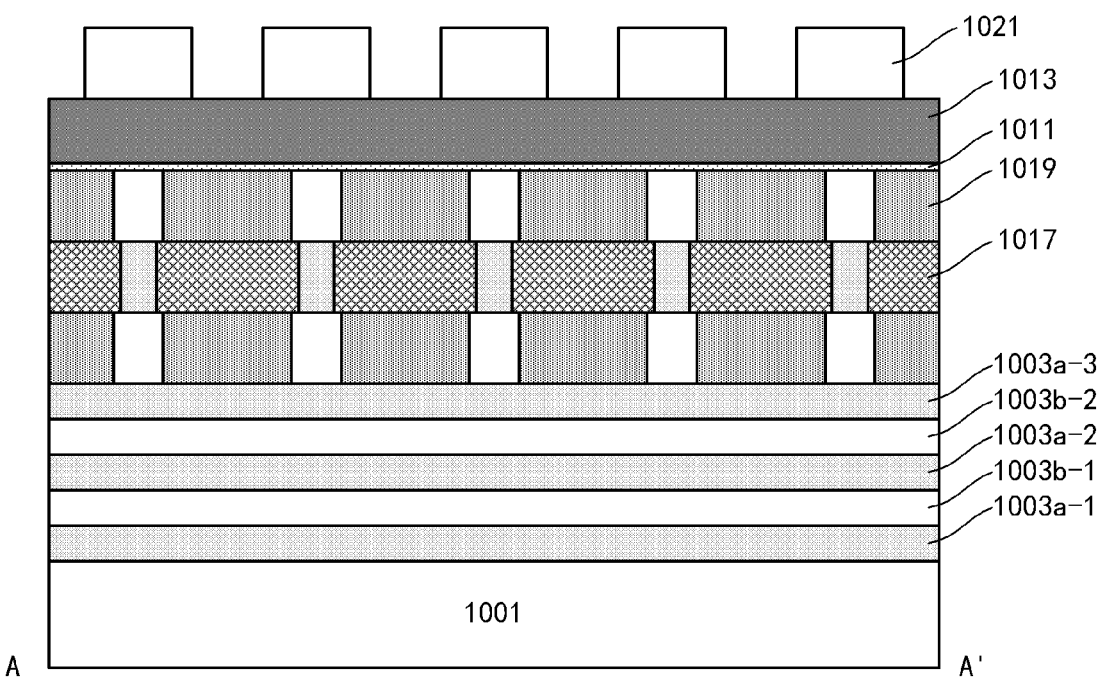

Currently, the first stack exhibits the same grid pattern as the hard mask layer. As for the first sacrificial layer of the via layer, as described above, bridging portions therein may be removed. This removal may be achieved by further selective etching the first sacrificial layer as in the above separation of the active regions. However, remaining nodes in this case are smaller (as described above, the remaining nodes are recessed inwardly with respect to the nodes of the hard mask layer). To ensure process margin and reduce contact resistance, photolithography may be used to make the remaining nodes larger. For example, as shown in FIG. 9(a) and FIG. 9(b), a photoresist 1021 may be formed on the structure shown in FIG. 8(a) and FIG. 8(b), and the photoresist 1021 may be patterned into separate nodes corresponding to the pattern of the hard mask layer, so as to cover the respective nodes in the first sacrificial layer and expose the bridging portions between the nodes. As shown in FIG. 9(a), the nodes of the photoresist 1021 may be larger than the nodes of the hard mask layer so that the nodes subsequently left in the first sacrificial layer may be larger, and may also cover the separate active regions to prevent the active regions from being affected when the first sacrificial layer is etched. Alternatively, a thin layer may be deposited as a hard mask layer, and then the hard mask layer may be patterned using the photoresist described above.

Figure 10A:
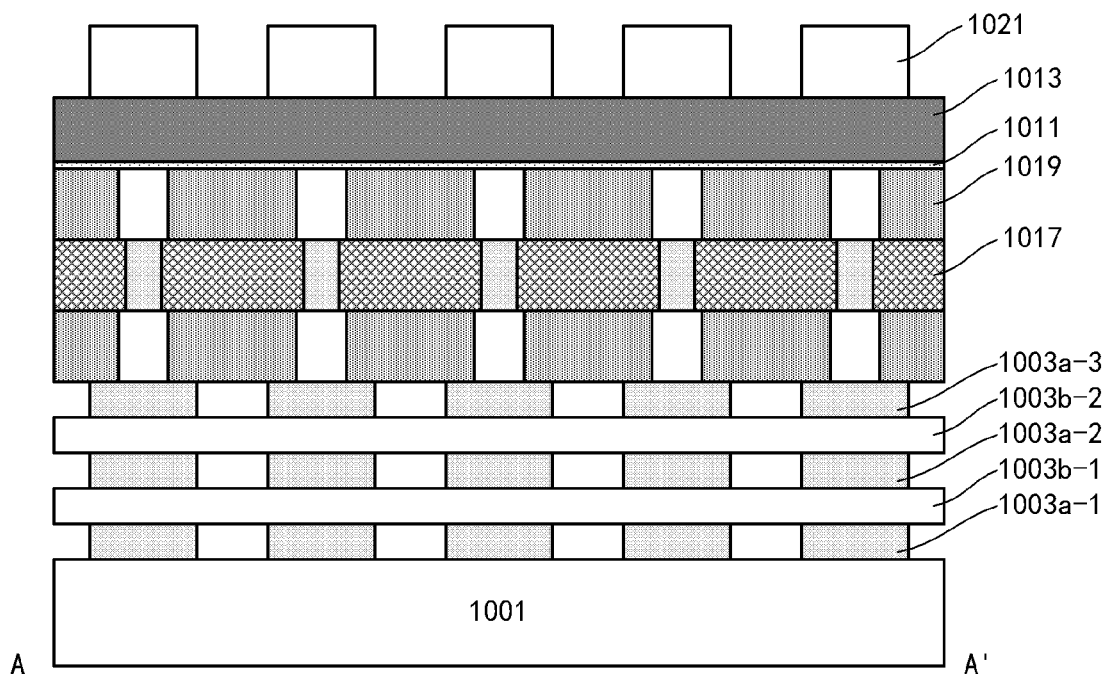
Figure 10B:
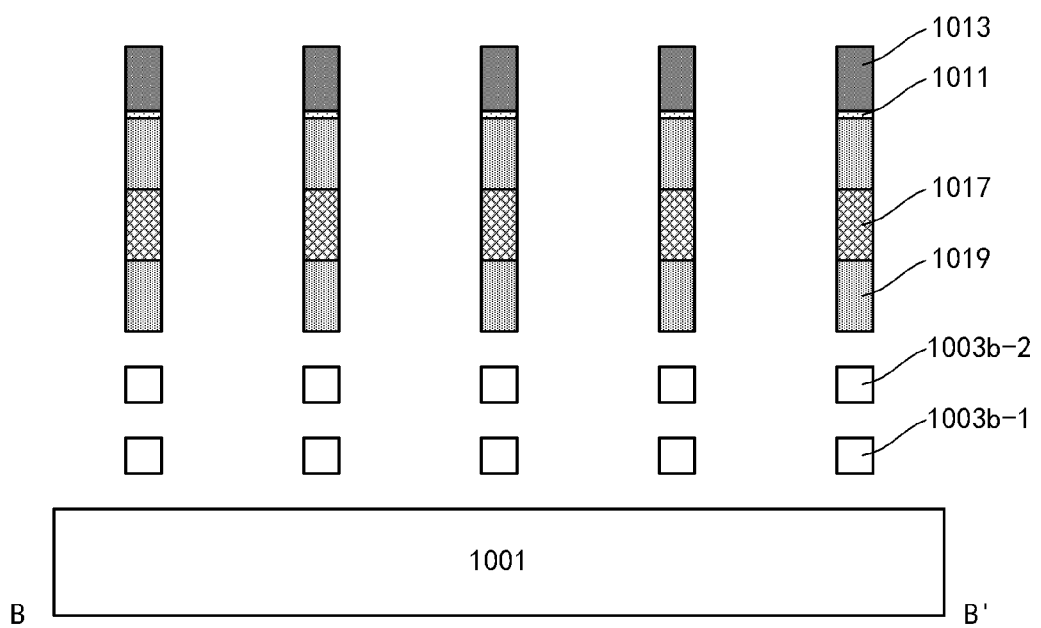

Then, as shown in FIG. 10(a) and FIG. 10(b), the first sacrificial layer (SiGe) may be further selectively etched with respect to the second sacrificial layer (Si). As a result, the bridging portions of the first sacrificial layer exposed by the photoresist 1021 are removed (see FIG. 10(b)), and the nodes of the first sacrificial layer are retained (see FIG. 10(a)) (due to the nodes of the photoresist 1021 as described above are relatively large, a certain length of the bridging portions may remain around the outer peripheries of the nodes of the first sacrificial layer). Subsequently, the photoresist 1021 may be removed.

Thus, a frame of the interconnection structure is defined in the first stack, and then the pattern in the first stack (node patterns in the first sacrificial layer and grid patterns in the second sacrificial layer) may be trimmed according to a connection design of the interconnection structure. This trimming may be performed layer by layer.

Figure 11A:
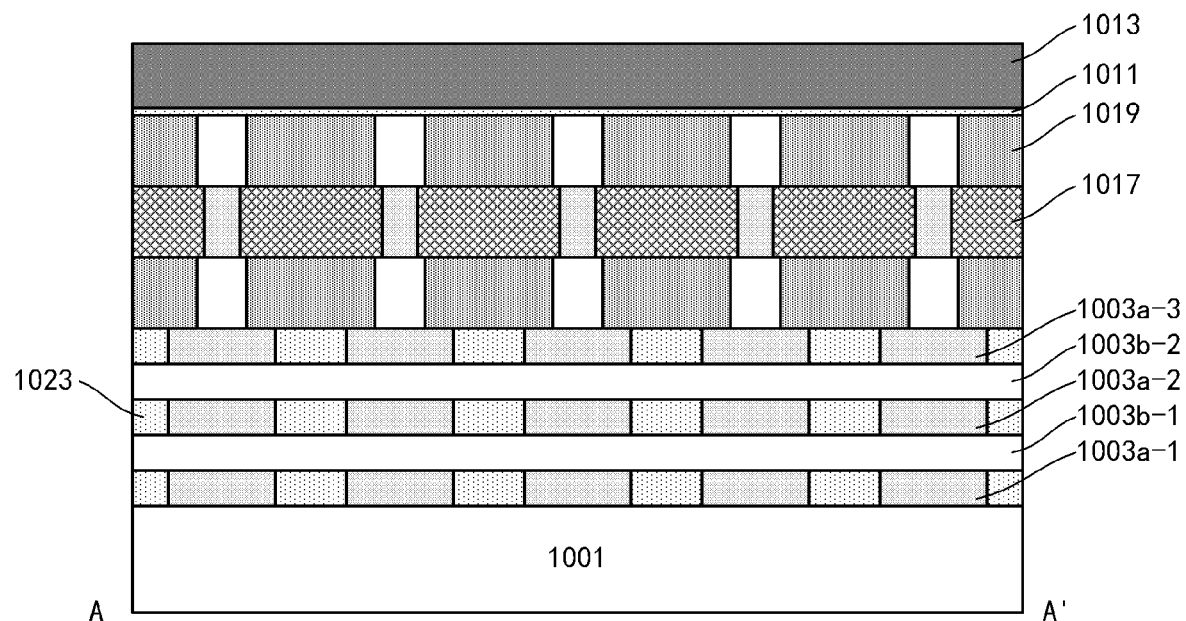
Figure 11B:
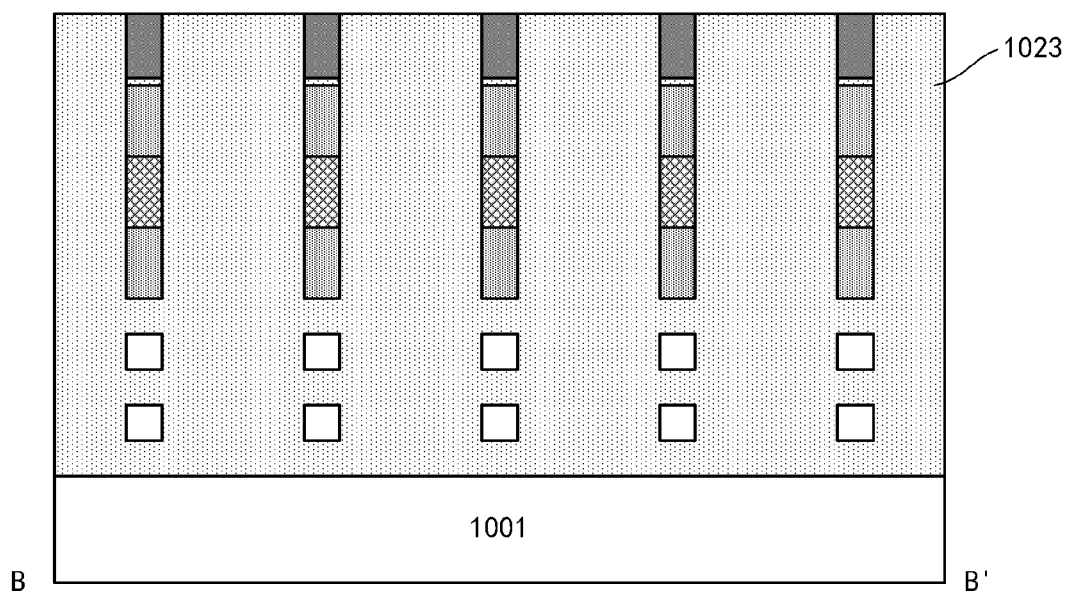

In order to better perform the layer-by-layer trimming, a dielectric layer may be formed in gaps of the first stack and the second stack. As shown in FIG. 11(a) and FIG. 11(b), a dielectric layer 1023 (for example, oxide) may be formed on the substrate 1001 by, for example, deposition. The deposited dielectric layer 1023 may be planarized, such as by using chemical mechanical polishing (CMP), and the CMP may stop at the second sub-layer 1013 of the hard mask layer. Thus, a top surface of the dielectric layer 1023 may be substantially coplanar with a top surface of the second sub-layer 1013. After that, the top surface (in a certain area) of the dielectric layer 1023 may be gradually lowered to sequentially expose respective layers in the first stack, so as to achieve the layer-by-layer trimming.

In the following, the pattern trimming of the second sacrificial layer may be described as an example first. Currently, the bridging portions are provided between each node in each second sacrificial layer. The bridging portions between some nodes may be cut off according to a connection design of each interconnection layer, so as to define paths that conform to the connection design of respective interconnection layer. In order to cut off the bridging portions, processing channels to the bridging portions are required.

Figure 12A:
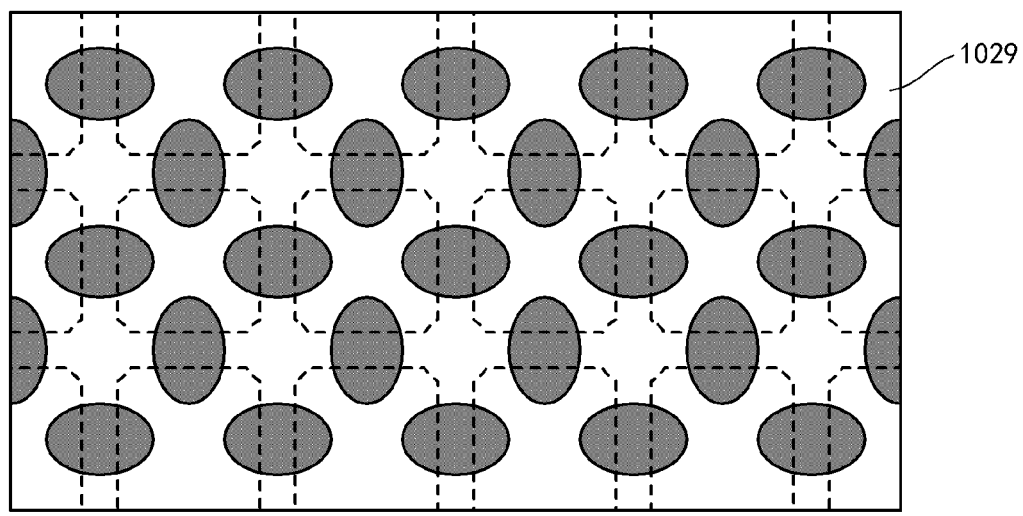
Figure 12B:
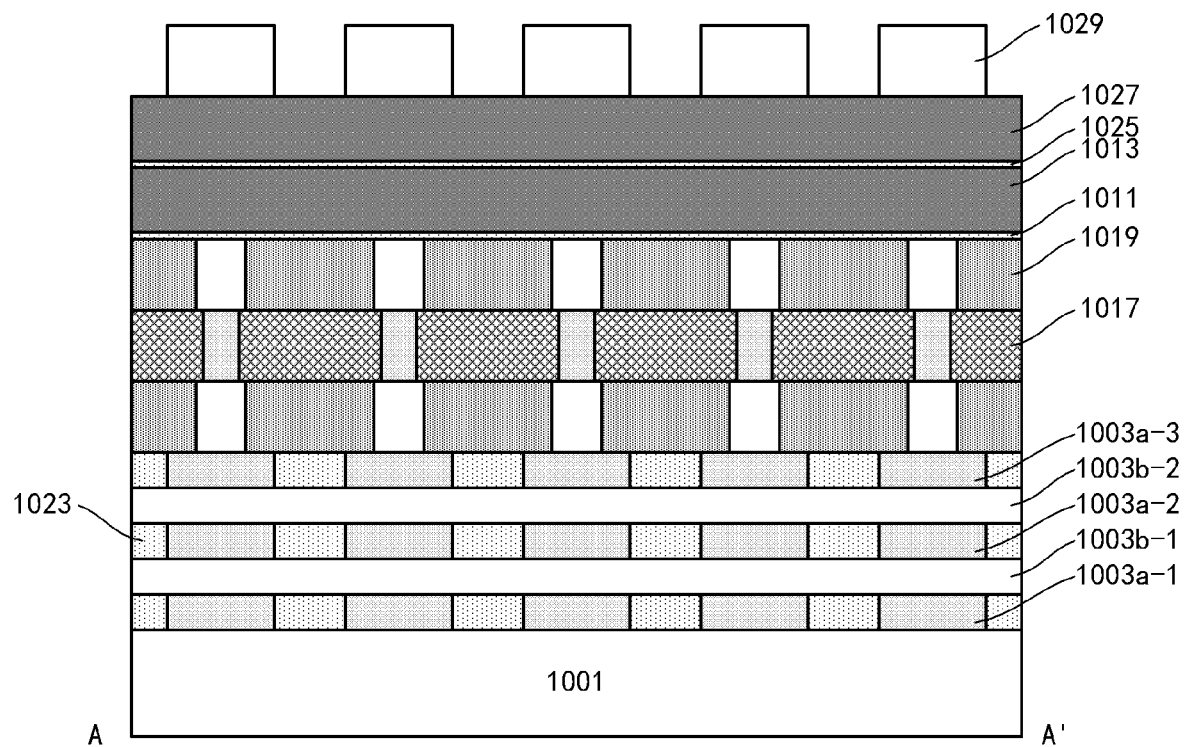
Figure 12C:
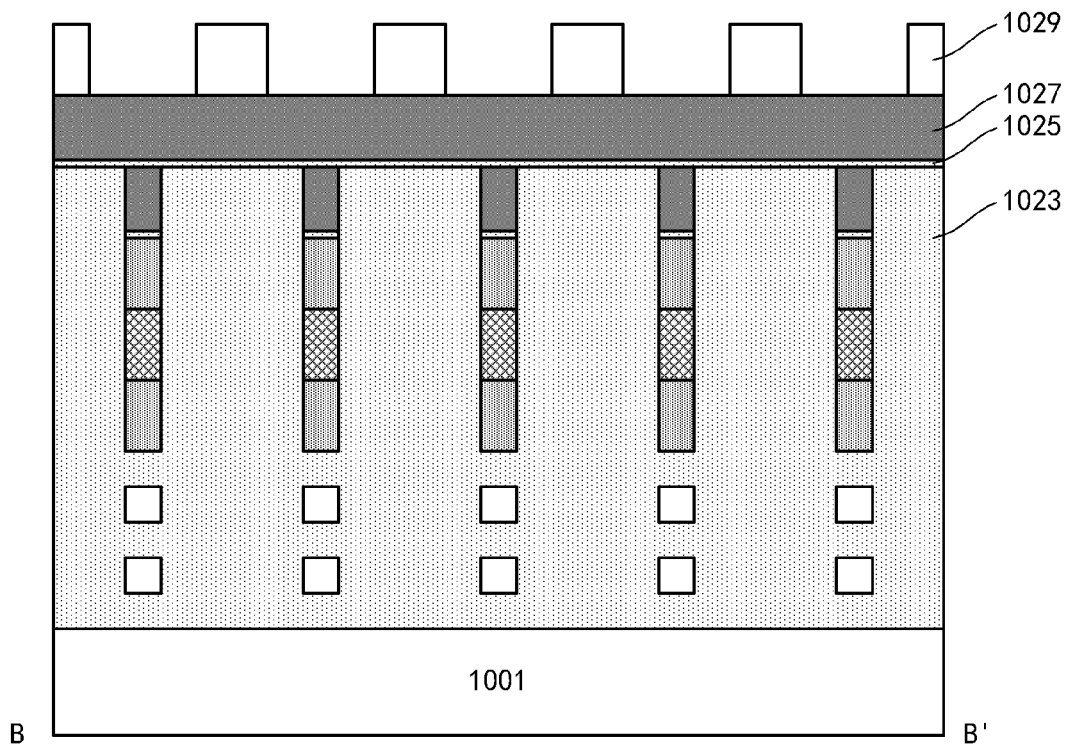

For example, openings exposing the bridging portions may be formed in the dielectric layer 1023. This may be achieved by using an additional hard mask layer. As shown in FIGS. 12(a), 12(b), and 12(c), another hard mask layer may be formed on the top surface of the dielectric layer 1023 and the top surface of the hard mask layer (1011/1013). Similarly, the hard mask layer may also be a stack including a first sub-layer 1025 made of, for example, an oxide with a thickness of about 2 to 10 nm and a second sub-layer 1027 made of, for example, nitride or a low-k dielectric material with a thickness of about 10 to 150 nm. Regarding the first sub-layer 1025 and the second sub-layer 1027, see also the above description of the first sub-layer 1011 and the second sub-layer 1013.

The hard mask layer may be patterned into a desired pattern, as described above, to expose the bridging portions. To this end, a photoresist 1029 may be formed on the hard mask layer. The photoresist 1029 is patterned by photolithography (exposure and development) to include a series of openings, which are respectively located at each bridging portion, such as a middle portion of each bridging portion. In this example, the opening is shown as an ellipse shape, but the disclosed technology is not limited to this, and may also be various shapes suitable for processing, such as a circular shape and the like.

Figure 13A:
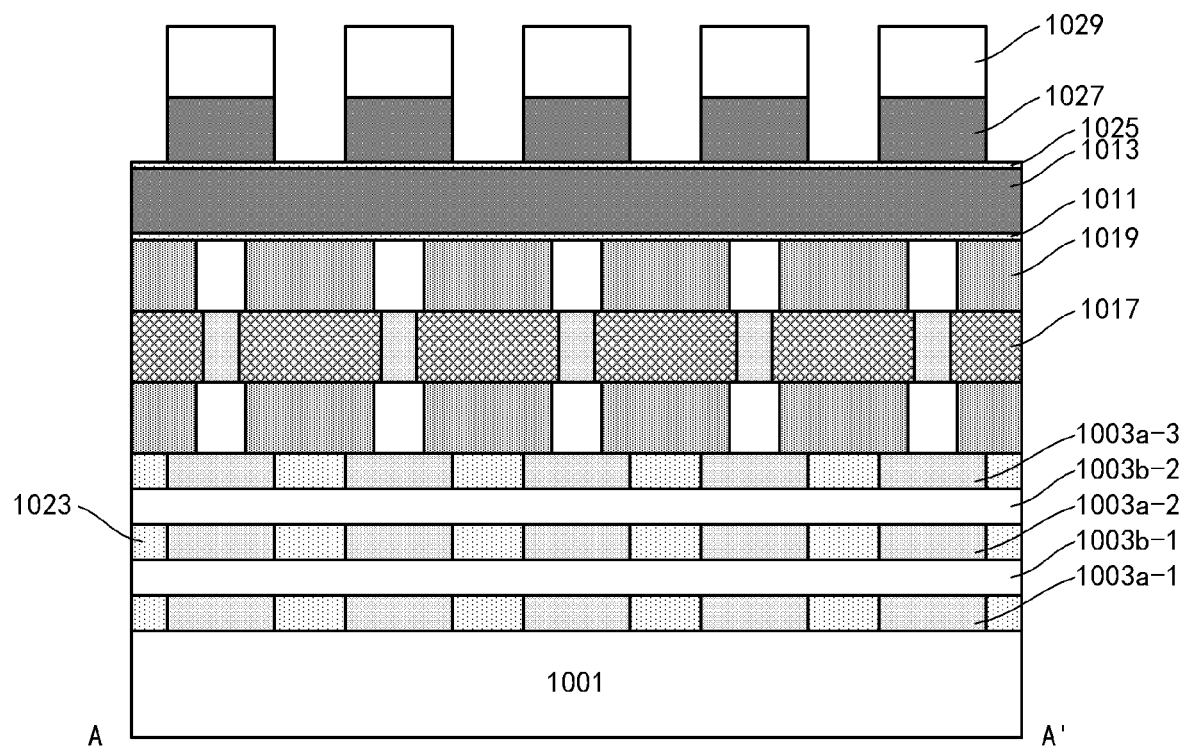
Figure 13B:
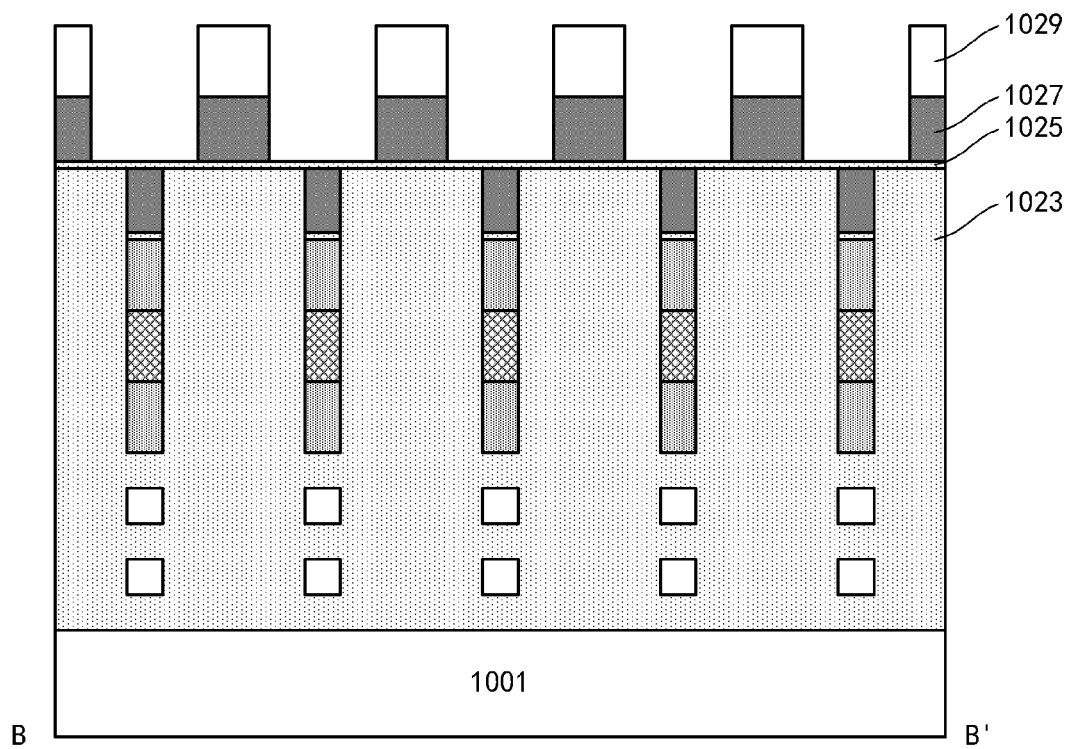
Figure 14A:
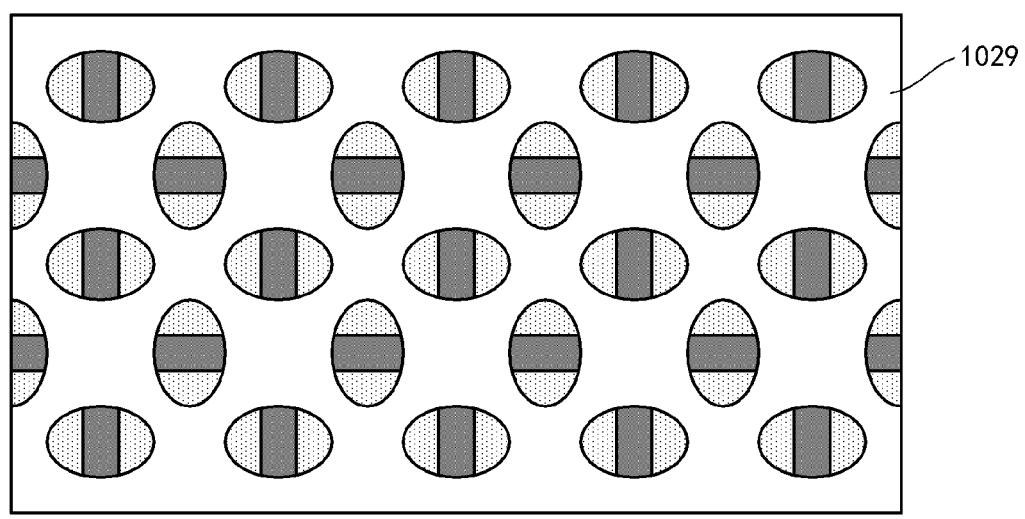
Figure 14B:
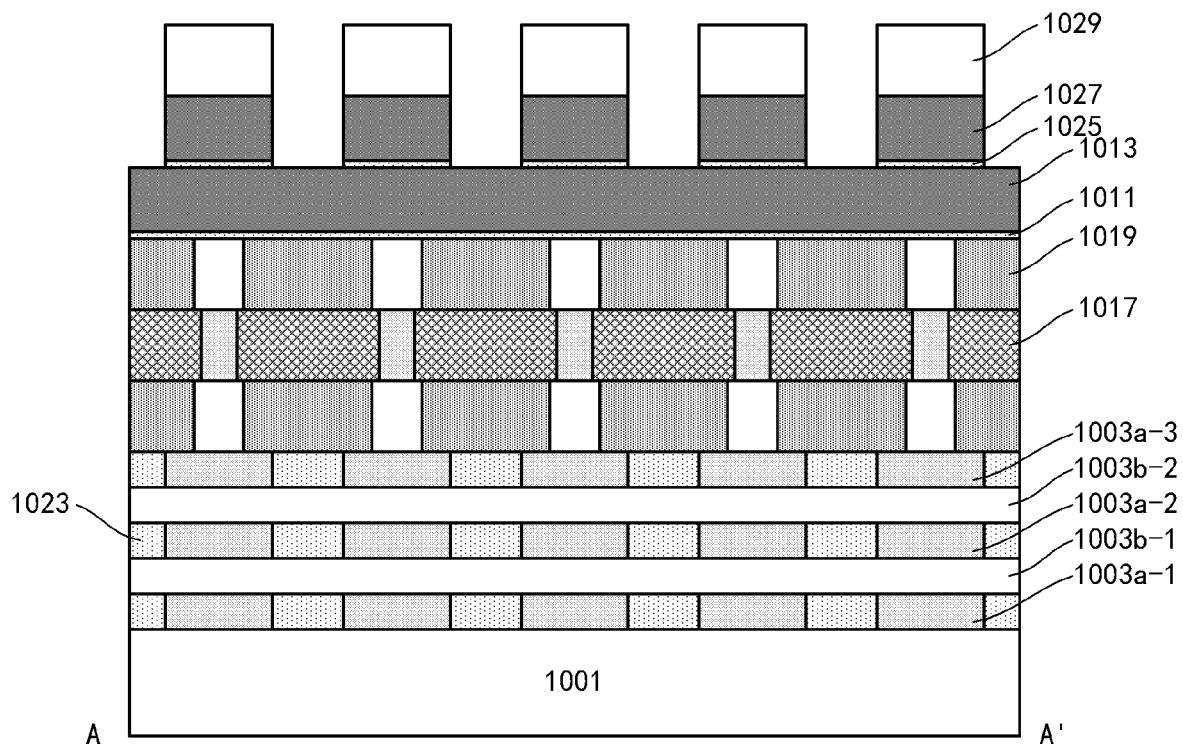
Figure 14C:
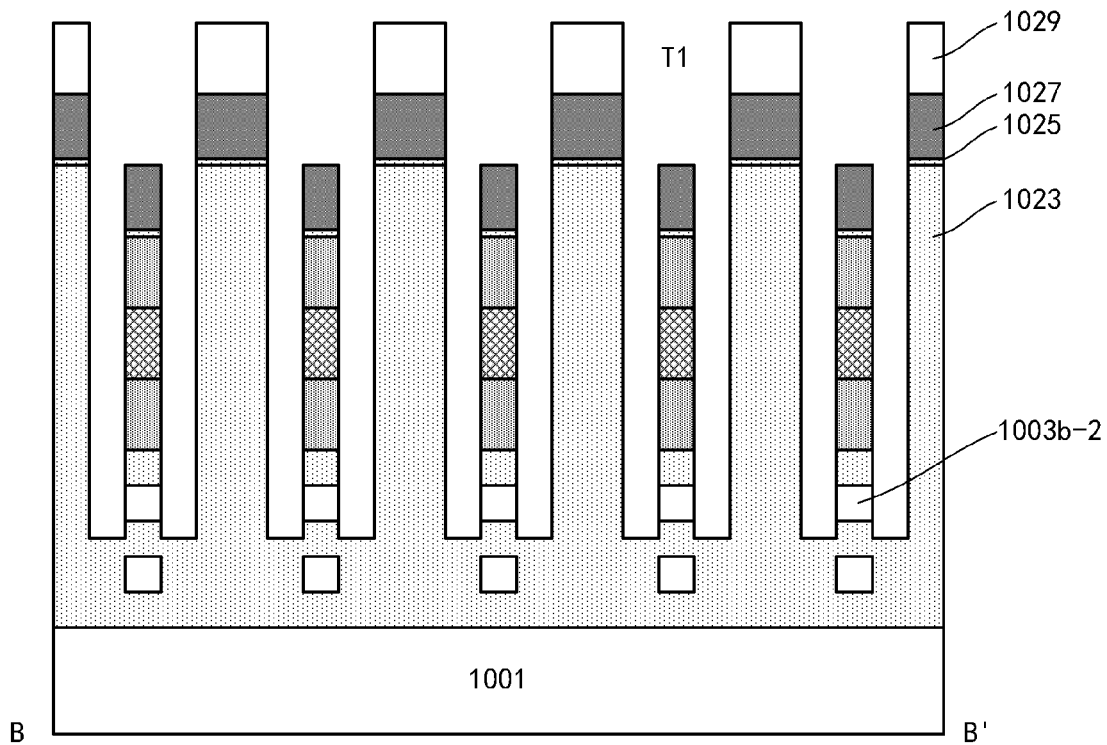

Next, the processing channels may be formed. For example, as shown in FIG. 13(a) and FIG. 13(b), the photoresist 1029 may be used as a mask to selectively etch the second sub-layer 1027 (nitride), such as RIE. For example, RIE may be performed in the direction substantially perpendicular to the surface of the substrate, and may stop at the first sub-layer 1025 (oxide). Then, as shown in FIGS. 14(*a*), 14(*b*), and 14(*c*), the first sub-layer 1025 and the dielectric layer 1023 (both are oxides here) may be selectively etched such as RIE. For example, RIE may be performed in the direction substantially perpendicular to the surface of the substrate, and may be performed until the uppermost second sacrificial layer 1003*b*-2 is exposed, thereby forming processing channels T1, as shown in FIG. 14(*c*). For example, a bottom surface of the processing channel T1 may be located between the bottom surface and the top surface of the first sacrificial layer 1003*a*-2 under the second sacrificial layer 1003*b*-2 that needs to be exposed, which on one hand, ensures that the second sacrificial layer 1003*b*-2 is fully exposed, and on the other hand, avoids exposing the second sacrificial layer 1003*b*-1 underneath. In order to accurately control an etching amount, ALE may be used. After that, the photoresist 1029 may be removed.

As shown in FIG. 14(*a*), each processing channel T1 is located approximately in the middle of each bridging portion, and each node (hence, the active region and the first sacrificial layer located at each node) is shielded. As shown in FIG. 14(*c*), in each processing channel T1, except for the second sacrificial layer 1003*b*-2, the remaining exposed material layers are all dielectric materials (the hard mask layers of oxide and nitride, the position holding layer 1017 of oxynitride, the position holding layer 1019 of SiC, and the dielectric layer 1023 of oxide).

All current bridging portions (specifically the middle portions of the bridging portions) are exposed in the respective processing channels T1. Among these bridging portions, some bridging portions need to be cut off, while other bridging portions need to be retained. The bridging portions that need to be cut off and the bridging portions that need to be retained may be processed separately.

In addition, there are usually a plurality of interconnection layers (hence, a plurality of second sacrificial layers) in the interconnection structure, and a routing in each interconnection layer is not necessarily the same. For example, for an upper layer and a lower layer of the second sacrificial layer in a same processing channel T1, a bridging portion of a layer (for example, the upper layer) may need to be retained, while a bridging portion of another layer (for example, the lower layer) may need to be cut off. Therefore, when the bridging portion of the lower layer is cut off through the processing channel T1, the bridging portion of the upper layer (including the same material as the lower layer, both are the second sacrificial layers) that may also be exposed in the processing channel T1 may also be cut off because the upper layer is located above the lower layer. According to the embodiments of the disclosed technology, the bridging portions that need to be retained may be replaced with a material that has etching selectivity with respect to the second sacrificial layer, so as to avoid being affected when the lower layer of the second sacrificial layer is processed.

Figure 15A:
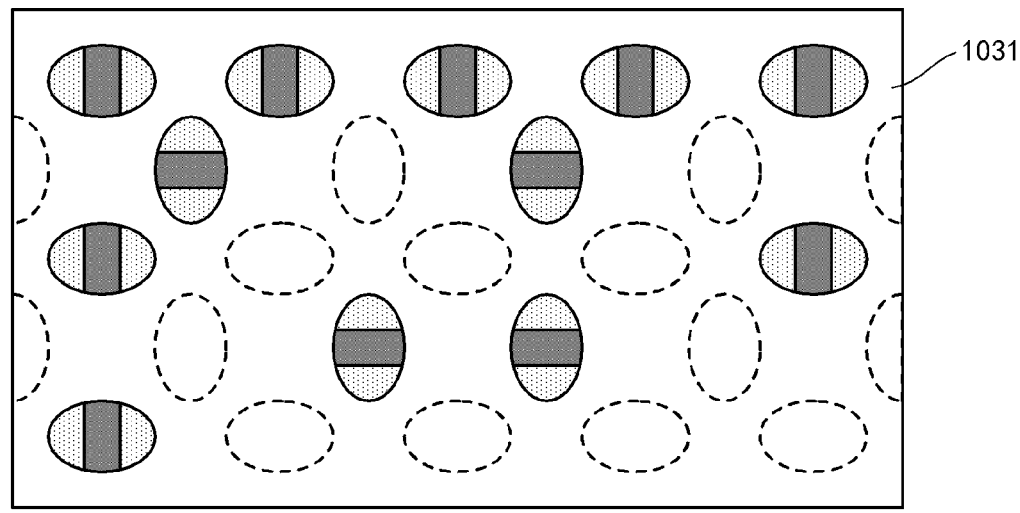
Figure 15B:
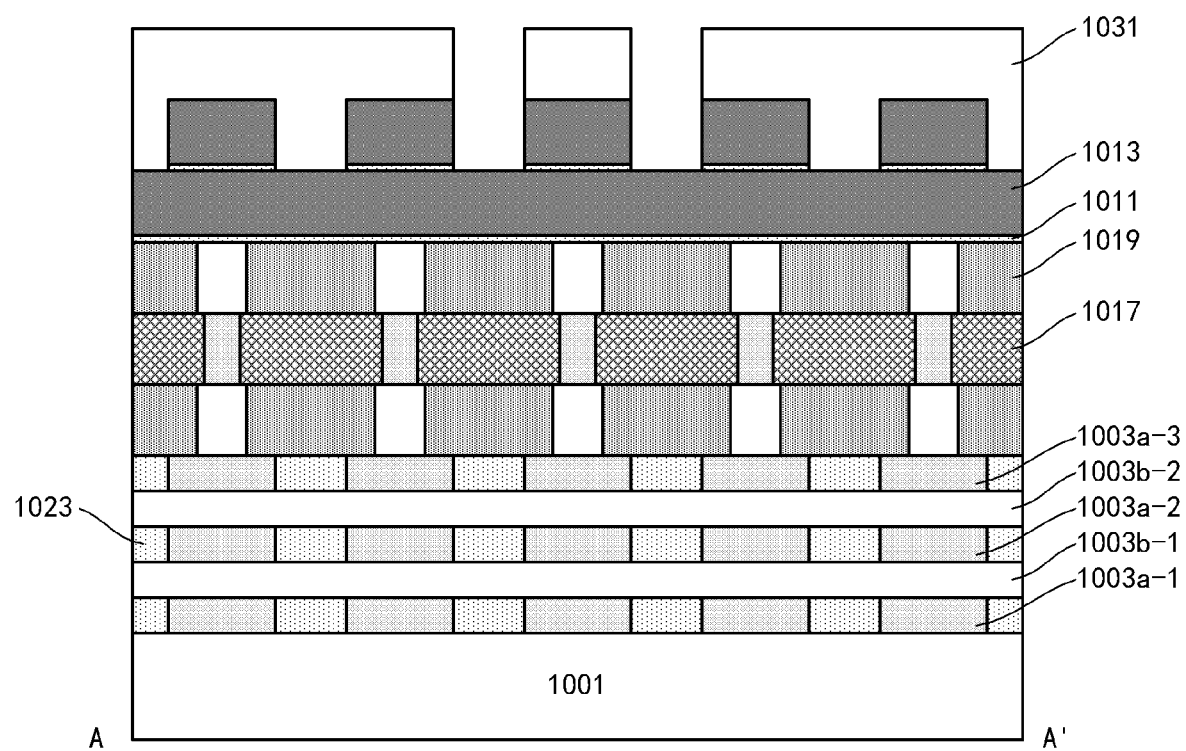
Figure 15C:
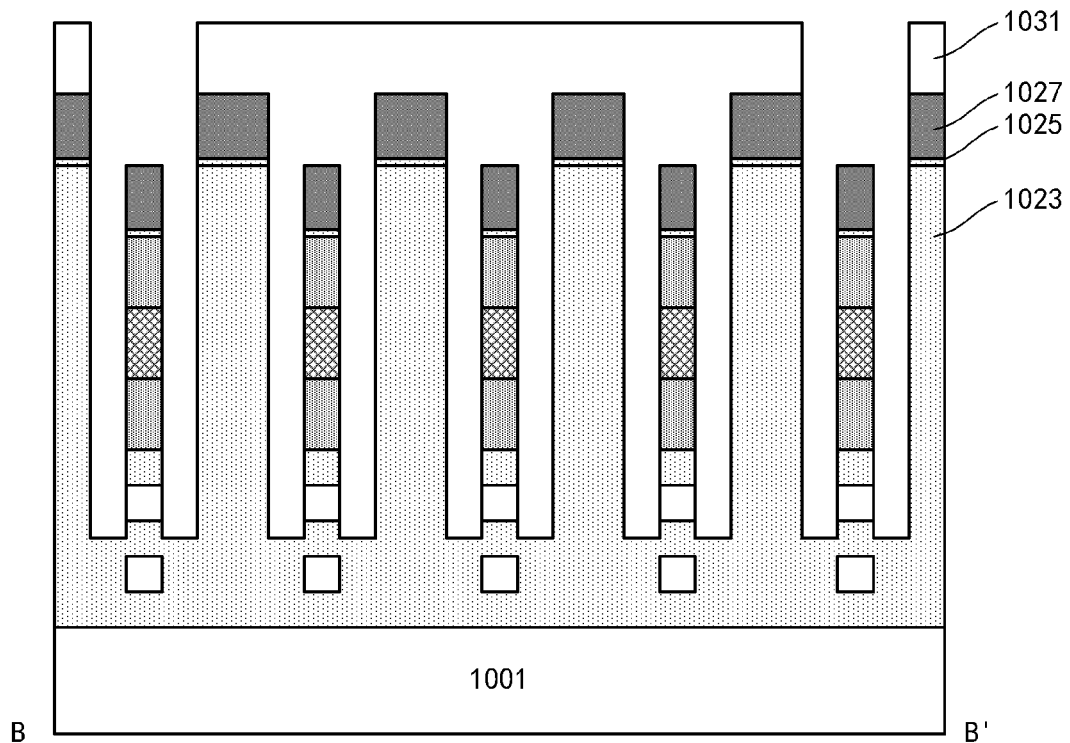

For example, as shown in FIGS. 15(*a*), 15(*b*), and 15(*c*), a photoresist 1031 may be formed on the structure shown in FIGS. 14(*a*), 14(*b*), and 14(*c*) (with the photoresist 1029 removed), and the photoresist 1031 is patterned by photolithography to expose the processing channels T1 where the bridging portions need to be retained, and cover the processing channels T1 where the bridging portions need to be cut off.

Figure 16A:
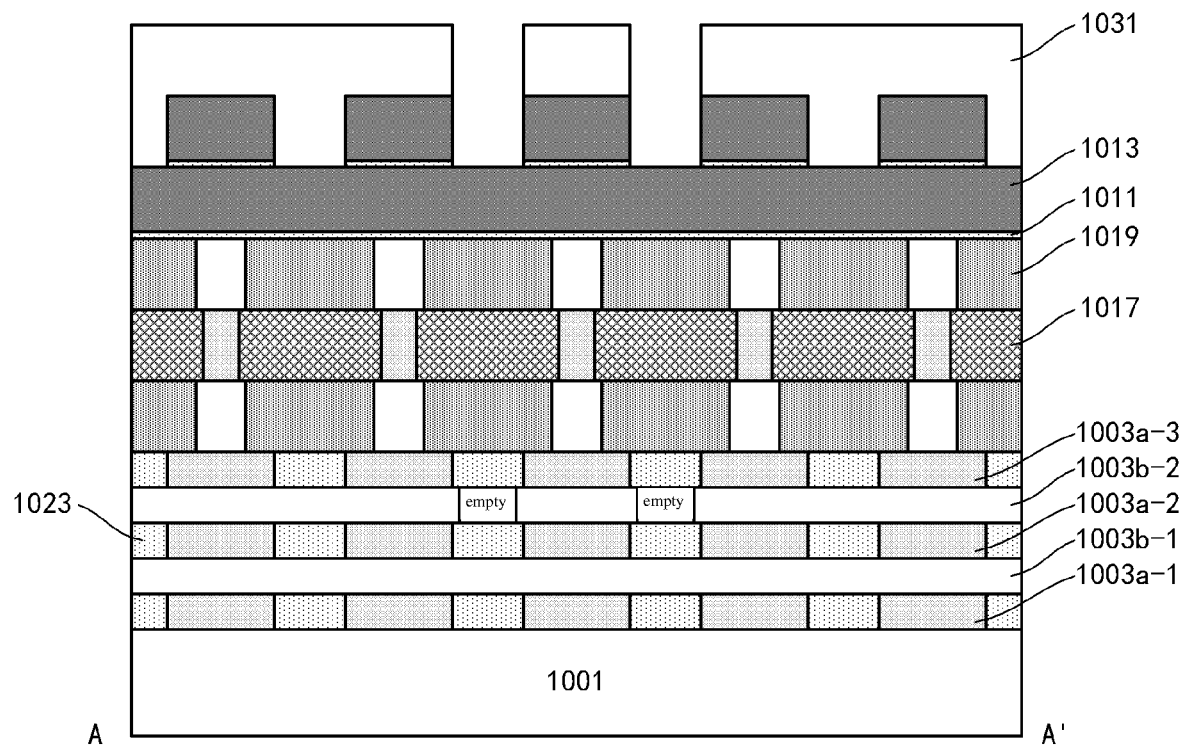
Figure 16B:
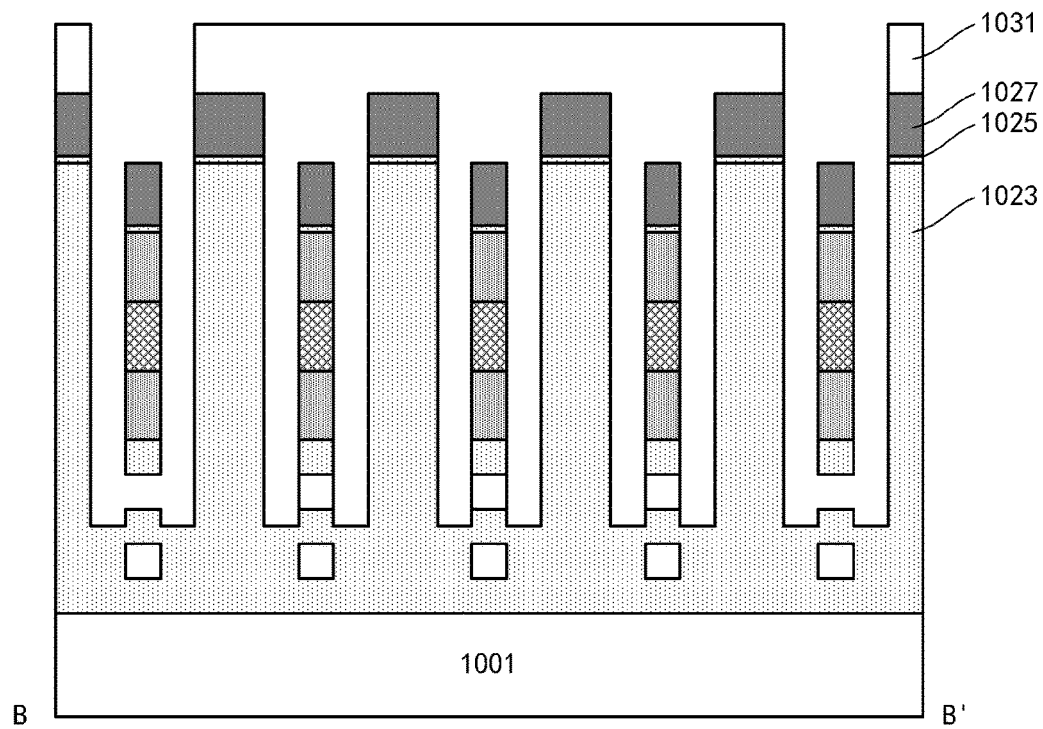

Then, as shown in FIG. 16(*a*) and FIG. 16(*b*), the second sacrificial layer 1003*b*-2 (Si) may be selectively etched (a first etching) through the processing channels T1 exposed by the photoresist 1031, relative to the dielectric material (the oxide, nitride, oxynitride, SiC as described above) exposed in the processing channels T1. In this way, a part of the second sacrificial layer 1003*b*-2 in these exposed processing channels T1 may be removed. Thus, gaps are formed at some of the bridging portions of the second sacrificial layer 1003*b*-2. After that, the photoresist 1031 may be removed.

Figure 17A:
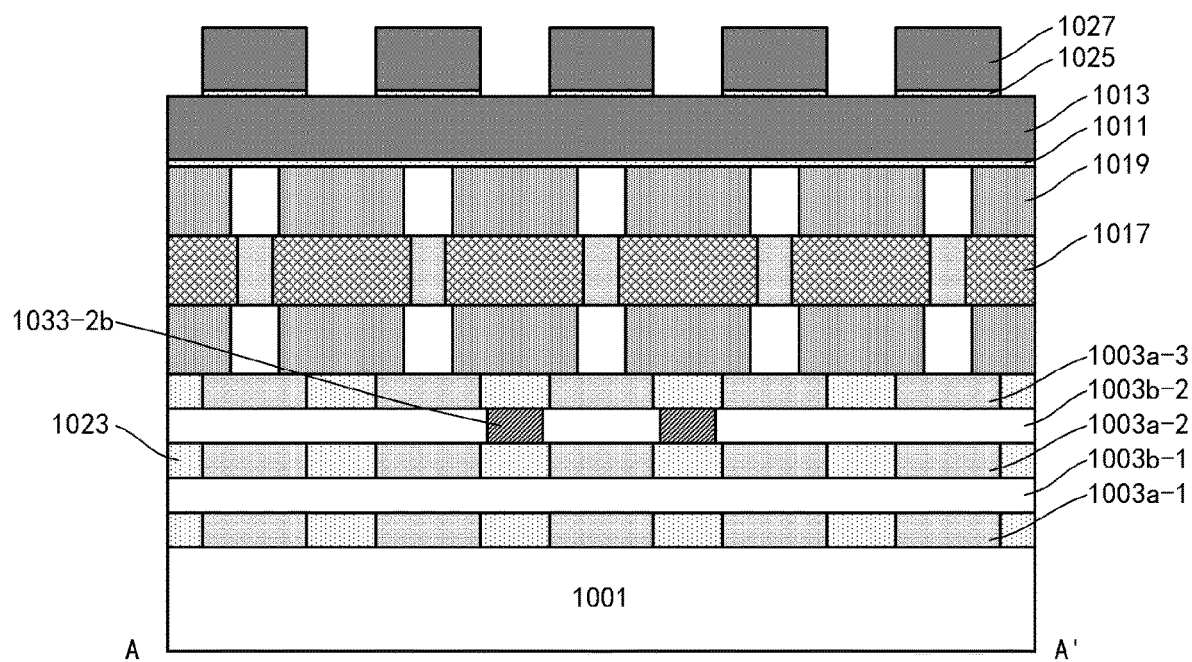
Figure 17B:
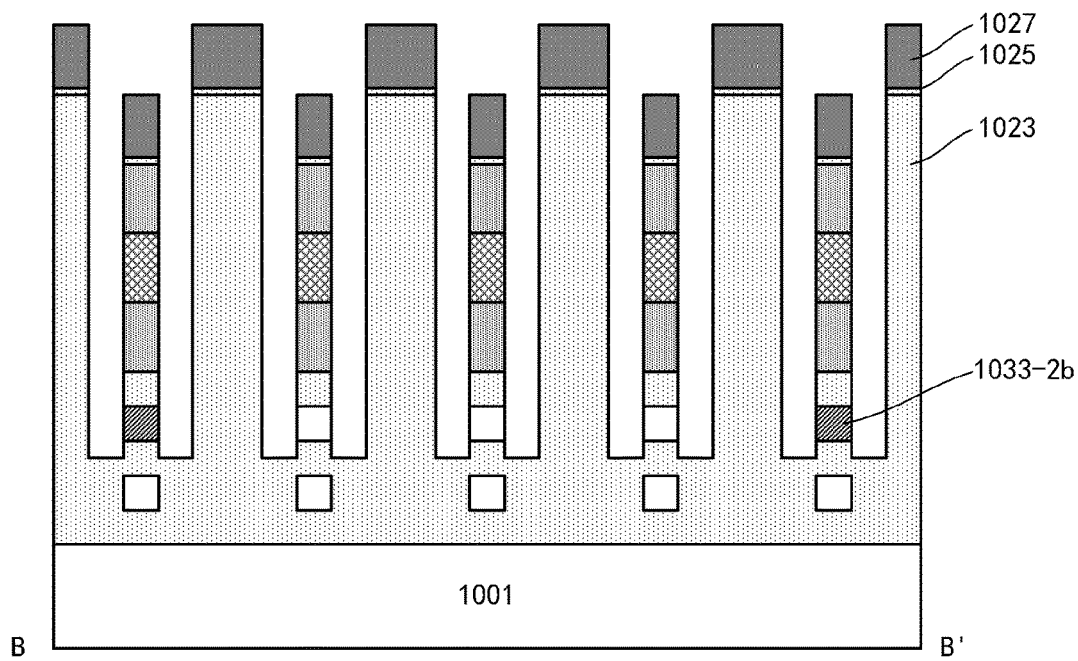

Next, as shown in FIG. 17(*a*) and FIG. 17(*b*), a position holding layer 1033-2*b* may be filled (a first filling) into the gaps in the bridging portions of the second sacrificial layer 1003*b*-2 through the processing channels T1. The position holding layer 1033-2*b* may include a material having etching selectivity with respect to the second sacrificial layer (Si), such as SiGe, and an atomic percentage of Ge may be about 25 to 75%. This filling may be achieved by depositing SiGe through the processing channels T1, and then etching back the deposited SiGe (relative to the surrounding dielectric material) such as RIE. RIE may be performed in the direction substantially perpendicular to the surface of the substrate. Due to an existence of the hard mask layer 1011/1013, the SiGe after etch-back may be completely filled in the gaps of the bridging portions and may extend along the corresponding bridging portions.

Then, some of the bridging portions of the second sacrificial layer 1003*b*-2 are cut off.

Figure 18A:
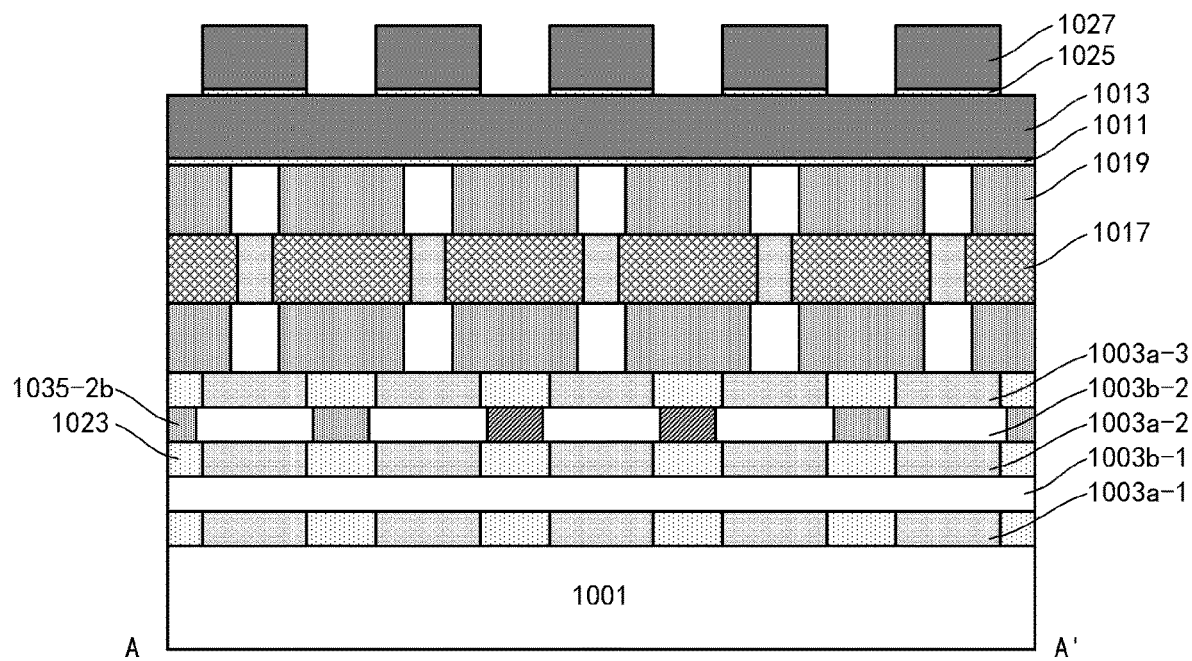
Figure 18B:
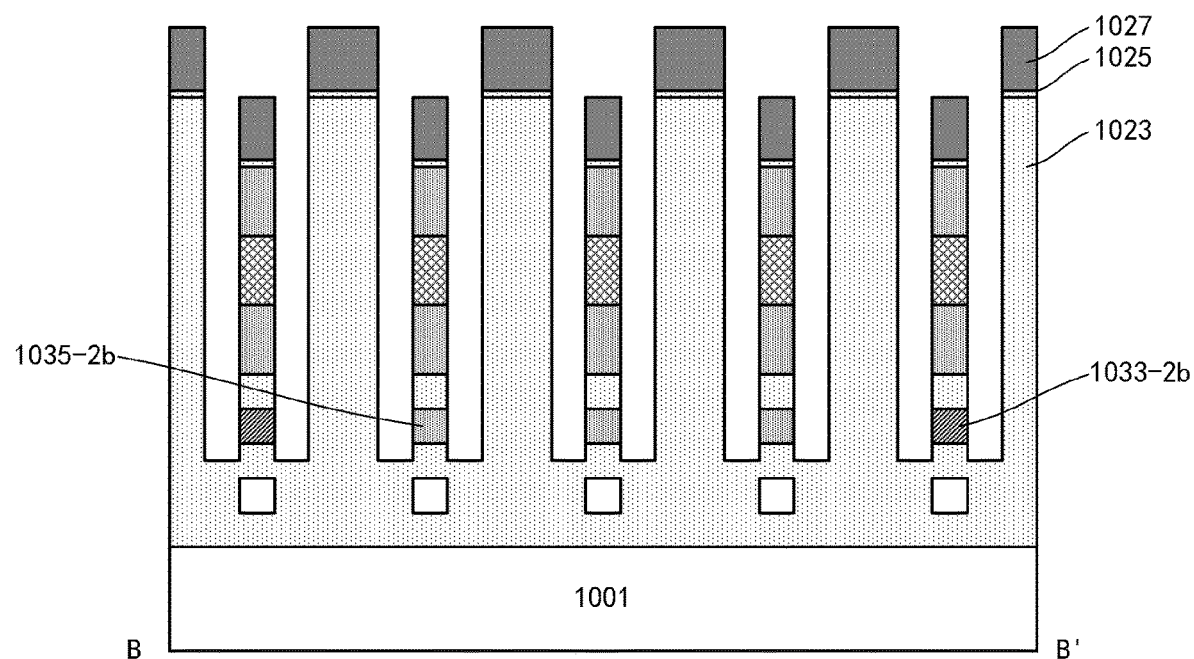

For example, as shown in FIG. 18(*a*) and FIG. 18(*b*), the second sacrificial layer 1003*b*-2 (Si) may be selectively etched (a second etching) relative to other material layers exposed in the processing channels T1 (for example, the dielectric material and the position holding layer 1033-2*b* of SiGe described above) through the processing channels T1. In this way, a part of the second sacrificial layer 1003*b*-2 in the processing channels T1 originally covered by the photoresist 1031 may be removed. Although the bridging portions replaced by the position holding layer 1033-2*b* as described above are also exposed in the processing channels T1, due to the etching selectivity, the position holding layer 1033-2*b* may be substantially unaffected here. Thus, gaps are formed at some of the bridging portions of the second sacrificial layer 1003*b*-2. Insulating portions 1035-2*b* may be filled (a second filling) in these gaps. In consideration of the etching selectivity required in the subsequent processes (for example, the etching selectivity with respect to the dielectric layer 1023), the insulating portions 1035-2*b* may include, for example, SiC. This filling may be achieved by deposition and then etch back as described above. Similarly, the insulating portions 1035-2*b* may be completely filled in the gaps of the bridging portions and may extend along the corresponding bridging portions.

Then, as shown in FIG. 18(*a*), the second sacrificial layer 1003*b*-2 is isolated into different parts by the insulating portions 1035-2*b* through the first etching—the first filling—the second etching—the second filling (EFEF) process, which may then form (a part of) different conductive channels.

Next, similar process may be performed on the lower second sacrificial layer 1003*b*-1.

For example, as described above in conjunction with FIGS. 14(*a*), 14(*b*), and 14(*c*), the dielectric layer 1023 may be selectively etched, such as RIE, to deepen the processing channels T1, thereby exposing the second sacrificial layer 1003*b*-1. For example, a bottom surface of a processing channel T1 may be located between a top surface and a bottom surface of the first sacrificial layer 1003*a*-1 under the second sacrificial layer 1003*b*-1 to be exposed. In order to accurately control an etching depth, ALE may be used. Then, the above-mentioned EFEF process may be performed through the deepened processing channel T1 to achieve a desired routing on the second sacrificial layer 1003*b*-1.

Specifically, as described above in conjunction with FIGS. 15(*a*), 15(*b*), and 15(*c*), a photoresist may be formed on the structure (the processing channels T1 are deepened as described above) shown in FIG. 18(*a*) and FIG. 18(*b*), and may be patterned to expose the processing channels T1 where the bridging portions need to be retained, and cover the processing channels T1 where the bridging portions need to be cut off. The pattern of the photoresist may be different from the pattern of the photoresist 1031 described above, such as exposing/covering different processing channels T1.

Through the processing channels T1 exposed by the photoresist, the exposed bridging portions of the second sacrificial layer 1003*b*-1 may be replaced with a position holding layer 1033-1*b* through etching and filling processing. Regarding the position holding layer 1033-1*b*, reference may be made to the above description of the position holding layer 1033-2*b*. After that, the photoresist may be removed. Then, through the processing channels T1, the bridging portions of the second sacrificial layer 1003*b*-1 in the processing channels T1 originally covered by the photoresist may be replaced with insulating portions 1035-1*b* through etching and filling processing. Regarding the insulating portions 1035-1*b*, reference may be made to the above description of the insulating portions 1035-2*b*. In addition, although the position holding layer 1033-2*b* and the insulating portions 1035-2*b* formed above for the second sacrificial layer 1003*b*-2 are also exposed in the processing channels T1, due to the etching selectivity, the position holding layer 1033-2*b* and the insulating portions 1035-2*b* may be substantially unaffected here.

Figure 19A:
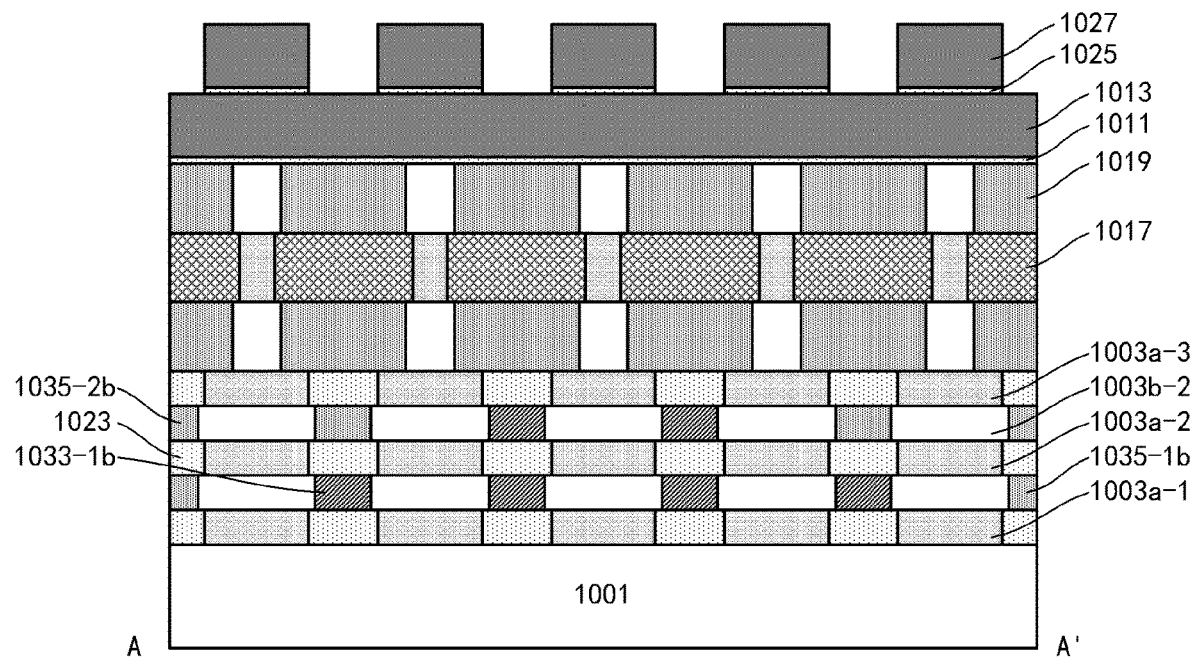
Figure 19B:
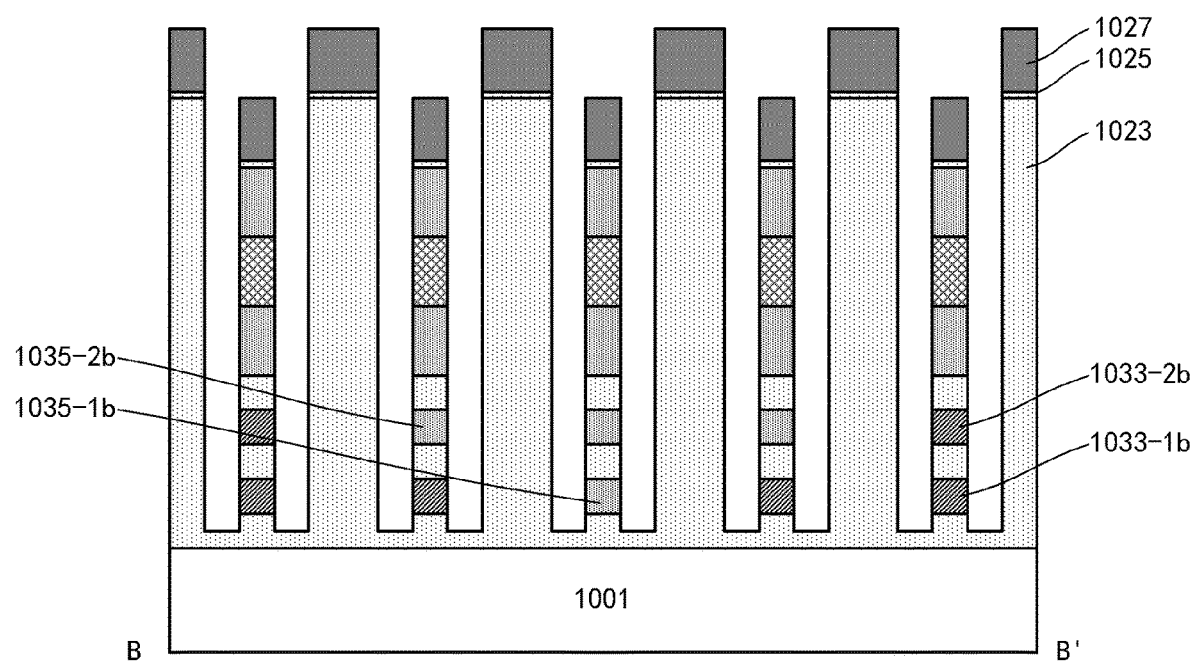

Thus, a structure shown in FIG. 19(*a*) and FIG. 19(*b*) is obtained. As shown in FIG. 19(*a*), the second sacrificial layer 1003*b*-1 is separated into different parts by the insulating portions 1035-1 through the EFEF process, and these parts may then form (a part of) different conductive channels.

Figure 20A:
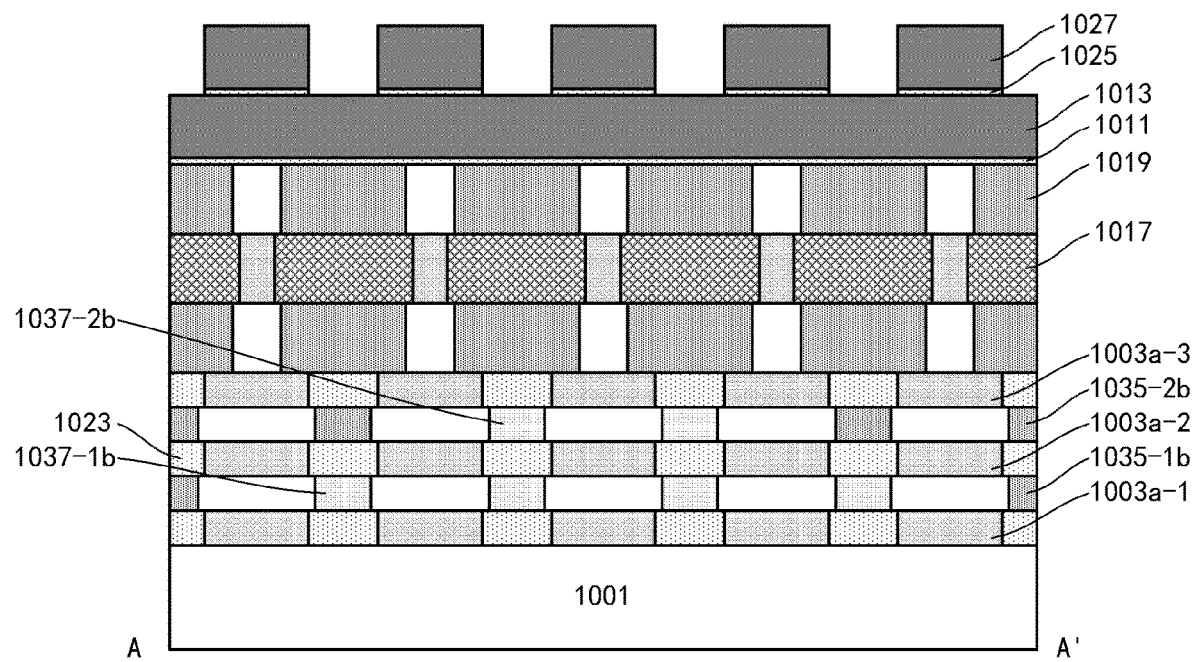
Figure 20B:
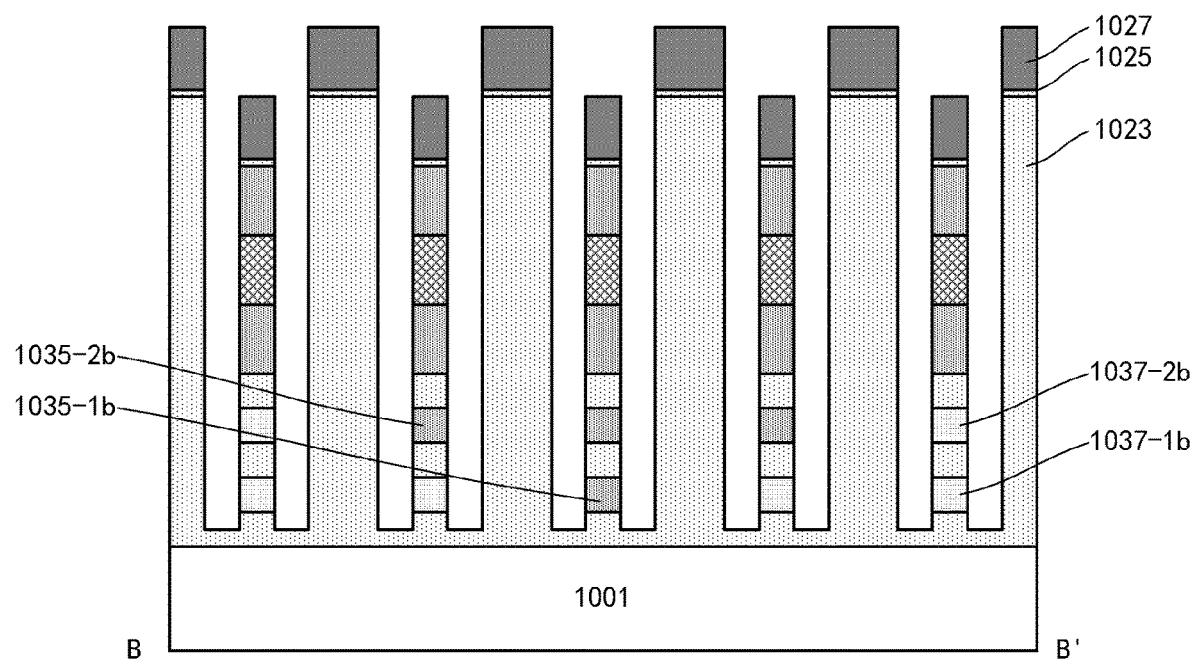

In order to avoid subsequent processing of the first sacrificial layer (SiGe in this example) affecting the position holding layers 1033-1*b* and 1033-2*b* (both are SiGe in this example, and the atomic percentages of Ge may be different), the position holding layers 1033-1*b* and 1033-2*b* may be replaced with new position holding layers having etching selectivity with respect to the first sacrificial layer. For example, as shown in FIG. 20(*a*) and FIG. 20(*b*), the position holding layers 1033-1*b*, 1033-2*b* (SiGe) are selectively etched to be removed relative to the second sacrificial layer (Si) and the dielectric material surrounding the second sacrificial layer through the processing channels T1. Then, new position holding layers 1037-1*b*, 1037-2*b* may be filled at the original positions of the position holding layers 1033-1*b*, 1033-2*b* by a method of deposition and then etch back. For example, the position holding layers 1037-1*b* and 1037-2*b* may include Si, such as polysilicon or amorphous silicon formed by deposition such as chemical vapor deposition (CVD).

Figure 21A:
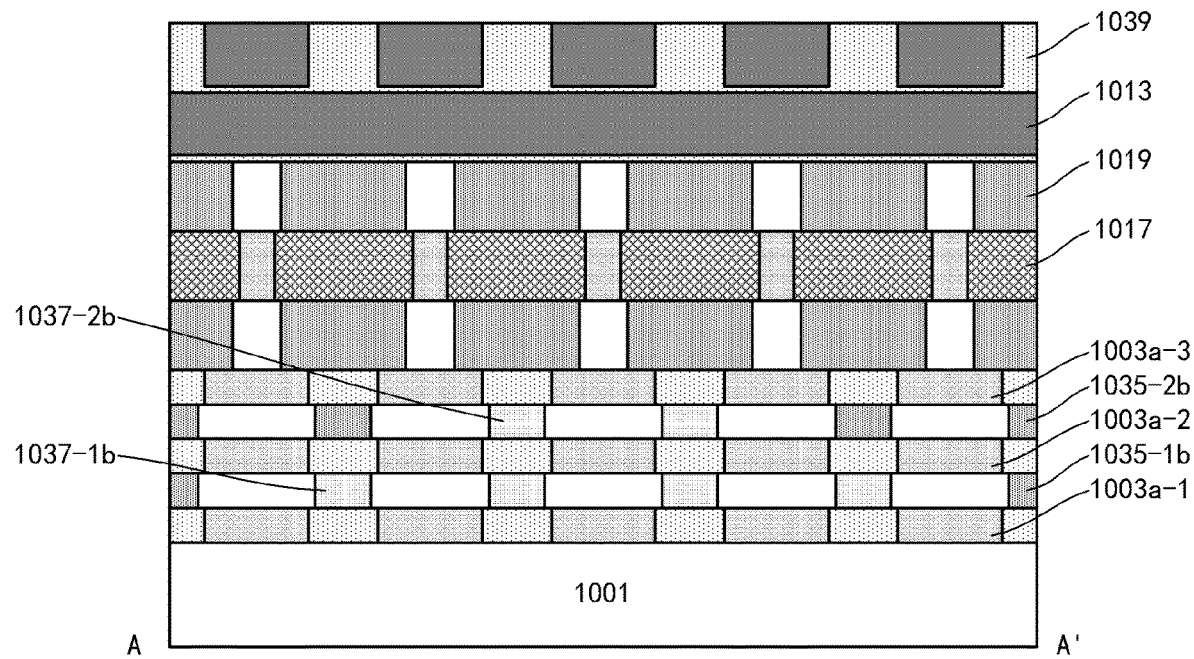
Figure 21B:
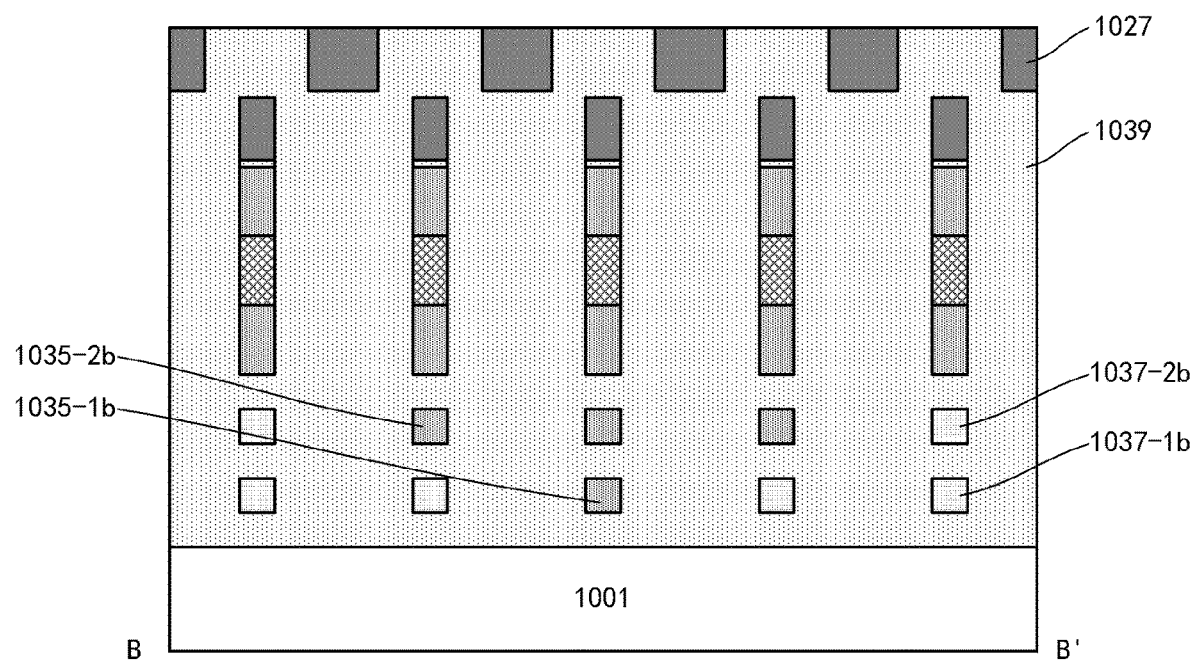

In addition, the processing channels T1 may be shielded to prevent the corresponding bridging portions from being affected in the subsequent processing. For example, as shown in FIG. 21 (*a*) and FIG. 21 (*b*), an oxide may be deposited on the structure shown in FIG. 20 (*a*) and FIG. 20 (*b*) in an amount sufficient to fill the gaps in the structure. Then, the deposited oxide may be planarized, such as CMP, and the CMP may be stopped at the second sub-layer 1027 of nitride. Here, the respective layers 1011, 1023, 1025 that are also oxides and the oxide formed here are collectively shown as 1039.

Figure 22A:
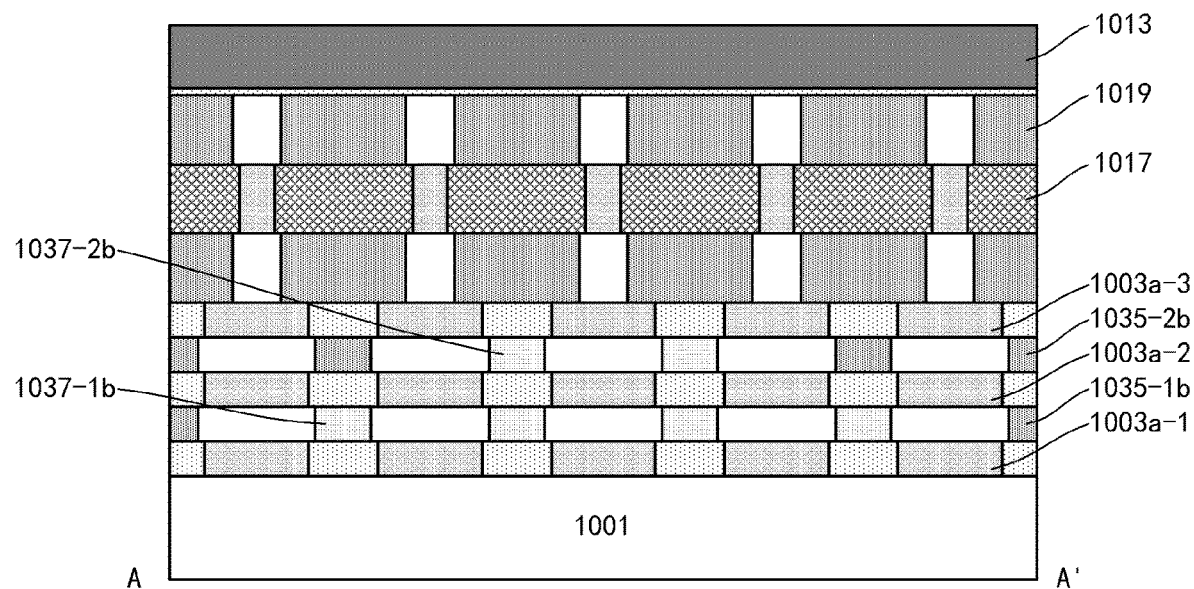
Figure 22B:
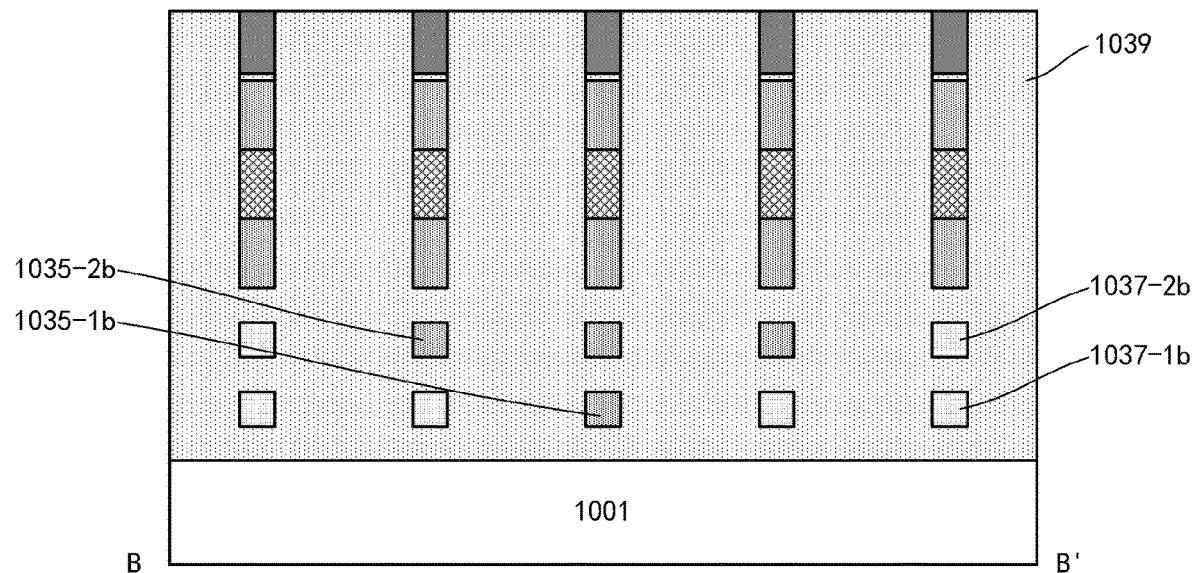
Figure 23A:
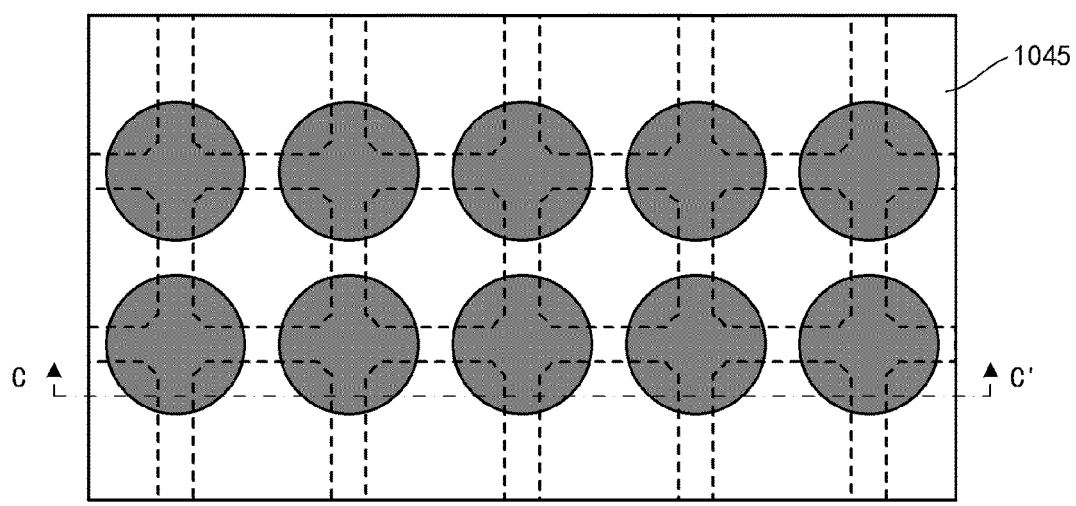
Figure 23B:
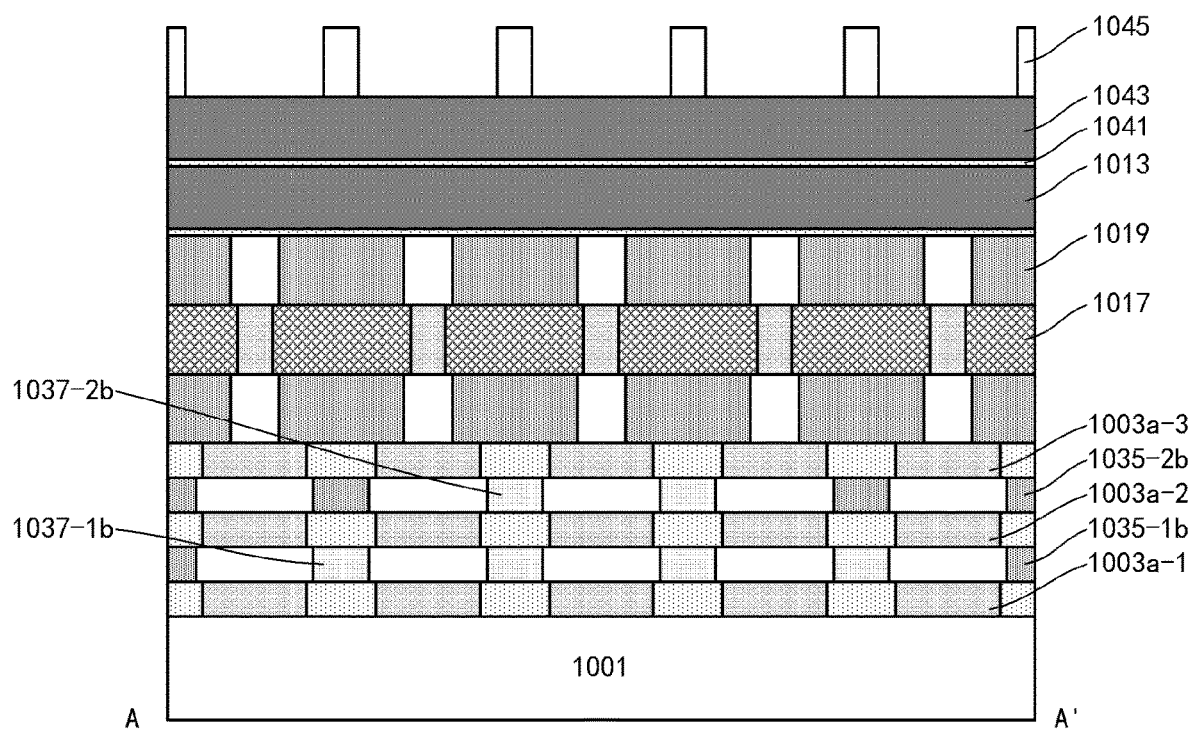
Figure 23C:
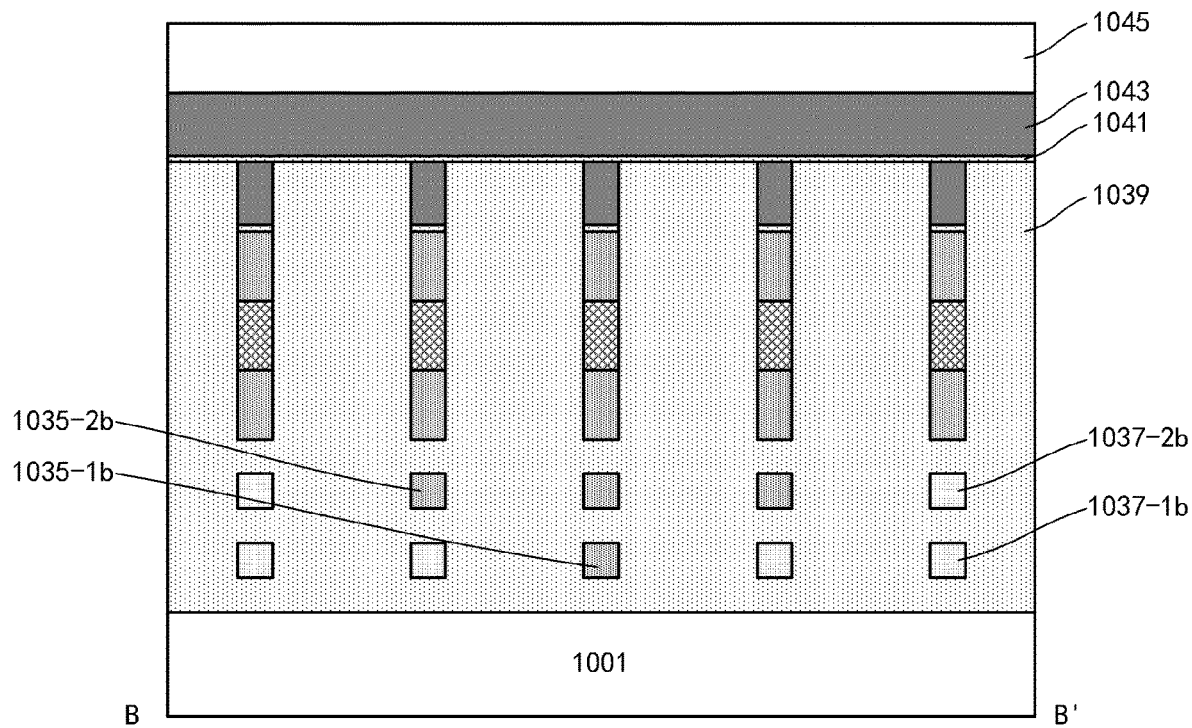
Figure 23D:
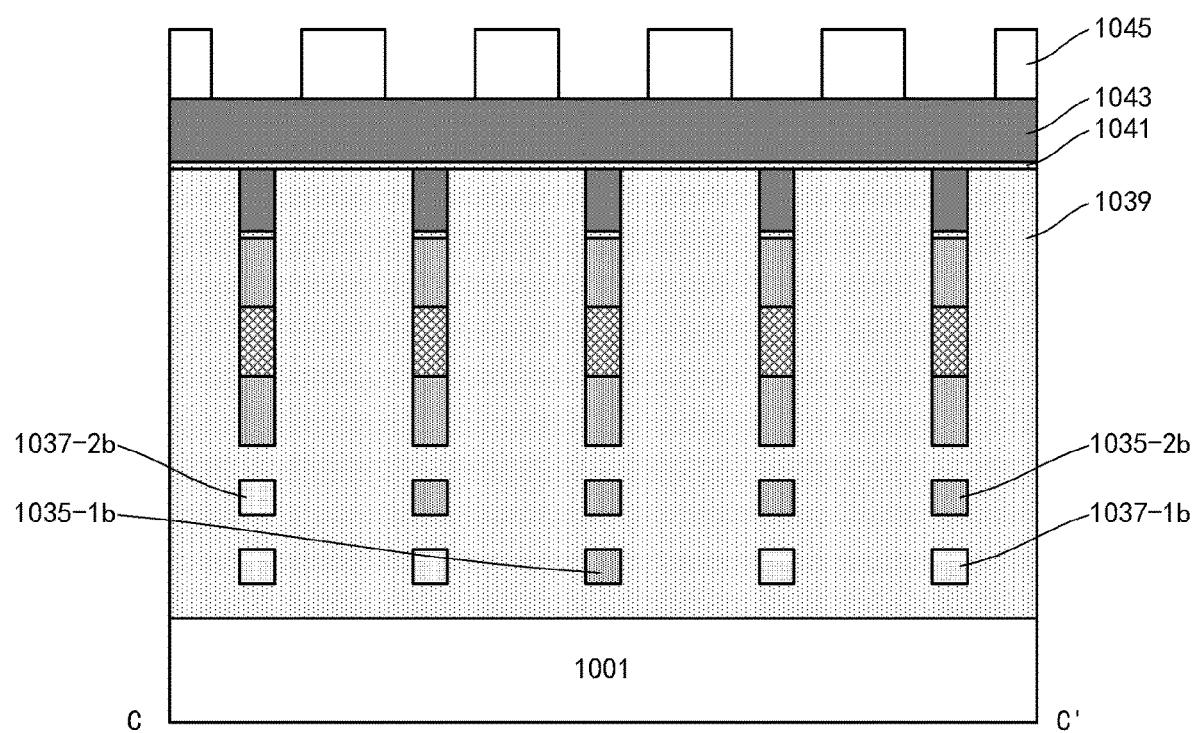

In addition, the previously formed hard mask layer 1025/1027 is used to define the processing channels T1 to the bridging portions, which may be removed here. For example, as shown in FIG. 22(*a*) and FIG. 22(*b*), in the structure shown in FIG. 21(*a*) and FIG. 21(*b*), the second sub-layer 1027 of nitride is selectively etched by, for example, hot phosphoric acid to be removed. Next, a planarization process such as CMP may be performed on the resultant structure, and the CMP may stop at the second sub-layer 1013 of nitride. In this way, the hard mask layer 1025/1027 defining the processing channels T1 is removed, and the hard mask layer 1011/1013 with a grid pattern still exists.

Next, pattern trimming may be performed on the first sacrificial layer. Currently, each node exists in each first sacrifice layer. Some nodes may be removed according to a layout design of each via layer. In order to remove the nodes, processing channels to the nodes are required. The trimming of the first sacrificial layer may be performed in substantially the same manner as the trimming of the second sacrificial layer, except that the locations of the processing channels are different.

For example, openings exposing the nodes may be formed in the dielectric layer 1039. This may be achieved by using an additional hard mask layer. As shown in FIGS. 23(*a*), 23(*b*), 23(*c*) and 23(*d*), another hard mask layer may be formed on a top surface of the dielectric layer 1039 and the top surface of the hard mask layer (1011/1013). Similarly, the hard mask layer may also include a stack including a first sub-layer 1041 made of, for example, oxide with a thickness of about 2 to 10 nm, and a second sub-layer 1043 made of, for example, nitride or a low-k dielectric material with a thickness of about 10 to 150 nm. Regarding the first sub-layer 1041 and the second sub-layer 1043, see also the above description of the first sub-layer 1011 and the second sub-layer 1013.

The hard mask layer may be patterned into a desired pattern, as described above, to expose the nodes. To this end, a photoresist 1045 may be formed on the hard mask layer. The photoresist 1045 is patterned by photolithography (exposure and development) to include a series of openings, which are, for example approximately centered at each node, respectively. Here, in order to ensure that a downward channel may be formed, outer peripheries of the openings may be protruded outward relative to outer peripheries of the nodes in the hard mask layer 1011/1013. In addition, in order to ensure that the nodes desired to be removed in the first sacrificial layer may be completely removed, dimensions of the openings may be larger than dimensions of the nodes of the photoresist 1021 used to define the nodes in the first sacrificial layer as described above in conjunction with FIG. 9(*a*). In this example, the openings are shown as circular, but the disclosed technology is not limited to this, and may also be various shapes suitable for processing, such as ellipse and the like.

Next, processing channels may be formed. For example, as shown in FIGS. 24(*a*), 24(*b*), and 24(*c*), the photoresist 1045 may be used as a mask to selectively etch the second sub-layer 1043 (nitride) such as RIE. For example, RIE may be performed in the direction substantially perpendicular to the surface of the substrate, and may stop at the first sub-layer 1041 (oxide). Then, the first sub-layer 1041 and the dielectric layer 1039 (both oxides here) may be selectively etched such as RIE. For example, RIE may be performed in the direction substantially perpendicular to the surface of the substrate, and may be performed until the uppermost first sacrificial layer 1003a-3 is exposed, thereby forming processing channels T2, as shown in FIG. 24(c). For example, a bottom surface of the processing channel T2 may be located between a top surface and a bottom surface of the second sacrificial layer 1003b-2 under the first sacrificial layer 1003a-3 that needs to be exposed, which on one hand, ensures that the first sacrificial layer 1003a-3 is fully exposed, and on the other hand, avoids exposing the first sacrificial layer 1003a-2 underneath. In order to accurately control an etching amount, ALE may be used. After that, the photoresist 1045 may be removed.

Figure 24C:
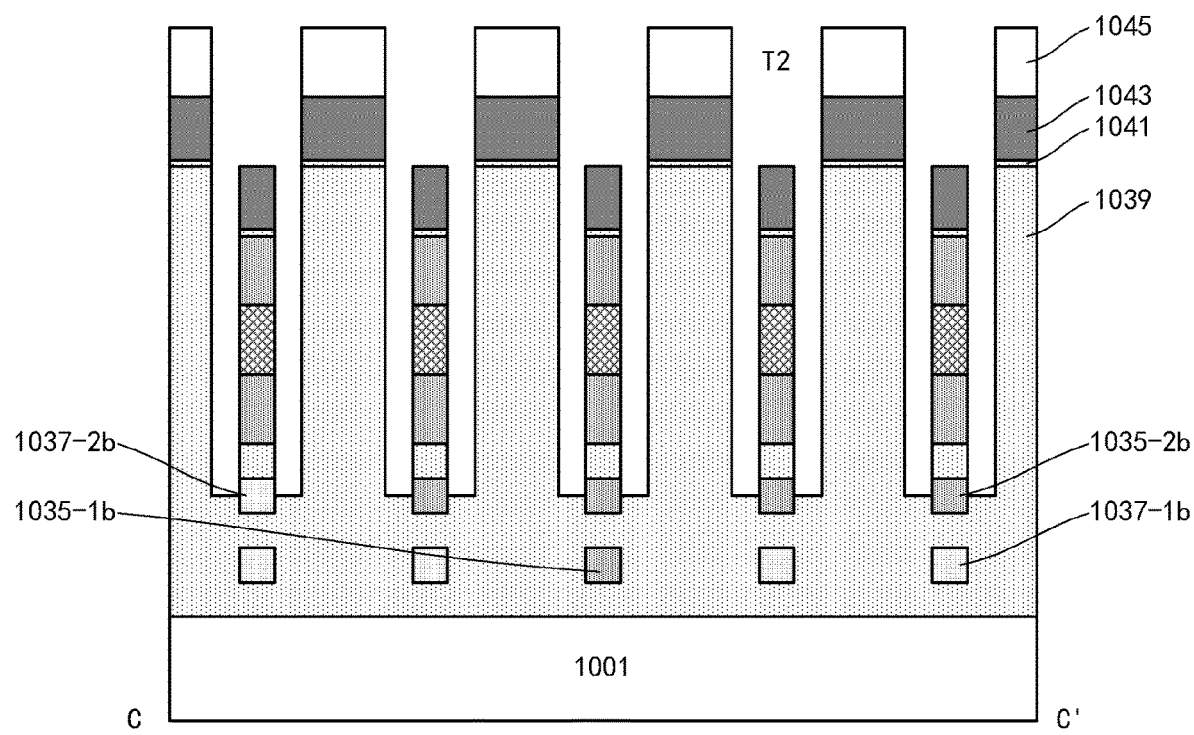
Figure 25A:
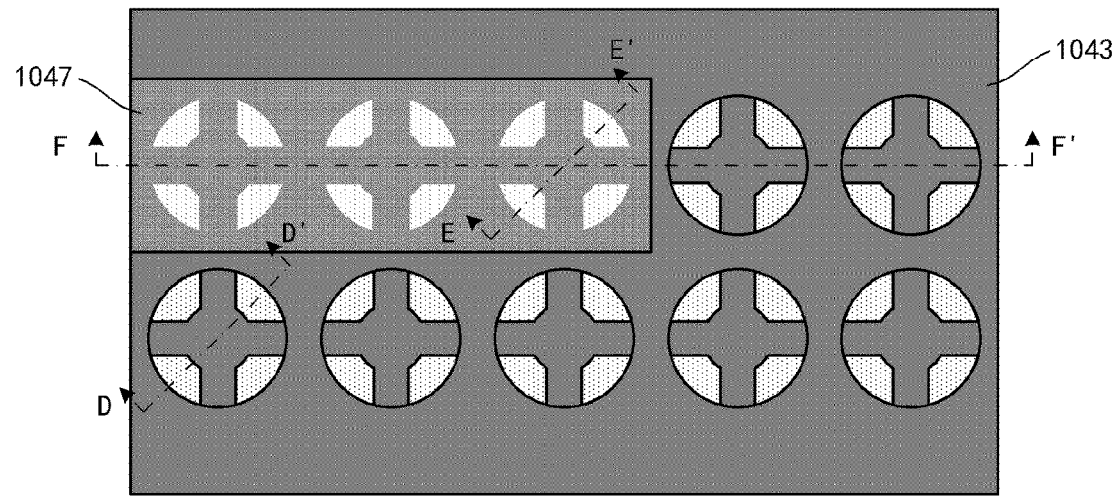
Figure 25B:
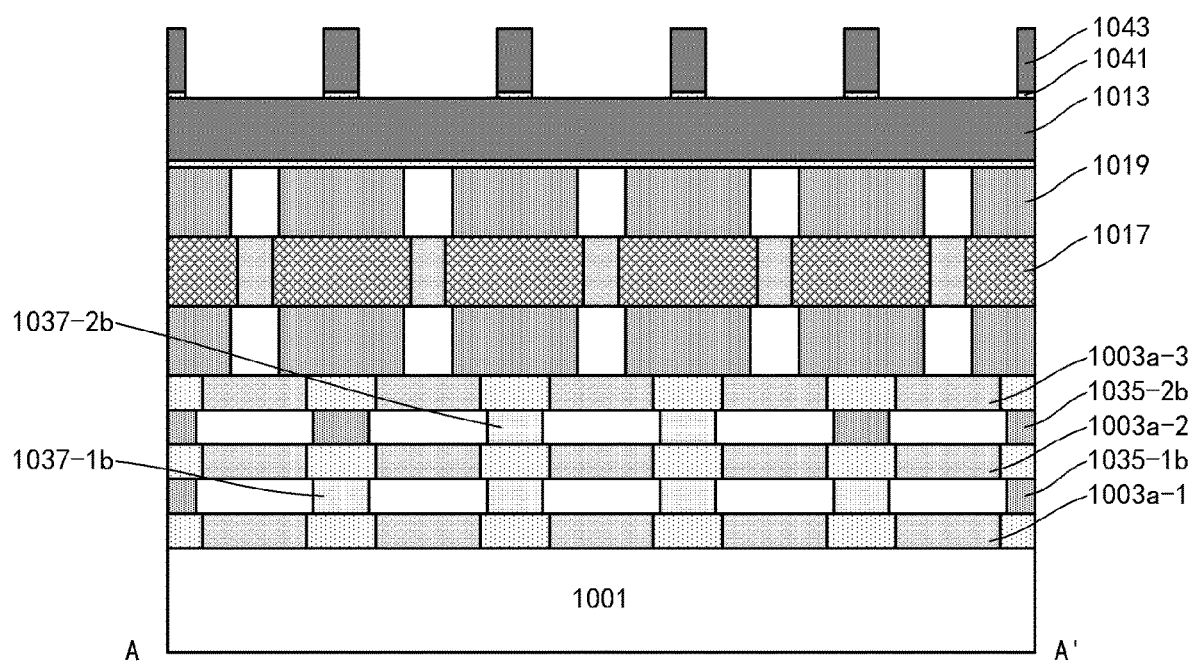
Figure 25C:
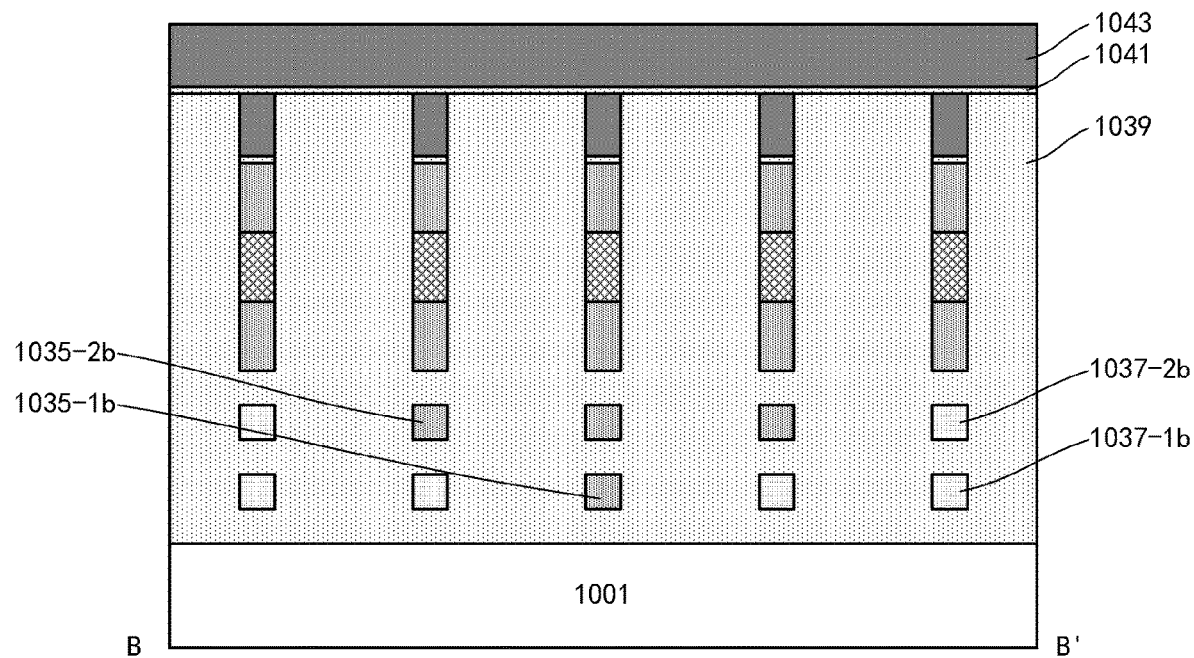
Figure 25D:
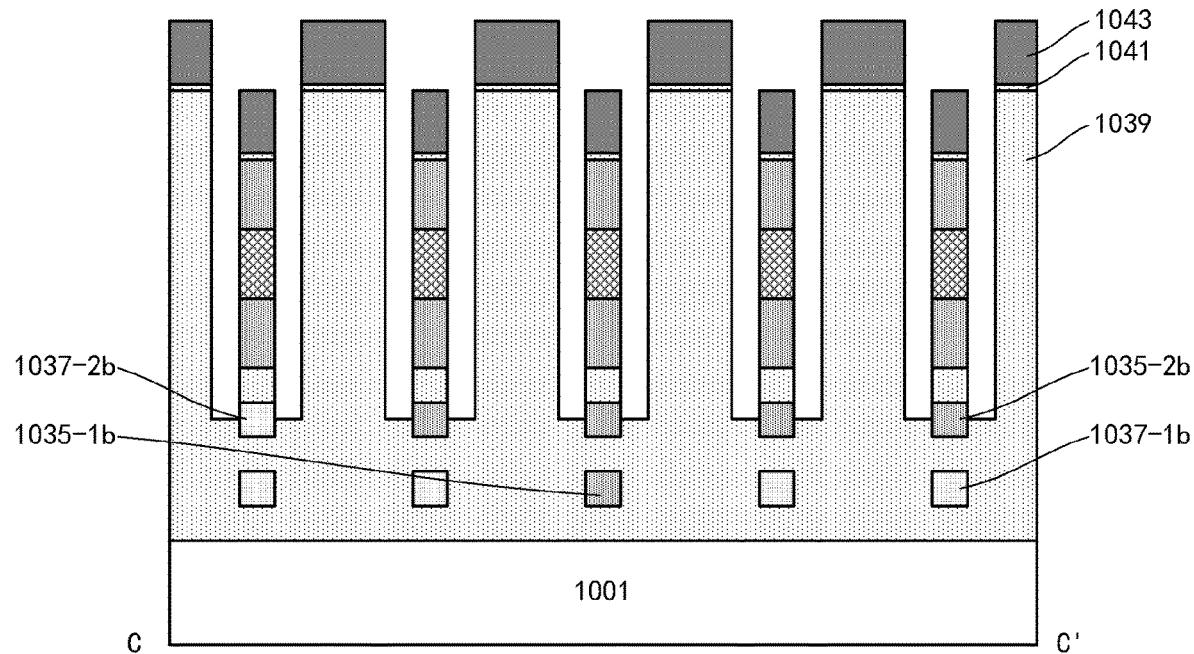

Referring to FIG. 25(a), each processing channel T2 is approximately centered at each node, and each bridging portion is substantially shielded (a part of the bridging portions may be exposed in the processing channels T2, that is why the position holding layers 1033-1b, 1033-2b are replaced above, because the position holding layers 1033-1b and 1033-2b may be exposed from the processing channel T2, especially when the device is miniaturized). As shown in FIG. 24(c), in each processing channel T2, except for the first sacrificial layer 1003a-3, the remaining exposed material layers are all dielectric materials (hard mask layers of oxide and nitride, the position holding layer 1017 of oxynitride, the position holding layer 1019 of SiC, the dielectric layer 1039 of oxide, and the insulating portion 1035-2b of SiC). In addition, in this example, it is shown that the position holding layer 1037-2b is also exposed in the processing channel T2. It should be noted that, in the cross section of FIG. 24(c), the first sacrificial layer 1003a-3 is not seen, because the position of the CC' line is at the bridging portions (see FIG. 23(a)), and the bridging portions in the first sacrificial layer 1003a-3 are substantially removed.

All current nodes are exposed in the corresponding processing channels T2. Among these nodes, some nodes need to be removed (replaced with insulating portions), and other nodes need to be retained. The nodes that need to be removed and the nodes that need to be retained may be processed separately. As described above, in order to avoid mutual interference of processing of the various layers, the nodes that need to be retained may be replaced with a material that have etching selectivity with respect to the first sacrificial layer.

Figure 24A:
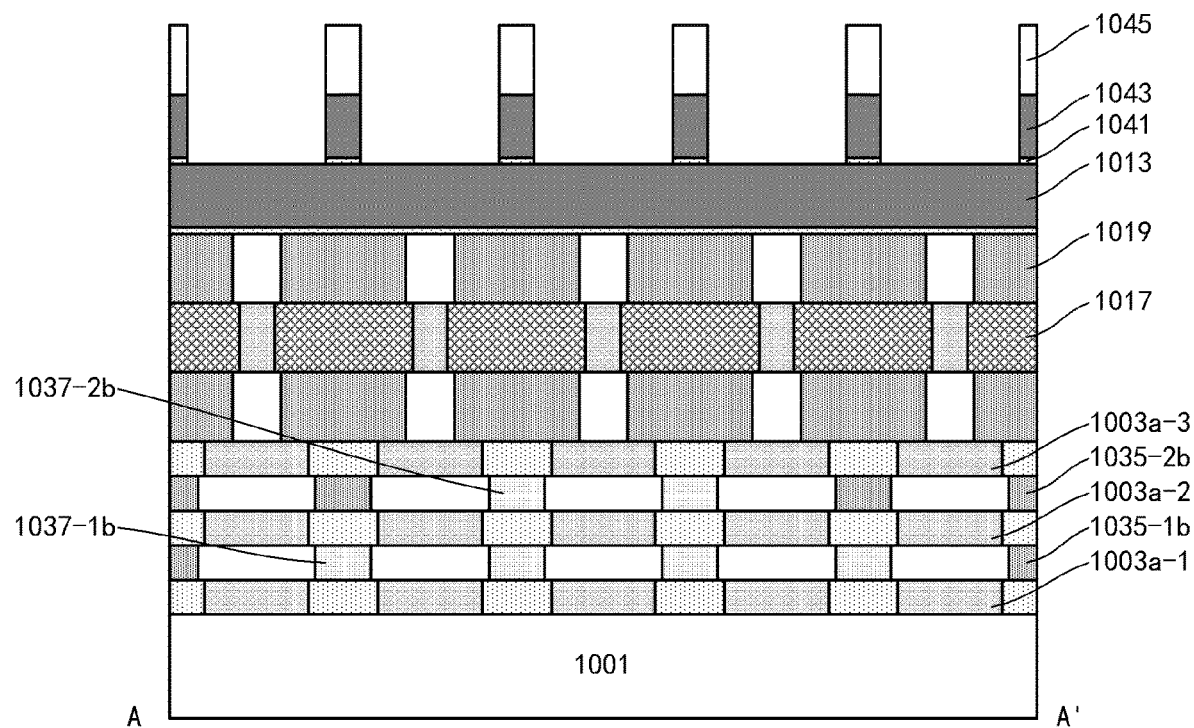
Figure 24B:
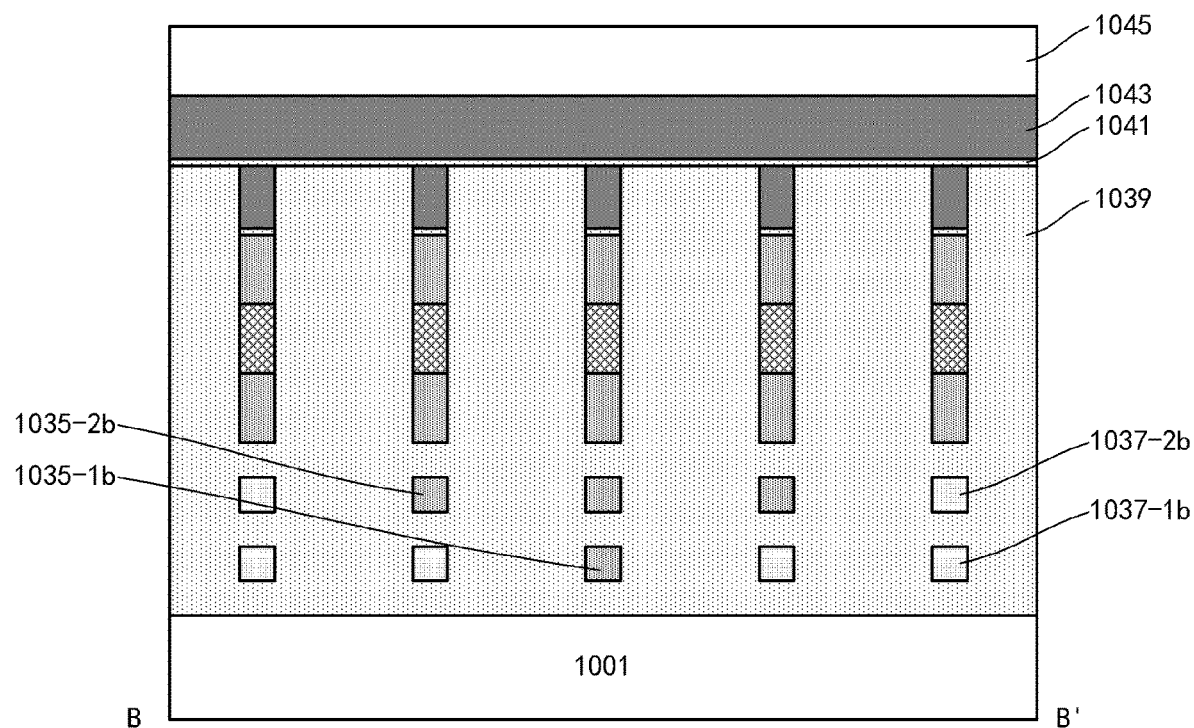

For example, as shown in FIGS. 25(a) to 25(f-4), a photoresist 1047 may be formed on the structure shown in FIGS. 24(a), 24(b), and 24(c) (with the photoresist 1045 removed), and may be patterned by photolithography to expose processing channels T2 where the nodes need to be retained and cover processing channels T2 where the nodes need to be removed. Through the processing channels T2 exposed by the photoresist 1047, the first sacrificial layer 1003a-3 may be replaced with the position holding layer 1037-3a by a method similar to the first etching and the first filling described above. The position holding layer 1037-a may include a material having etching selectivity with respect to the first sacrificial layer, such as Si.

FIGS. 25(f-1) to 25(f-4) show this process in detail. Specifically, FIG. 25(f-1) shows a processing channel T2 exposed by the photoresist 1047. As shown in FIG. 25(f-2), the exposed first sacrificial layer 1003a-3 (SiGe here) may be selectively etched to be removed through the processing channel T2. After that, the photoresist 1047 may be removed. Then, as shown in FIG. 25(f-3), (polycrystalline or amorphous) silicon 1037p may be deposited (which may be doped into n-type or p-type by, for example, in-situ doping, with a doping concentration of about 1E19 to 5E21 cm$^{-3}$) through the processing channel T2, and the deposited silicon 1037p is etched back, such as RIE, to fill the position holding layer 1037-3a at the position where the node of the removed first sacrificial layer 1003a-3 is originally located. Multiple times of depositions and etch-backs may be performed to better fill the position holding layer 1037-3a.

Figure 26:
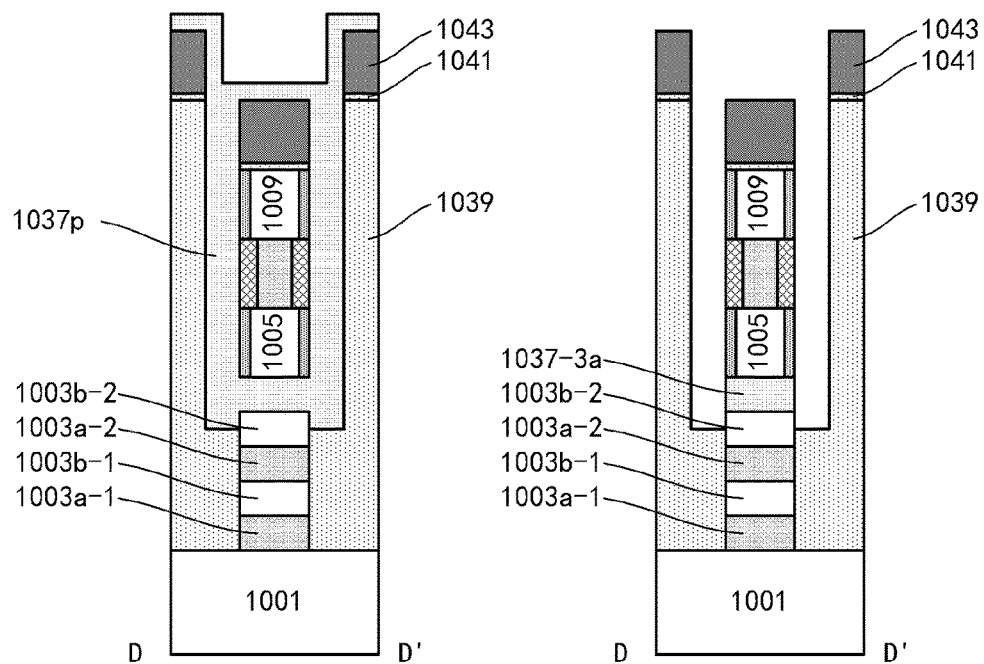
Figure 26:
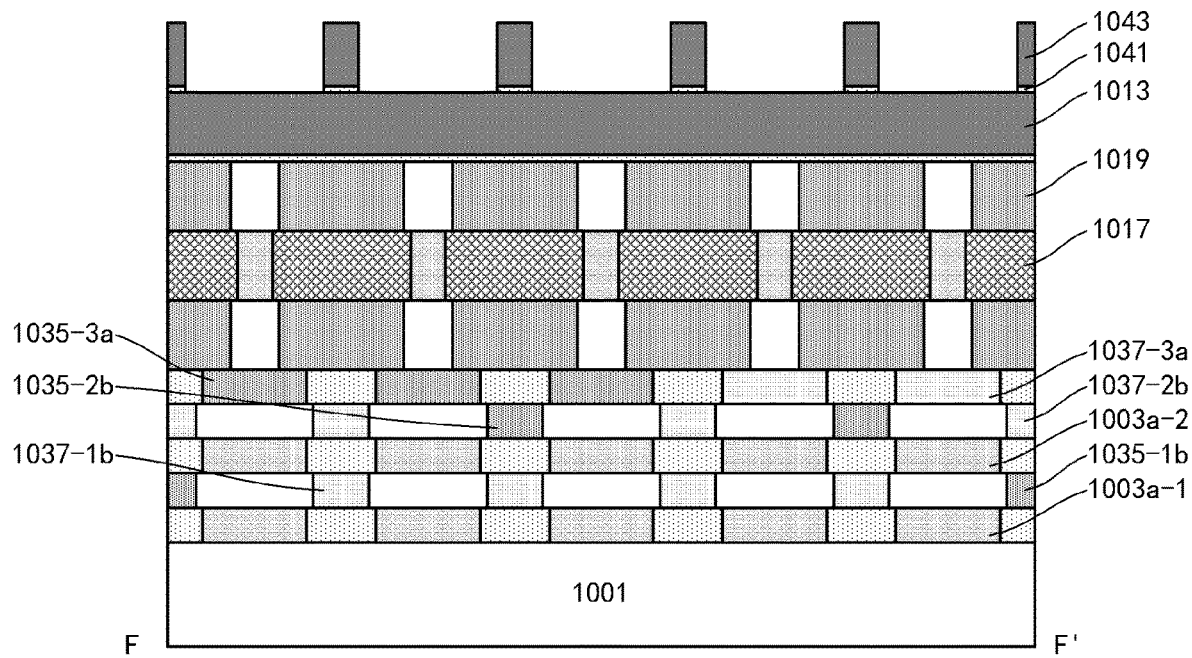

Then, some of the nodes of the first sacrificial layer 1003a-3 are removed. These some of the nodes of the first sacrificial layer 1003a-3 may be replaced with insulating portions by a method similar to the second etching and the second filling described above. For example, as shown in FIG. 26, the first sacrificial layer 1003a-3 (SiGe) may be selectively etched through the processing channels T2. In this way, a part of the first sacrificial layer 1003a-3 in the processing channels T2 originally covered by the photoresist 1047 may be removed. For the above nodes replaced with the position holding layer 1037-3a, although the position holding layer 1037-3a is also exposed in the processing channels T2, due to the etching selectivity, it may be substantially unaffected here. Thus, gaps are formed at some of the nodes of the first sacrificial layer 1003a-3. The insulating portions 1035-3a may be filled in these gaps. The insulating portions 1035-3a may include the same dielectric material such as SiC as the previous insulating portions 1035-1b, 1035-2b. This filling may be achieved by etch-back after deposition as described above.

Therefore, as shown in FIG. 26, through the EFEF process described above, some of the nodes in the first sacrificial layer 1003a-3 are replaced with the insulating portions 1035-3a, while the remaining nodes are retained (in fact, for etching selectivity, the remaining nodes are replaced with the position holding layer 1037-3a), so as to subsequently define via holes.

Next, similar processing may be performed on the lower first sacrificial layer 1003a-2.

For example, the dielectric layer 1039 may be selectively etched such as RIE to deepen the processing channels T2, thereby exposing the first sacrificial layer 1003a-2. For example, the bottom surface of the processing channels T2 may be located between a top surface and a bottom surface of the second sacrificial layer 1003b-1 under the first sacrificial layer 1003a-2 that needs to be exposed. Then, the above-mentioned EFEF process may be performed to achieve the required via hole layout in the first sacrificial layer 1003a-2 through the deepened processing channels T2.

Figure 27A:
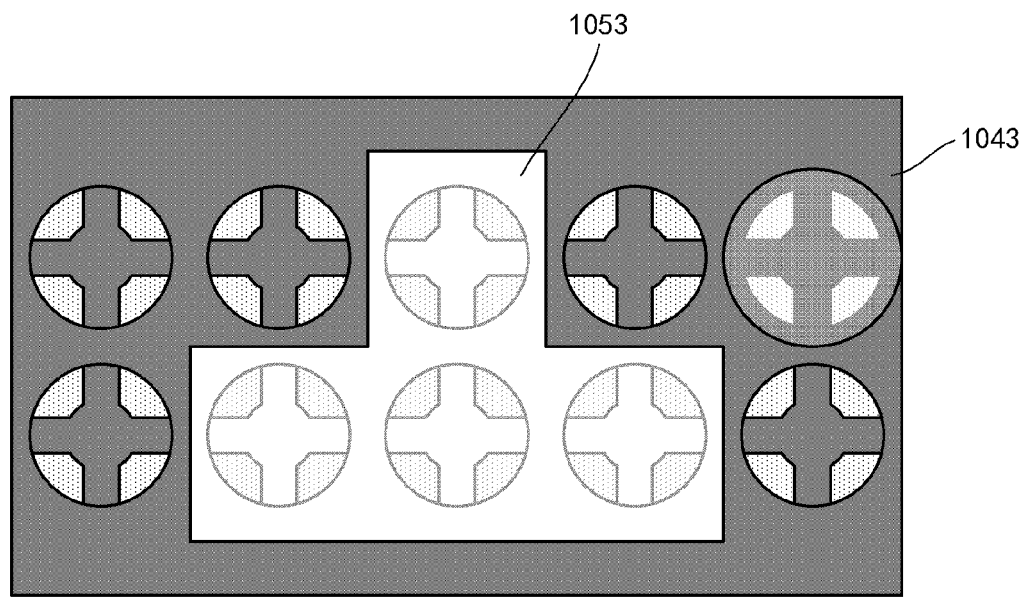
Figures 27B, 27C:
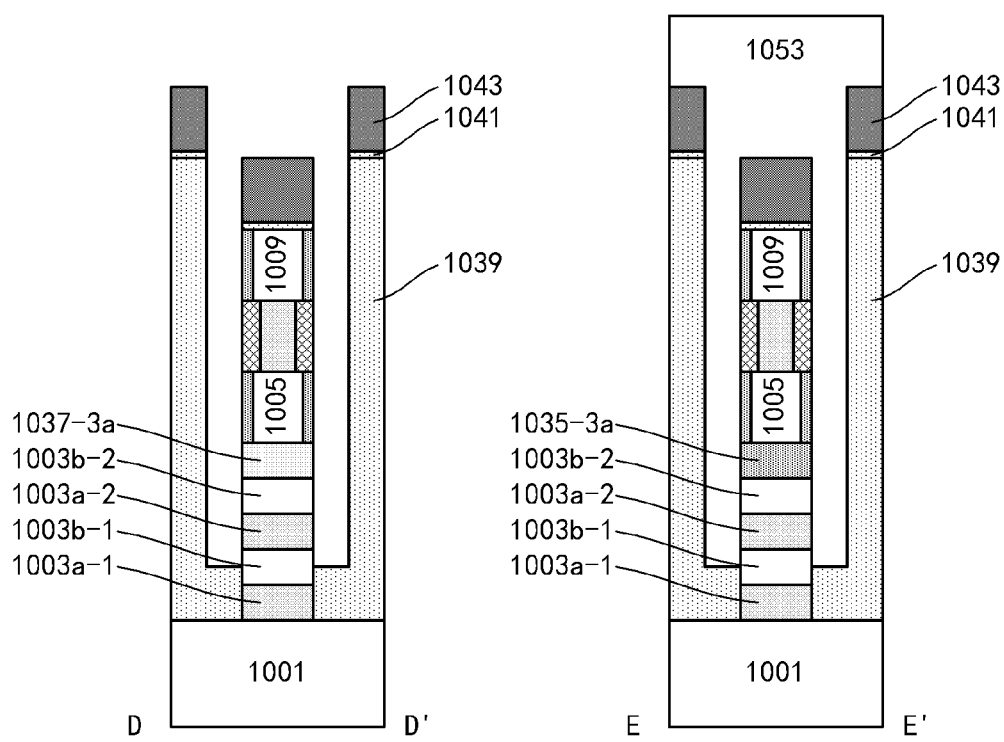

Specifically, as shown in FIGS. 27(a), 27(b), and 27(c), a photoresist 1053 may be formed on the structure of FIG. 26 (the processing channels T2 are deepened as described above), and may be patterned to expose the processing channels T2 where the nodes need to be retained and cover the processing channels T2 where the nodes need to be removed. A pattern of the photoresist 1053 may be different from the pattern of the photoresist 1047 described above.

Figures 28A, 28B:
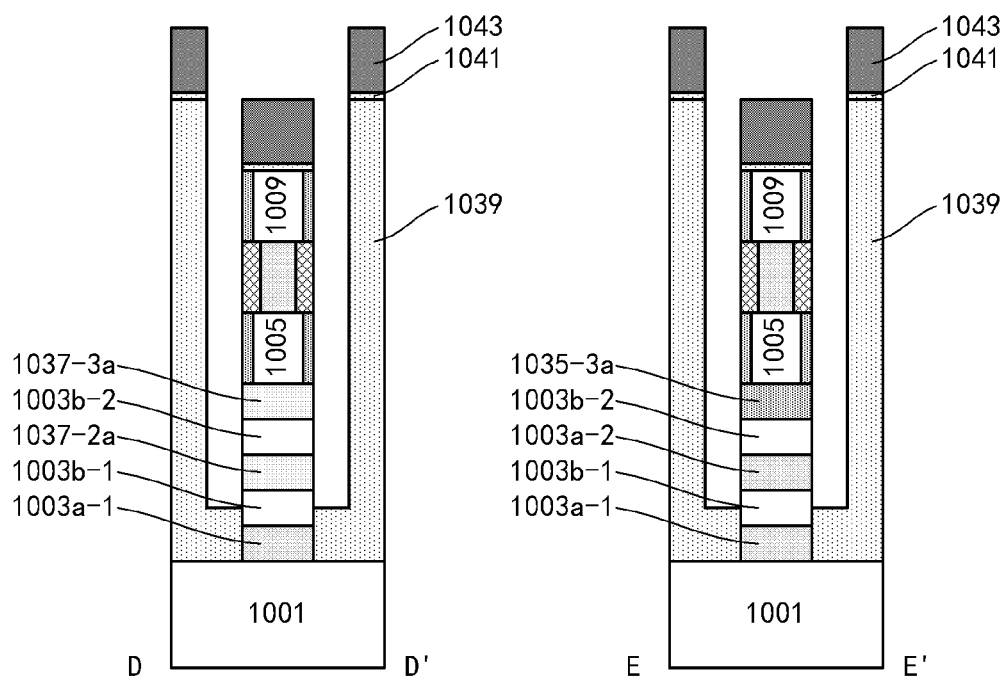
Figures 29A, 29B:
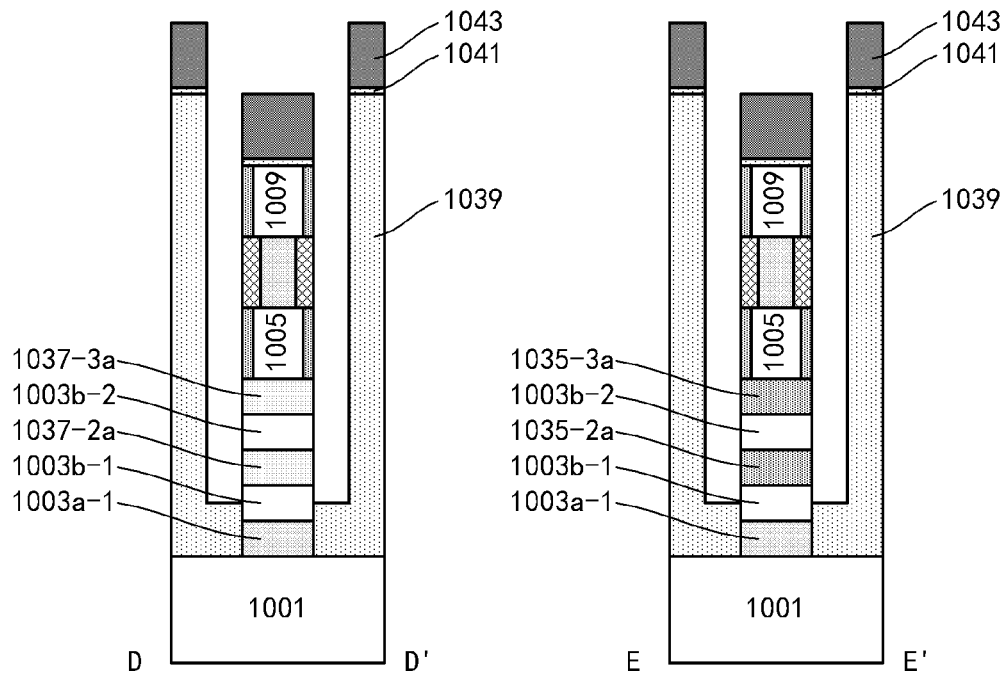

As shown in FIG. 28(a) and FIG. 28(b), through the processing channels T2 exposed by the photoresist, the exposed nodes of the first sacrificial layer 1003a-2 may be replaced with the position holding layer 1037-2a through etching and filling processing. Regarding the position holding layer 1037-2a, reference may be made to the above description of the position holding layer 1037-3a. After that, the photoresist 1053 may be removed. Then, as shown in FIGS. 29(a) and 29(b), through the processing channels T2, the nodes of the first sacrificial layer 1003a-2 in the processing channels T2 originally covered by the photoresist 1053 may be replaced with insulating portions 1035-2a through etching and filling processing. Regarding the insulating portions 1035-2a, reference may be made to the above description of the insulating portions 1035-3a.

Figure 30:
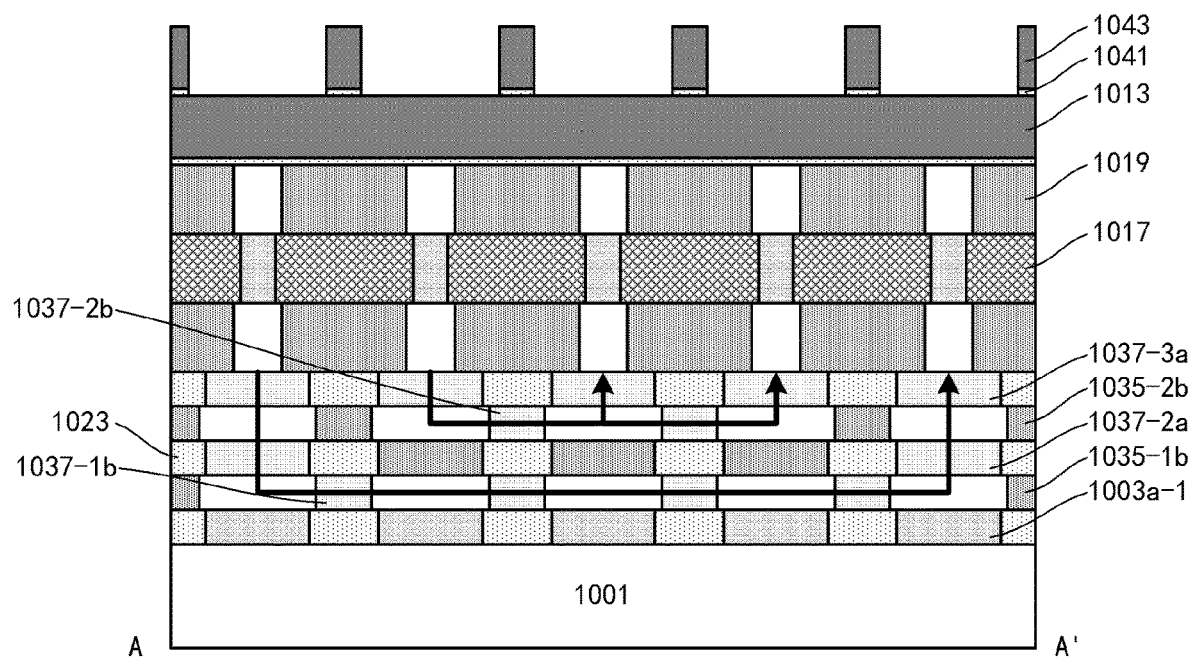

FIG. 30 shows a structure obtained by performing EFEF process on each layer (in fact, in this example, since the lowermost first sacrificial layer 1003a-1 is finally used to define an isolation layer, there is no need to further trim a pattern of the first sacrificial layer 1003a-1) in the first stack as described above. As shown by the arrows in the drawing, in the first stack, different interconnection paths are defined.

Figure 31A:
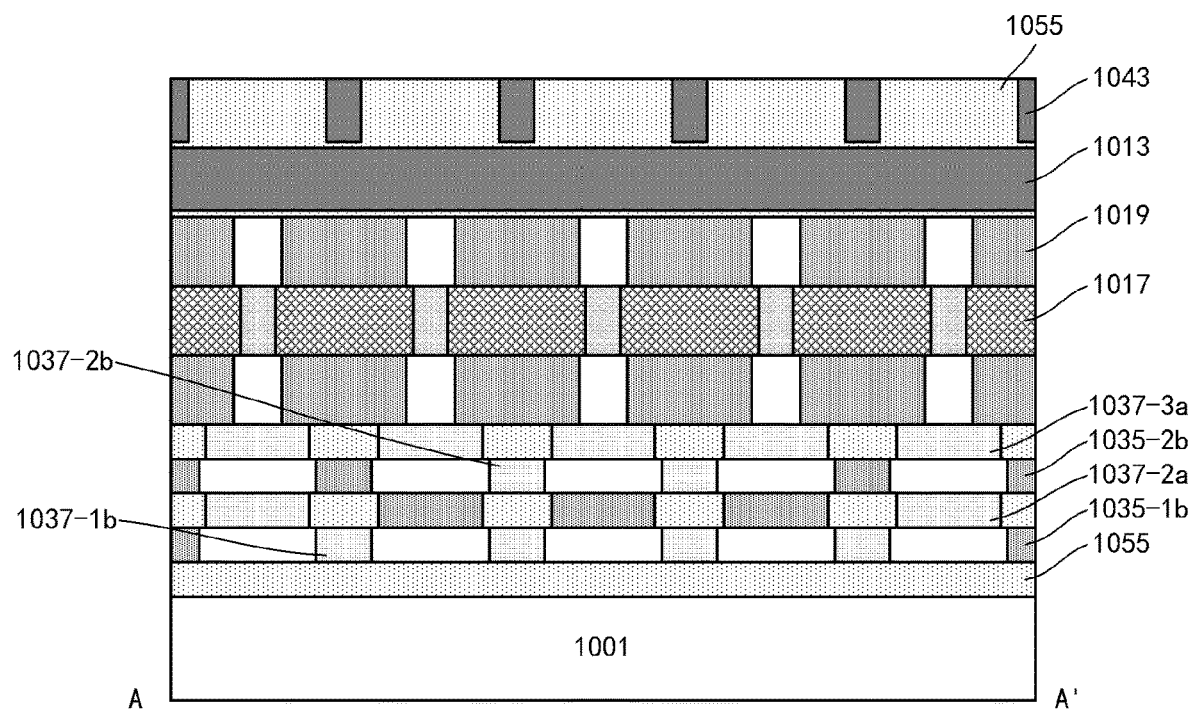

Next, as shown in FIG. 31(a), the lowermost first sacrificial layer 1003a-1 may be replaced with an insulating material to achieve isolation between the interconnection structure and the substrate. For example, as shown in FIG. 31(b-1), the processing channels T2 may be further deepened to expose the first sacrificial layer 1003a-1. For example, the etch back to the dielectric layer 1039 may be stopped at the surface of the substrate 1001, so that bottom surfaces of the processing channels T2 may be defined by the top surface of the substrate 1001. Then, the exposed first sacrificial layer 1003a-1 is selectively etched to be removed. Next, as shown in FIG. 31(b-2), a dielectric material such as an oxide may be filled in gaps of the resultant structure to achieve electrical isolation. An amount deposited is sufficient to fill the gaps in the structure. Then, the deposited oxide may be planarized, such as CMP, and the CMP may be stopped at the second sub-layer 1043 of nitride. Here, all oxides in the structure are collectively shown as 1055.

Figure 32A:
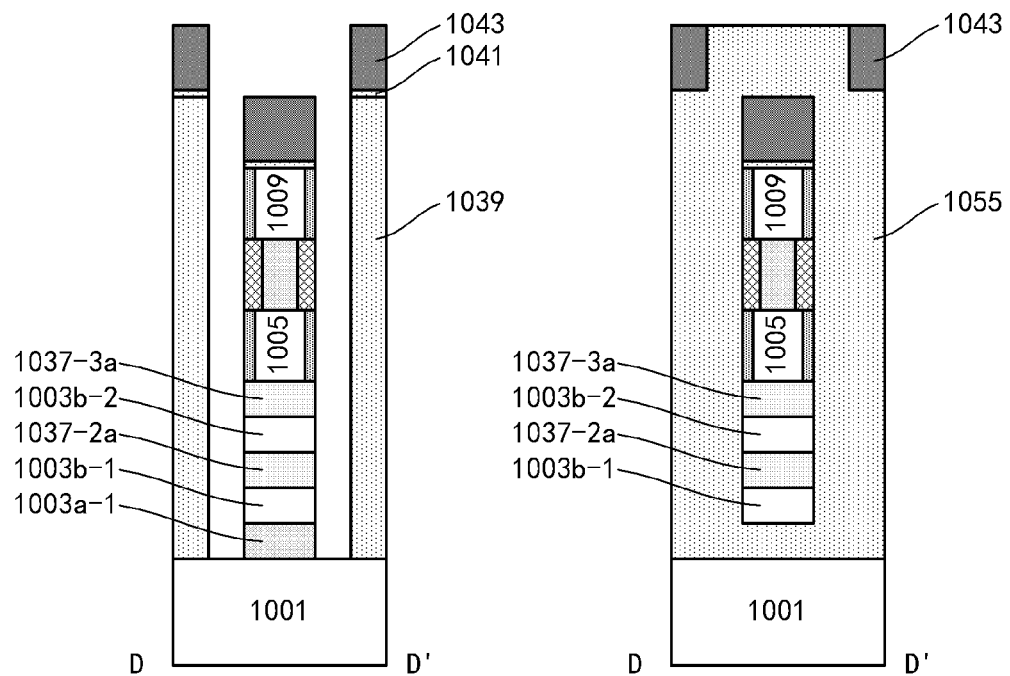
Figure 32A:
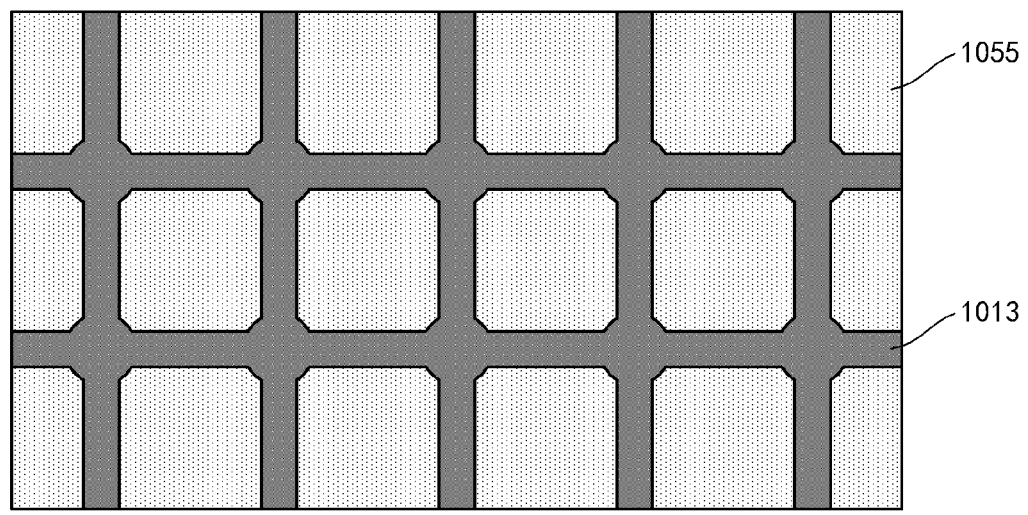
Figure 32B:
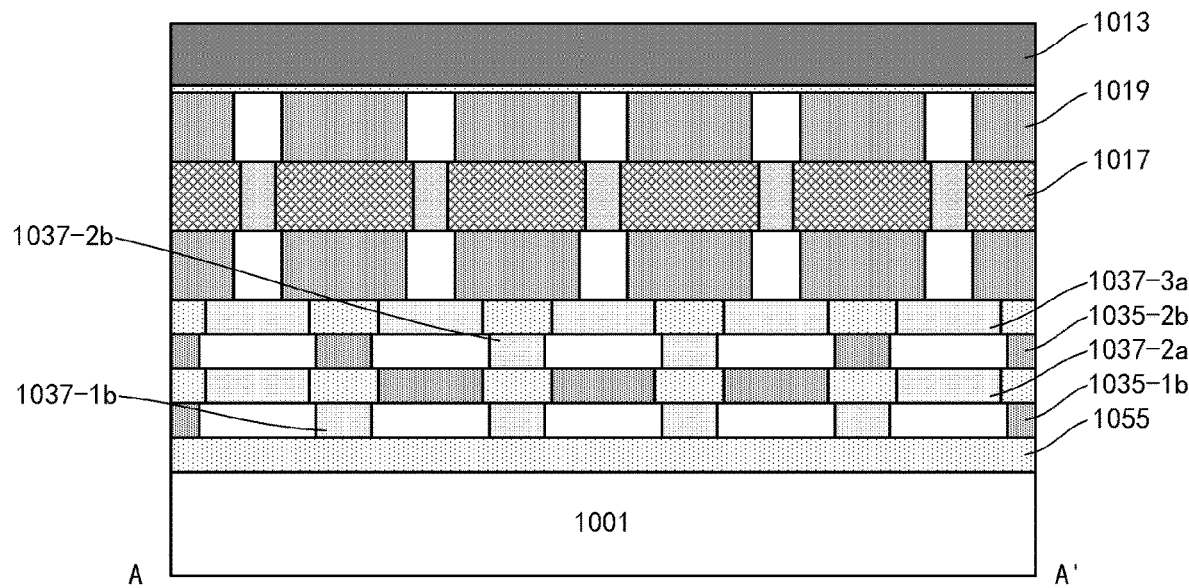

In addition, the previously formed hard mask layer 1041/1043 is used to define the processing channels T2, which may be removed here. For example, the second sub-layer 1043 of nitride may be selectively etched by hot phosphoric acid to be removed. Next, a planarization processing such as CMP may be performed on the resultant structure, and the CMP may be stopped at the second sub-layer 1013 of nitride. In this way, the hard mask layer 1041/1043 defining the processing channels T2 is removed, and the hard mask layer 1011/1013 with a grid pattern still exists, as shown in FIGS. 32(a) and 32(b).

In the above example, the second sacrificial layer is trimmed layer by layer, and then the first sacrificial layer is trimmed layer by layer. However, the disclosed technology is not limited to this. For example, the first sacrificial layer may be trimmed layer by layer, and then the second sacrificial layer may be trimmed layer by layer.

Then, a vertical device may be manufactured based on each active region in the second stack.

Figure 33A:
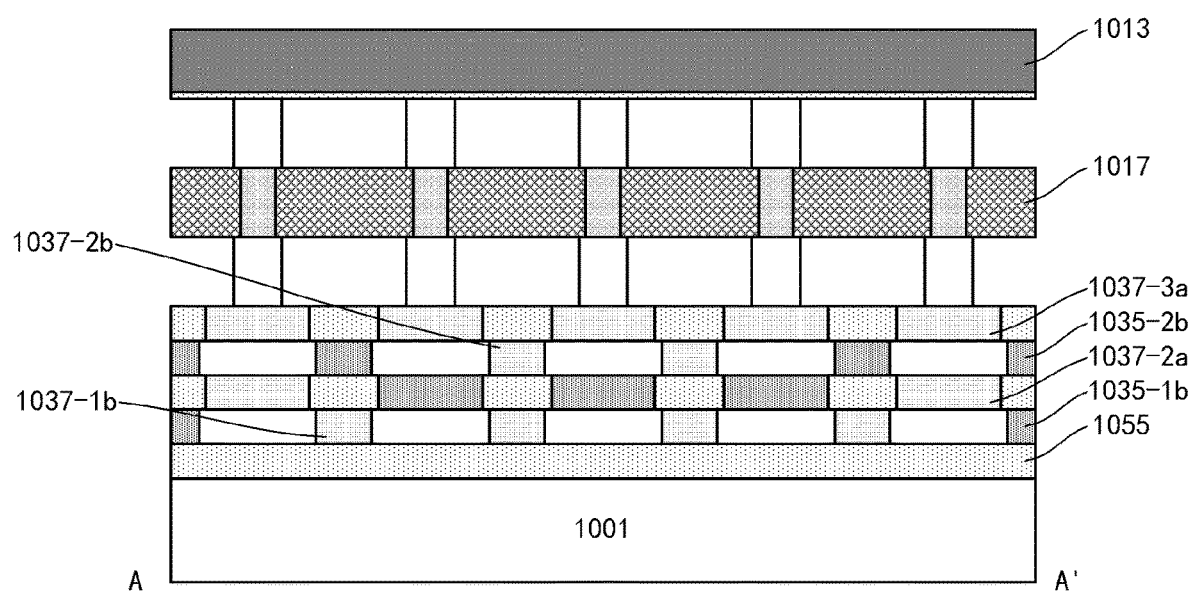

To this end, the dielectric layer 1055 may be etched back to expose the second stack. For example, as shown in FIG. 33(b-1), the dielectric layer 1055 may be etched back such as RIE. RIE may be performed in the direction substantially perpendicular to the surface of the substrate, and may be performed until the second stack is exposed. For example, a top surface of the dielectric layer 1055 after etch back may be located between a top surface and a bottom surface of the uppermost layer in the first stack. In order to accurately control the amount of etch-back, ALE may be used. Due to the presence of the hard mask layer 1011/1013, the exposed second stack may exhibit a grid pattern. Then, as shown in FIG. 33(a) and FIG. 33(b-2), the position holding layer 1019 may be selectively etched to be removed, thereby exposing the first source/drain layer 1005 and the second source/drain layer 1009.

The exposed first source/drain layer 1005 and second source/drain layer 1009 may be doped to form source/drain regions therein. According to the embodiments of the disclosed technology, the doping may be performed by a solid dopant source. However, the disclosed technology is not limited to this. For example, the first source/drain layer 1005 and the second source/drain layer 1009 may be doped in situ when they are grown, or the first source/drain layer 1005 and the second source/drain layer 1009 may be doped by means such as ion implantation.

Figure 34A:
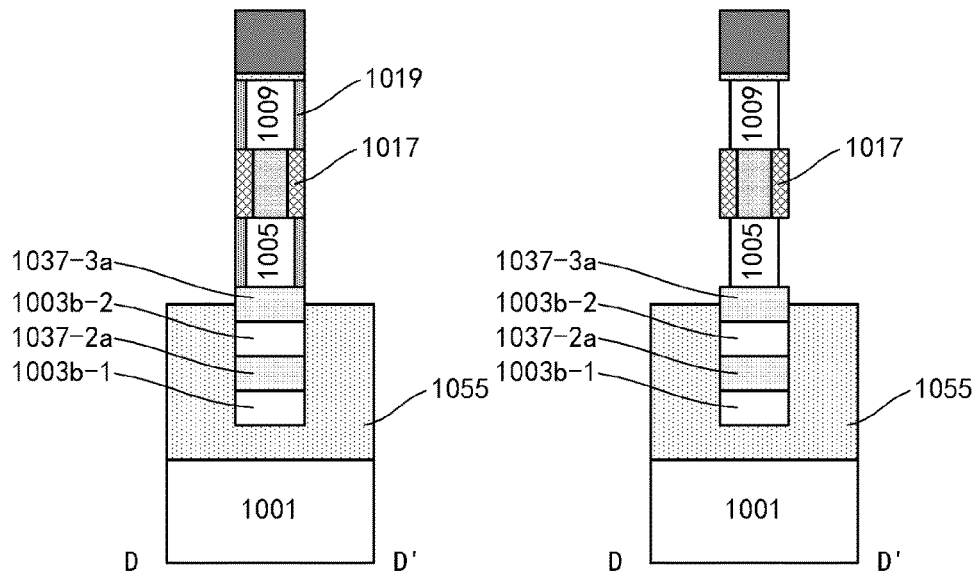
Figure 34A:
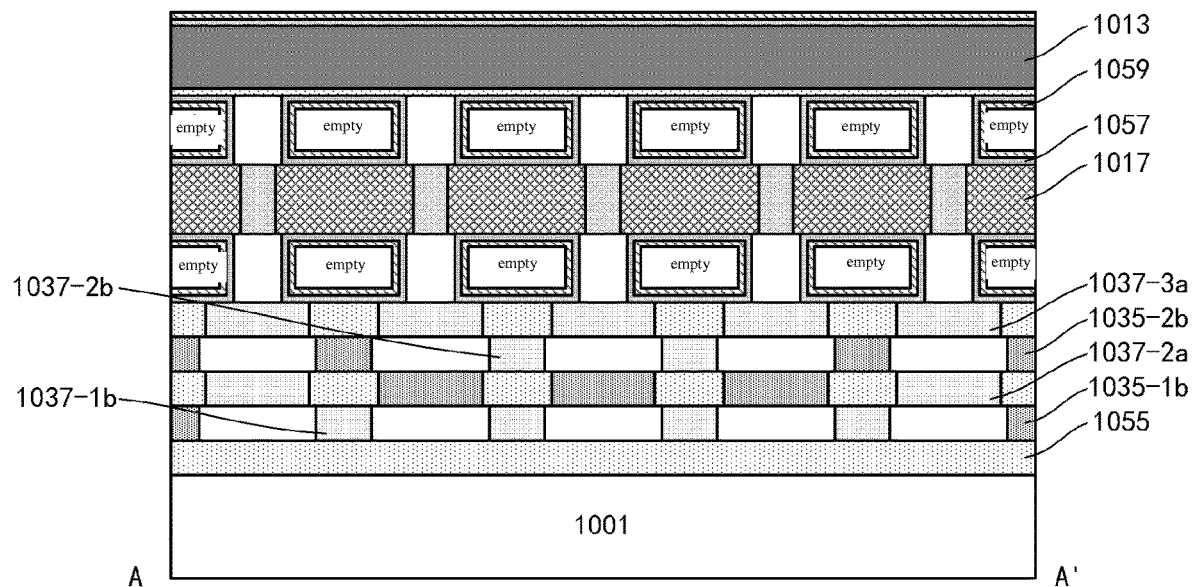
Figure 34B:
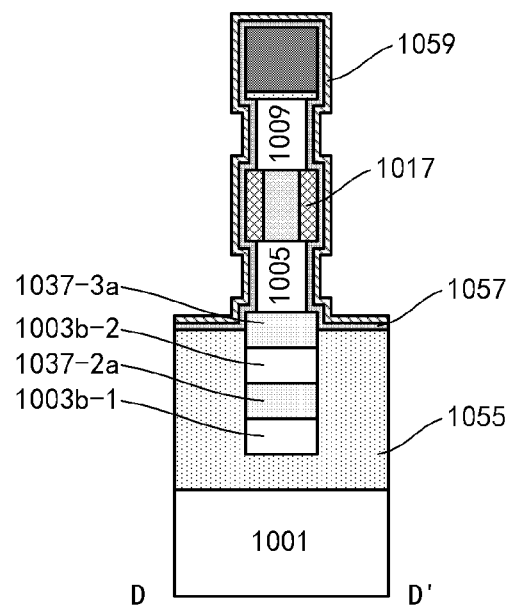

As shown in FIG. 34(a) and FIG. 34(b), a solid dopant source layer 1057 may be formed on surfaces of the first source/drain layer 1005 and the second source/drain layer 1009. For example, in order to form an n-type device, the solid dopant source layer 1057 may include an oxide film containing an n-type dopant with a thickness of about 0.5 to 5 nm. The n-type dopant may include P or As with a content of about 0.01 to 3%. The solid dopant source layer 1057 may be formed on the structure shown in FIGS. 33(a) and 33(b-2) in a substantially conformal manner by deposition such as CVD or atomic layer deposition (ALD) to sufficiently cover the surfaces of the first source/drain layer 1005 and the second source/drain layer 1009. To avoid cross contamination, a diffusion barrier layer 1059 may be formed on the solid dopant source layer 1057. For example, the diffusion barrier layer 1059 may include SiC with a thickness of about 1 to 5 nm. The diffusion barrier layer 1059 may be formed on the solid dopant source layer 1057 in a substantially conformal manner by deposition such as CVD or ALD.

The solid dopant source layer 1057 for the n-type device is formed above. In a case that a p-type device is also formed on the substrate, a solid dopant source layer for the p-type device may be additionally formed.

Figure 35A:
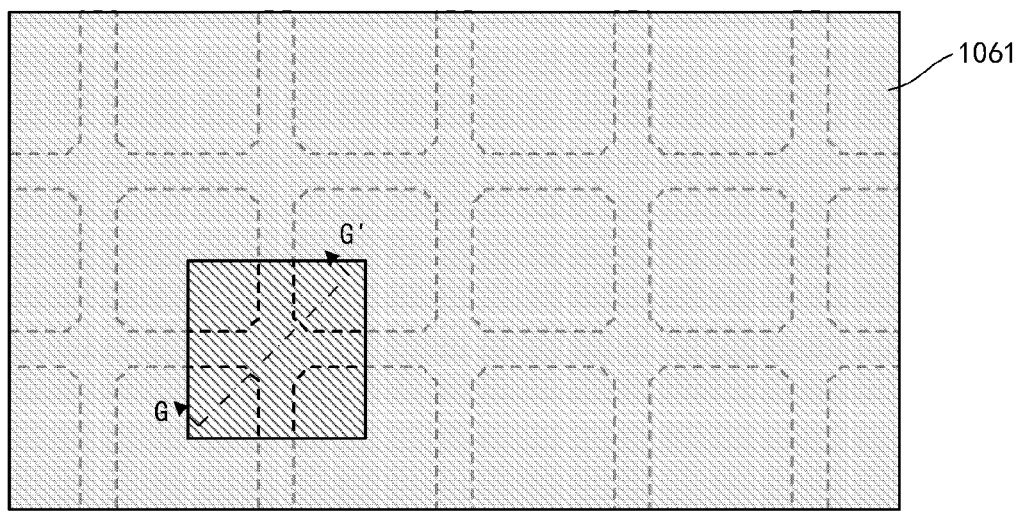
Figure 35B:
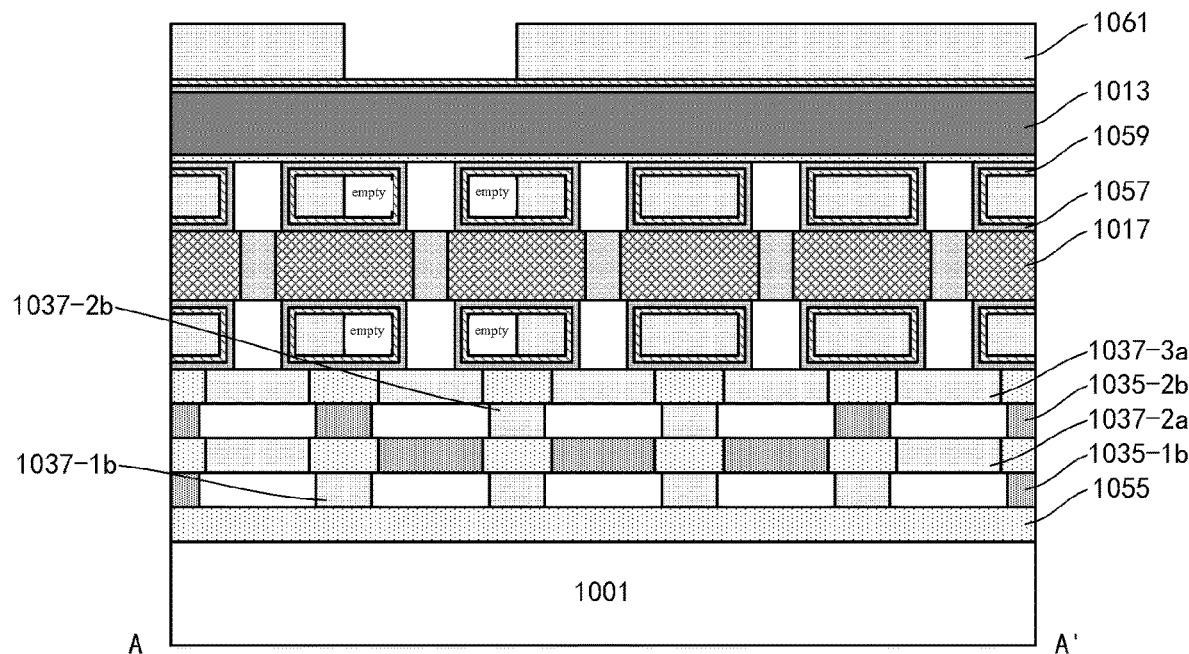

For example, as shown in FIG. 35(a) and FIG. 35(b), a photoresist 1061 may be formed on the structure shown in FIG. 34(a) and FIG. 34(b). Through photolithography, the photoresist 1061 may shield an area where an n-type device is to be formed and therefore shield the n-type solid dopant source layer 1057 in the area, and expose an area where a p-type device is to be formed and therefore expose the p-type solid dopant source layer 1057 in the area.

Figure 36:
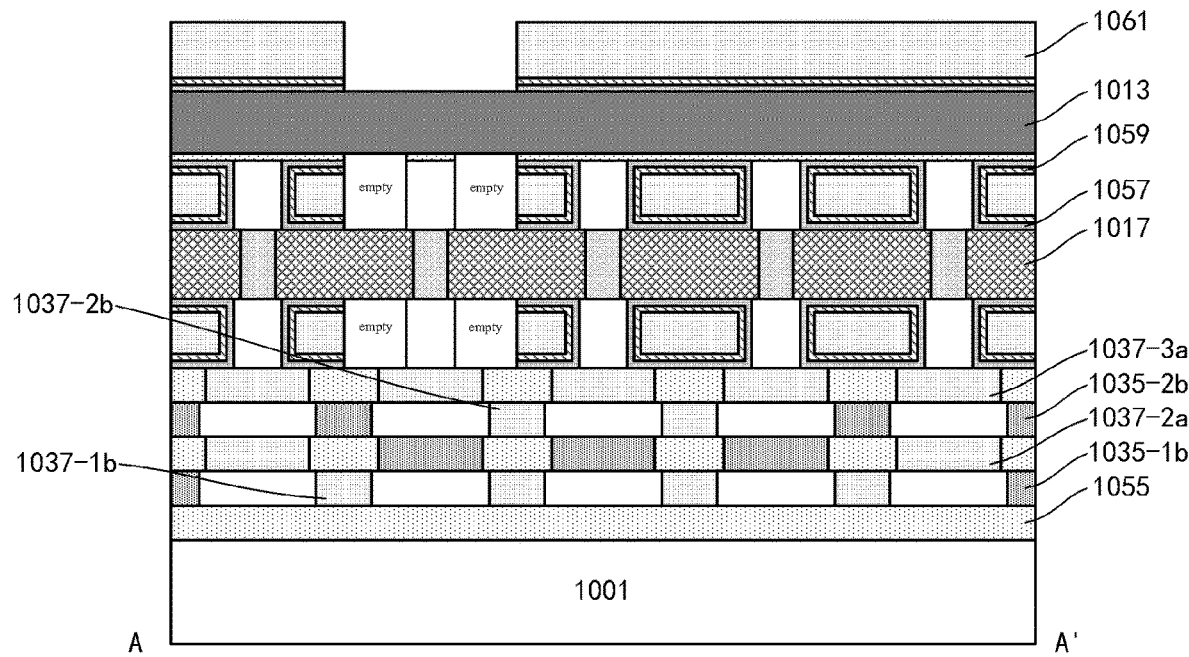

Then, as shown in FIG. 36, the exposed diffusion barrier layer 1059 and the n-type solid dopant source layer 1057 may be sequentially etched by selective etching, for example, gas phase HF, to be removed. During the etching process, a exposed part of the first sub-layer 1011 of the oxide in the hard mask layer may also be removed. After that, the photoresist 1061 may be removed.

Figure 37:
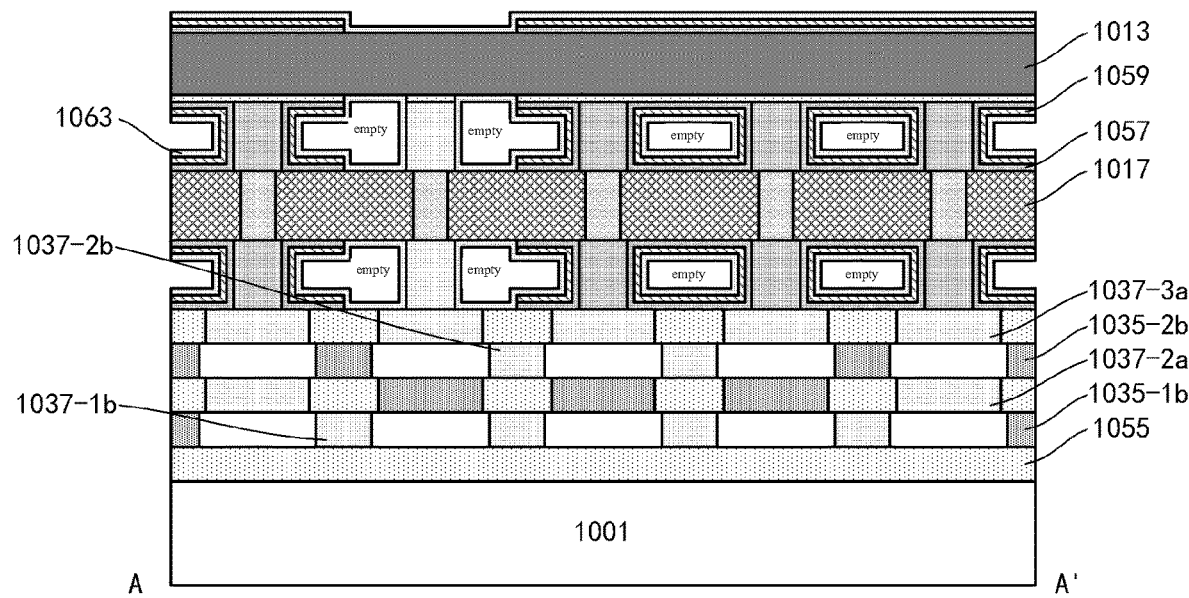

Next, as shown in FIG. 37, a solid dopant source layer 1063 for a p-type device may be formed. For example, the p-type solid dopant source layer 1063 may include an oxide film containing a p-type dopant with a thickness of about 0.5 nm to 5 nm. The p-type dopant may include B with a content of about 0.01% to 3%. The solid dopant source layer 1063 may be formed in a substantially conformal manner by deposition such as CVD or ALD.

Although it is described here that the n-type solid dopant source layer 1057 is formed first and then the p-type solid dopant source layer 1063 is formed, the disclosed technology is not limited to this, and a formation order of the n-type solid dopant source layer 1057 and the p-type solid dopant source layer 1063 may be exchanged.

After that, the dopant in the dopant source layer may be driven into the corresponding first source/drain layer 1005 and second source/drain layer 1009 by annealing, to form source/drain regions therein. In the drawings, the n-type doping and the p-type doping are respectively shown in different gray scales. According to the embodiments, a concentration of the n-type doping may be about 1E18-1E21 $cm^{-3}$, and a concentration of the p-type doping may be about 1E18-1E21 $cm^{-3}$. After that, each solid dopant source layer and diffusion barrier layer may be removed by selective etching such as gas phase HF.

Figure 38A:
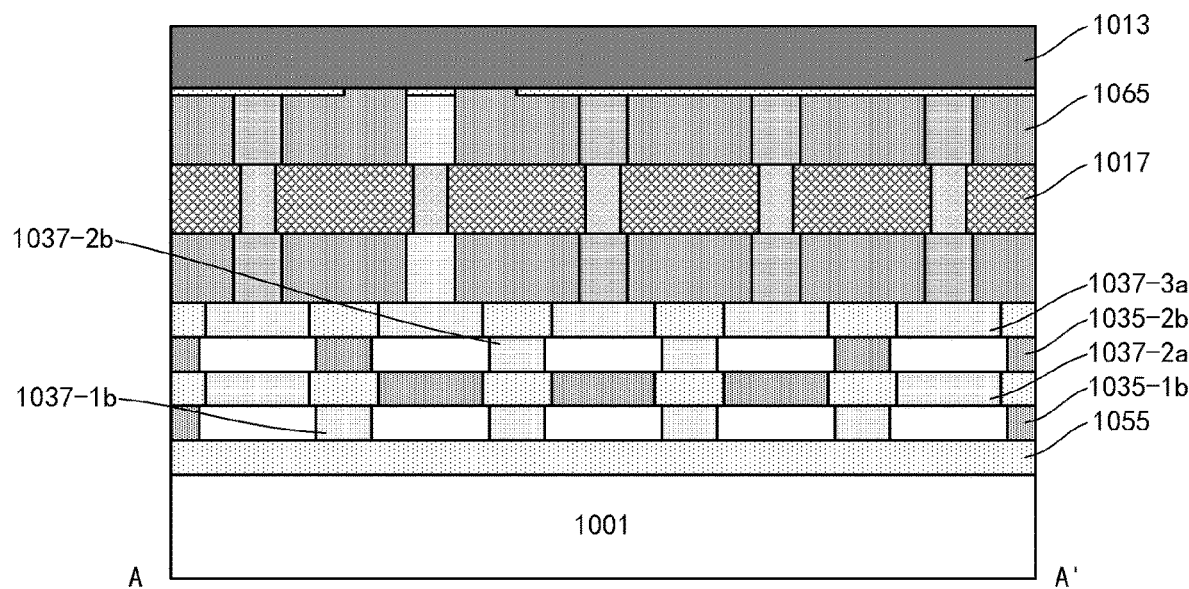
Figure 38B:
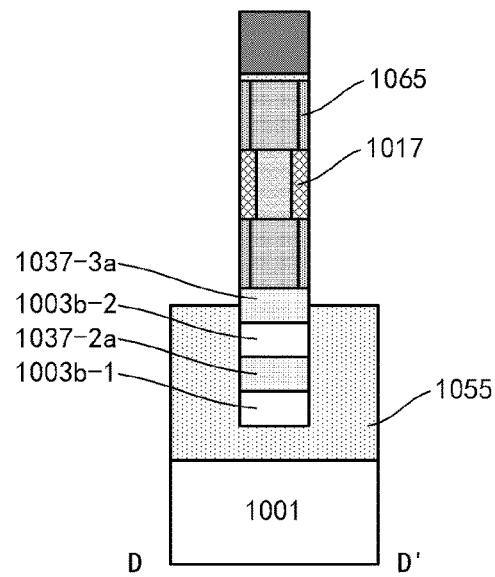

Subsequently, a gate electrode may be formed around an outer periphery of the channel layer to complete the manufacture of a device. In order to form a gate electrode that may be self-aligned to the channel layer, the original position holding layer around the source/drain layer may be restored. For example, as shown in FIG. 38(a) and FIG. 38(b), a position holding layer 1065 may be formed in gaps of the second stack under the hard mask layer. Regarding the position holding layer 1065, reference may be made to the description of the position holding layer 1019 above.

In addition, in order to reduce a contact resistance, a silicide layer may be formed on the surfaces of the first source/drain layer 1005 and the second source/drain layer 1009. For example, before forming the position holding layer 1065, a metal such as NiPt, Co, or Ti with a thickness of about 0.5 nm to 5 nm may be deposited in a substantially conformal manner, and annealed to make the deposited metal react with the first source/drain layer 1005 and the second source/drain layer 1009 (Si) to form a silicide. After that, the metal that is unreacted may be removed.

Subsequently, a gate stack may be formed. For an n-type device and a p-type device, different gate stacks may be formed (for example, with different equivalent work functions).

Figure 39A:
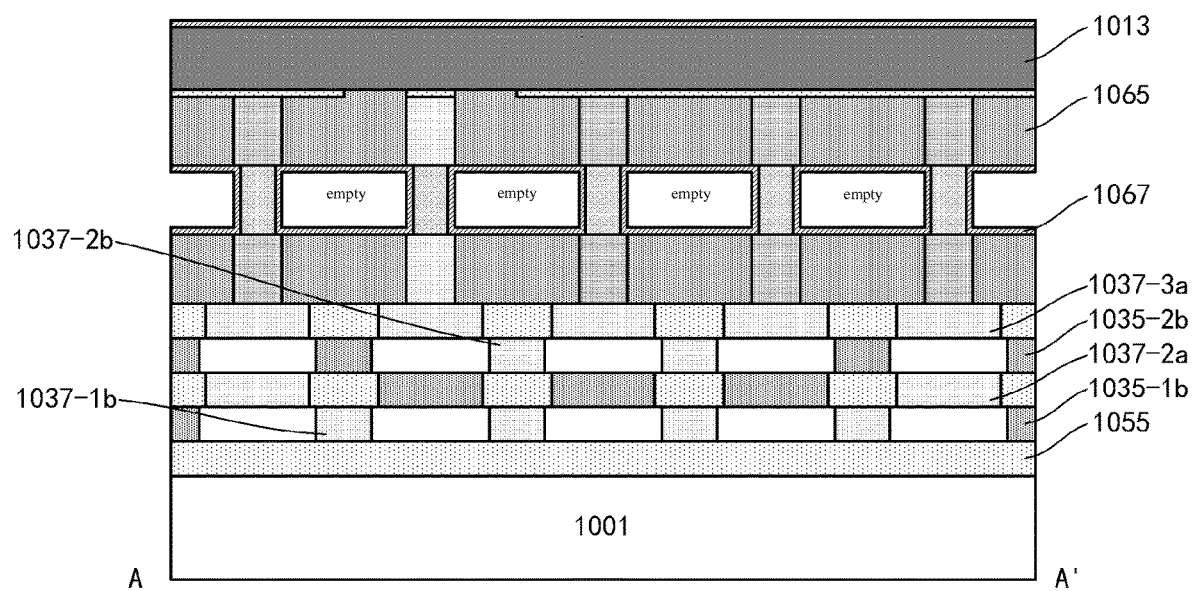
Figure 39B:
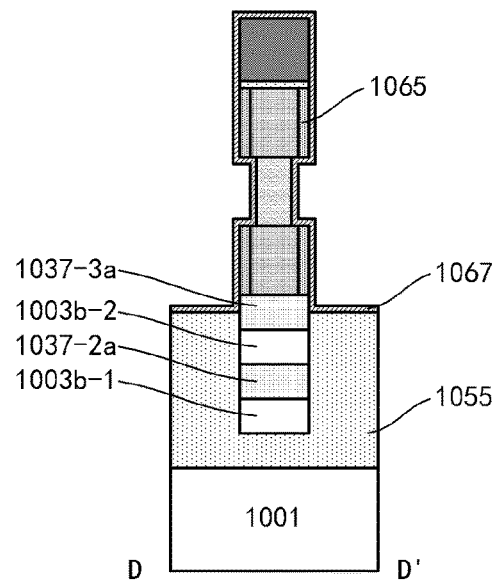

For this reason, as shown in FIG. 39(a) and FIG. 39(b), the position holding layer 1017 may be removed by selective etching. Thus, the surface of the channel layer 1007 is exposed. A gate dielectric layer 1067 may be formed around the surface of the channel layer 1007 by deposition. The gate dielectric layer 1067 may be formed on the structure shown in FIG. 38(a) and FIG. 38(b) in a substantially conformal manner, with a thickness of, for example, about 1 nm to 5 nm. For example, the gate dielectric layer 1067 may include a high-k gate dielectric such as $HfO_2$. Before forming the high-k gate dielectric, an interface layer may also be formed on the surface of the channel layer 1007, such as an oxide formed by thermal oxidation, with a thickness of about 0.3 nm to 2 nm.

Figure 40A:
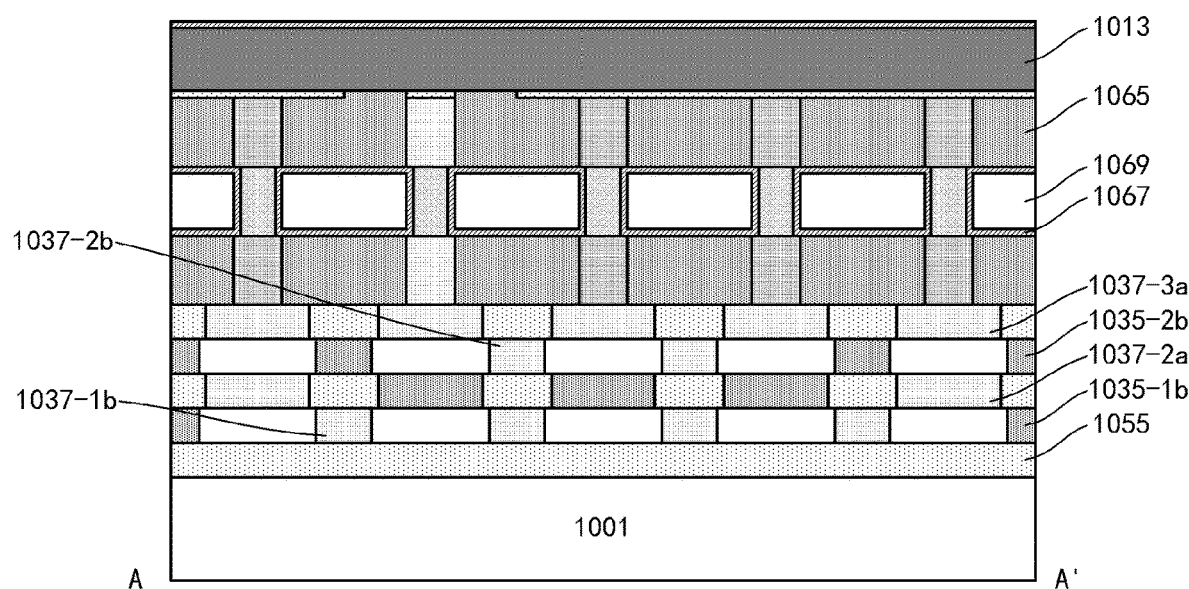
Figure 40B:
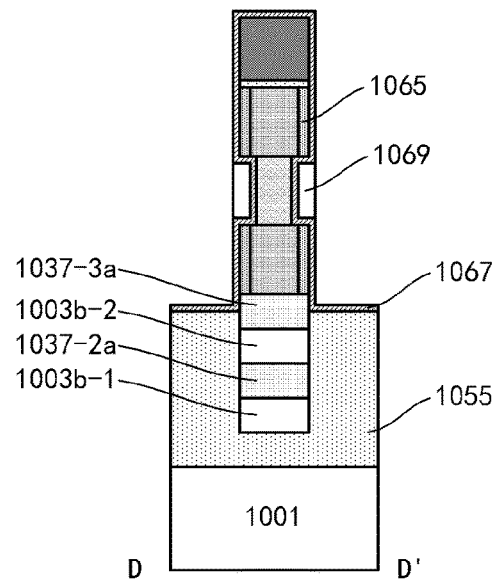

Next, as shown in FIG. 40(a) and FIG. 40(b), a gate electrode material may be formed on the structure shown in FIG. 39(a) and FIG. 39(b). For example, a work function adjustment metal for an n-type device may be deposited, and optionally, a gate conductive metal may also be deposited to completely fill the gaps in the structure. The deposited gate electrode material is etched back, such as RIE, to obtain a gate electrode 1069. RIE may be performed in the direction substantially perpendicular to the surface of the substrate. Due to the existence of the hard mask layer 1011/1013, the gate electrode 1069 after etch-back also exhibit a grid pattern. That is, the gate electrode 1069 may be located at the position where the position holding layer 1017 is originally located, and thus is self-aligned to the channel layer 1007.

The gate electrode 1069 for the n-type device is formed above. It is also possible to additionally form a gate electrode for the p-type device.

Figure 41:
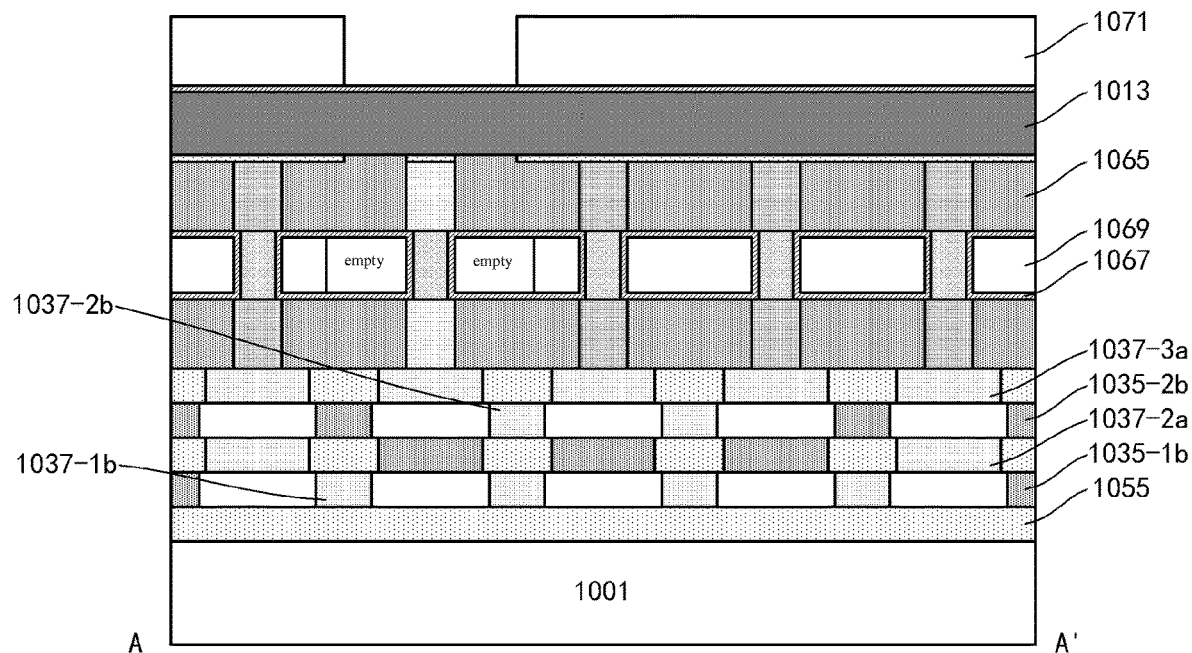

For example, as shown in FIG. 41, a photoresist 1071 may be formed on the structure shown in FIG. 40(a) and FIG. 40(b). Through photolithography, the photoresist 1071 may shield an area where an n-type device is to be formed and therefore shield the gate electrode 1069 in the area, and may expose an area where a p-type device is to be formed and therefore expose the gate electrode 1069 in the area. The exposed gate electrode 1069 may be removed by selective etching to be removed. After that, the photoresist 1071 may be removed.

Figure 42A:
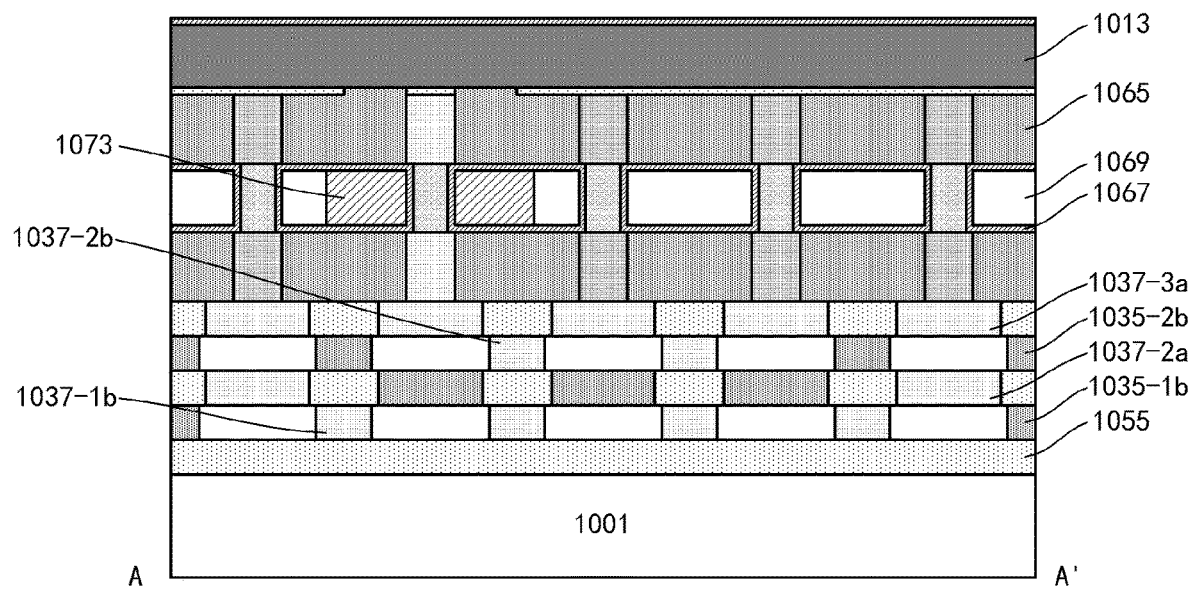
Figure 42B:
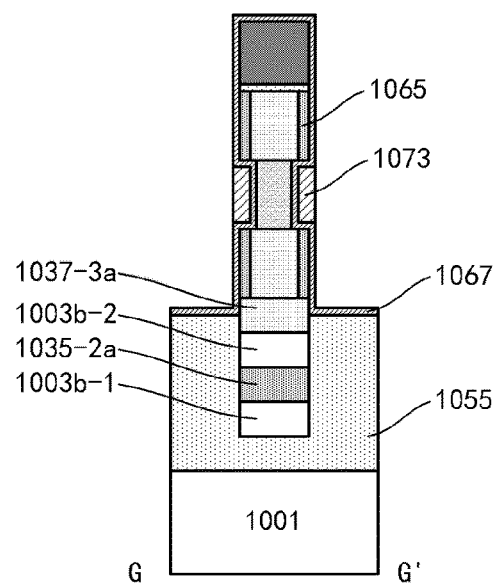

Then, as shown in FIG. 42(a) and FIG. 42(b), a gate electrode 1073 for a p-type device may be formed in a space released due to the removal of the gate electrode 1069. The gate electrode 1073 may be formed in the same manner as the gate electrode 1069, but may include a material different from that of the gate electrode 1069 (for example, having a work function different from that of the gate electrode 1069). Similarly, the gate electrode 1073 may be self-aligned to the channel layer 1007.

In this example, the gate stacks of the n-type device and the p-type device share the same gate dielectric layer 1067, however, the disclosed technology is not limited to this. For example, the gate dielectric layer 1067 in an area of the p-type device may also be removed, and an additional gate dielectric layer for the p-type device may be formed. Likewise, an order of forming the gate stack of the n-type device and the gate stack of the p-type device may be exchanged.

As described above, the gate electrode 1069 and the gate electrode 1073 exhibit the same grid pattern as the hard mask layer 1011/1013 as a whole, thus, the gate electrodes are connected as a whole on the plane where the channel layer 1007 is located by the bridging portions. Unnecessary connections between the gate electrodes may be cut off according to the connection design of the circuit.

Figure 43A:
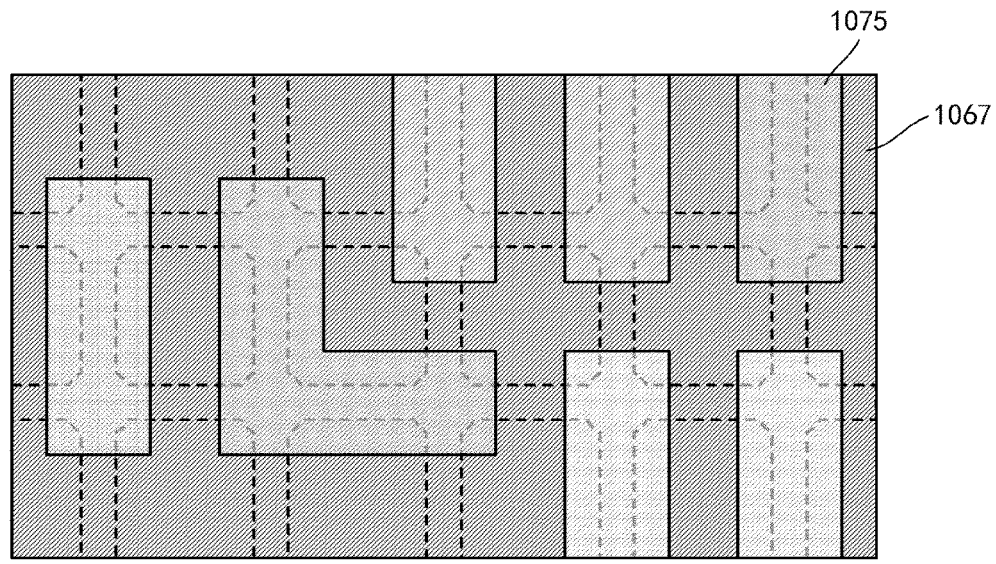
Figure 43B:
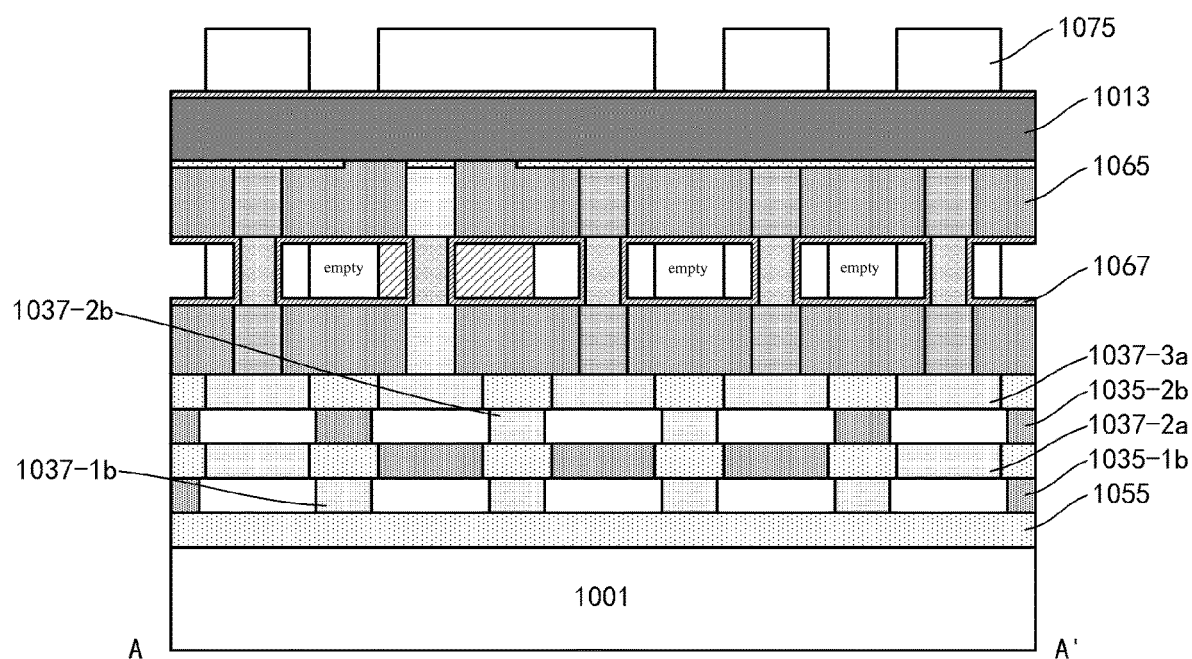
Figure 44:
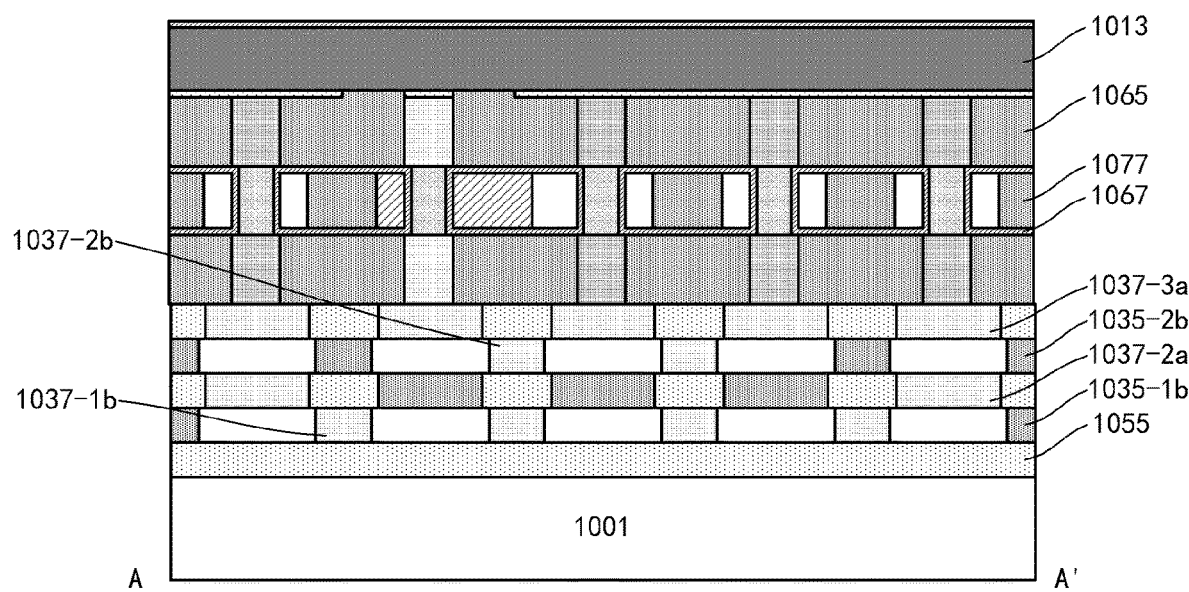

For example, as shown in FIG. 43(a) and FIG. 43(b), a photoresist 1075 may be formed on the structure shown in FIG. 42(a) and FIG. 42(b). The photoresist 1075 may be patterned by photolithography to cover the connections between the gate electrodes that need to be retained, and expose the connections between the gate electrodes that need to be cut off. Then, the exposed gate electrodes may be etched by selective etching to remove them. As shown in FIG. 43(b), the gate electrodes are cut off. After that, the photoresist 1075 may be removed. Then, as shown in FIG. 44, a dielectric material such as SiC may be filled in a space released by cutting the gate electrodes to form insulating portions 1077, so as to achieve isolation between the gate electrodes. A filling of the insulating portions 1077 may be achieved by the method of deposition and then etch back as described above, and therefore may be consistent with the pattern of the hard mask 1011/1013, and are located at positions where removed parts of the gate electrodes are originally located.

After the device is manufactured, an interconnection manufacture may be performed. The interconnection manufacture includes: forming conductive paths in the first stack; and forming contact plugs that apply electrical signals to conductive channels or gate electrodes in the first stack, and the like.

As described above, the interconnection channels are defined by the semiconductor material (in this example, silicon) in the first stack (other parts in the first stack are dielectric materials to achieve electrical isolation). The semiconductor material in the first stack may be replaced or converted into a conductive material to form an interconnection structure. For example, the semiconductor material may be converted into a conductive silicide through a silification reaction. Alternatively, the semiconductor material may be replaced with other conductive materials. Here, the silification reaction is described as an example.

Figure 45:
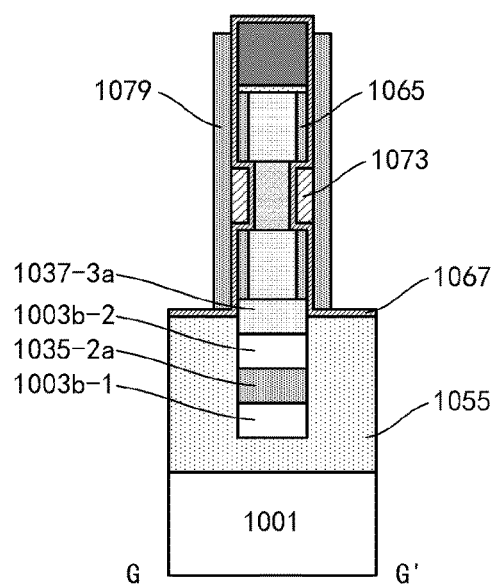

In order to prevent the metal in the gate electrode from being corroded during the silification process, as shown in FIG. 45, a protective layer 1079 may be formed to cover and thereby protect the gate electrode. According to the embodiments, the protective layer 1079 in a form of spacer may be formed through a spacer forming process. For example, a layer of SiC with a thickness of about 1 nm to 5 nm may be deposited on the structure shown in FIG. 44 in a substantially conformal manner, and RIE may be performed on the deposited SiC in the direction substantially perpendicular to the surface of the substrate, to remove a laterally extending part of the deposited SiC, and a vertically extending part of the deposited SiC is left, thereby obtaining the protective layer 1079. The protective layer 1079 may be formed around an outer periphery of each node and the bridging portion in the second stack, so as to cover the gate electrode formed around the channel layer.

Figure 46:
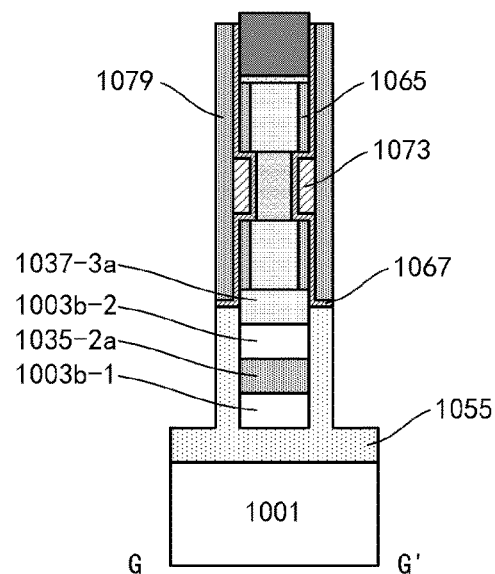

In addition, the first stack is currently covered by the dielectric layer 1055. In order to silicide the semiconductor material in the first stack, as shown in FIG. 46, the dielectric layer 1055 may be etched back, such as RIE (of course, before the dielectric layer 1055 is etched back, the gate dielectric layer 1067 on the surface of the dielectric layer 1055 needs to be selectively etched, such as RIE). In order to accurately control an amount of etch-back, ALE may be used.

Figure 47A:
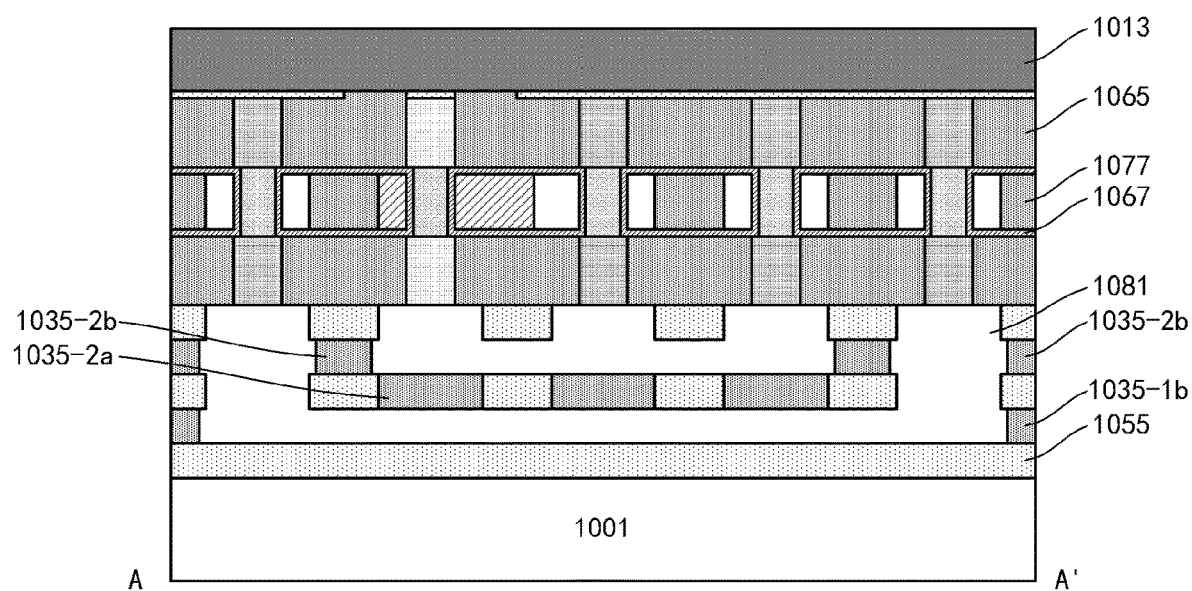
Figure 47B:
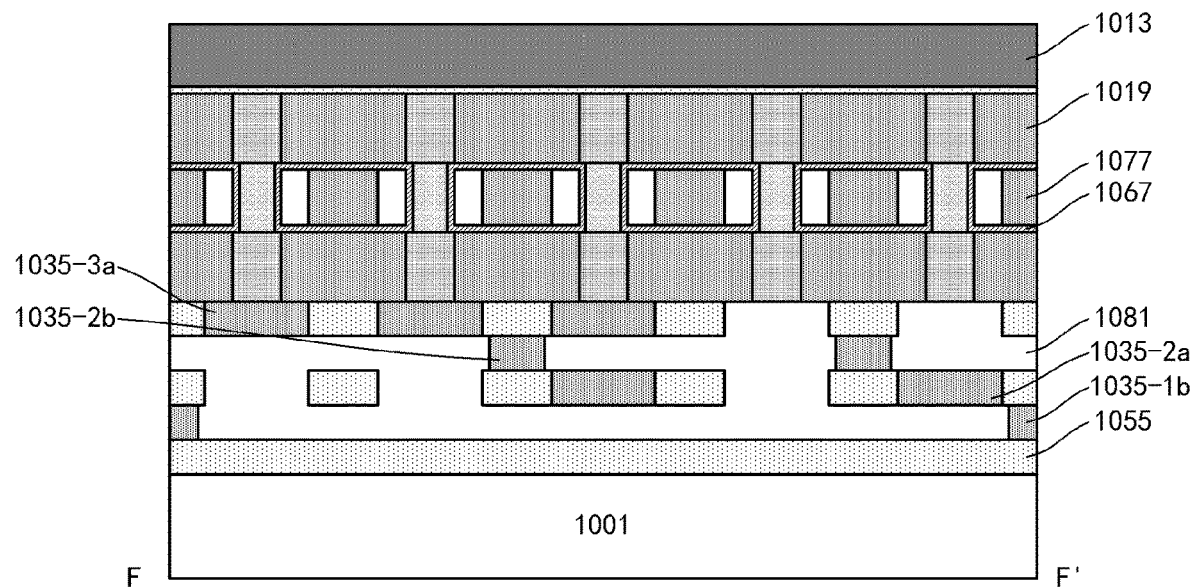
Figure 47C:
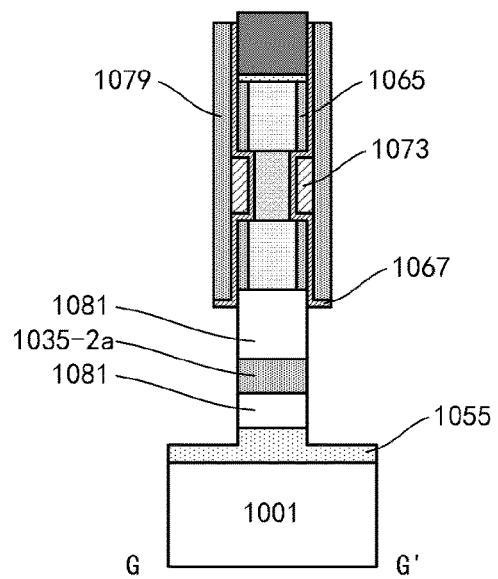

Then, as shown in FIGS. 47(a), 47(b), and 47(c), the dielectric layer 1055 may be further selectively etched, to expose sidewalls of the semiconductor material in the first stack. An amount of etching may be controlled, so that the bottom of the dielectric layer 1005 still remains covering the substrate 1001. In order to accurately control the amount of etching, ALE may be used.

For the semiconductor material in the first stack, the silification process may be performed through the exposed sidewalls of the first stack. For example, a metal such as NiPt, Co, or Ti with a thickness of about 1 nm to 10 nm may be deposited, and annealing is performed to make the deposited metal react with the semiconductor material (Si) in the first stack, to form a silicide 1081. After that, the metal that is unreacted may be removed.

In a case that the contact interface layer is formed between the first stack and the second stack as described above, the first source/drain layer 1005 may be connected to the silicide 1081 through the contact interface layer, so that the contact resistance may be reduced.

In the above example, the silification process of the semiconductor material in the first stack is performed after the gate electrode is formed. This is because the high-k metal gate may adapt to a larger range of heat treatment (temperature), which may give a larger process window. However, the disclosed technology is not limited to this. For example, after the interconnection structure is manufactured in the first stack, the device may be manufactured in the second stack.

Figure 48:
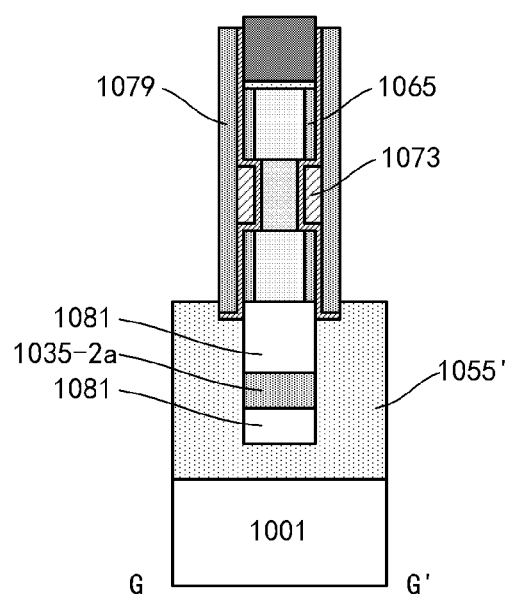
Figure 49A:
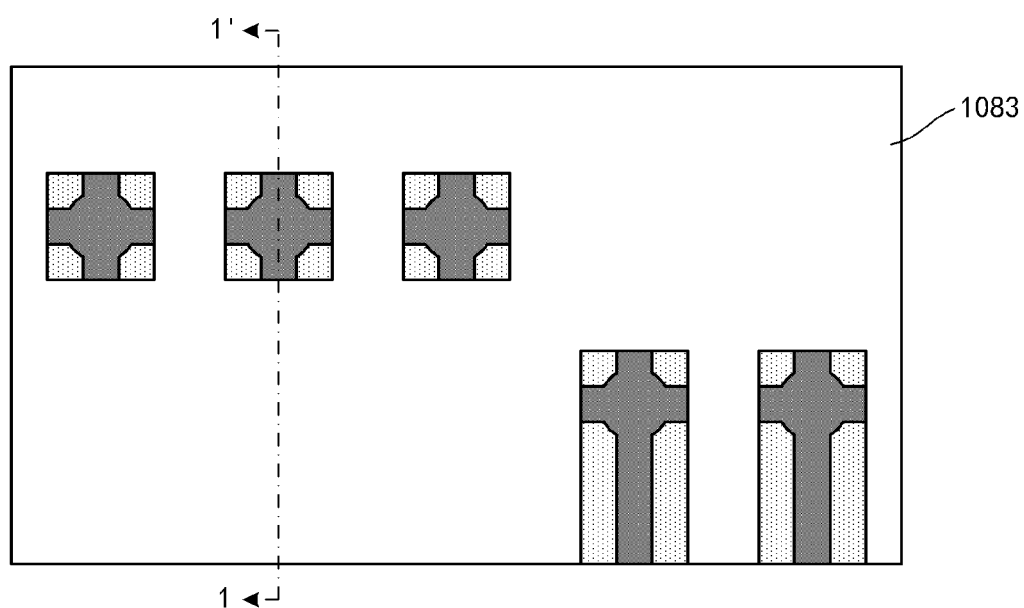
Figure 49B:
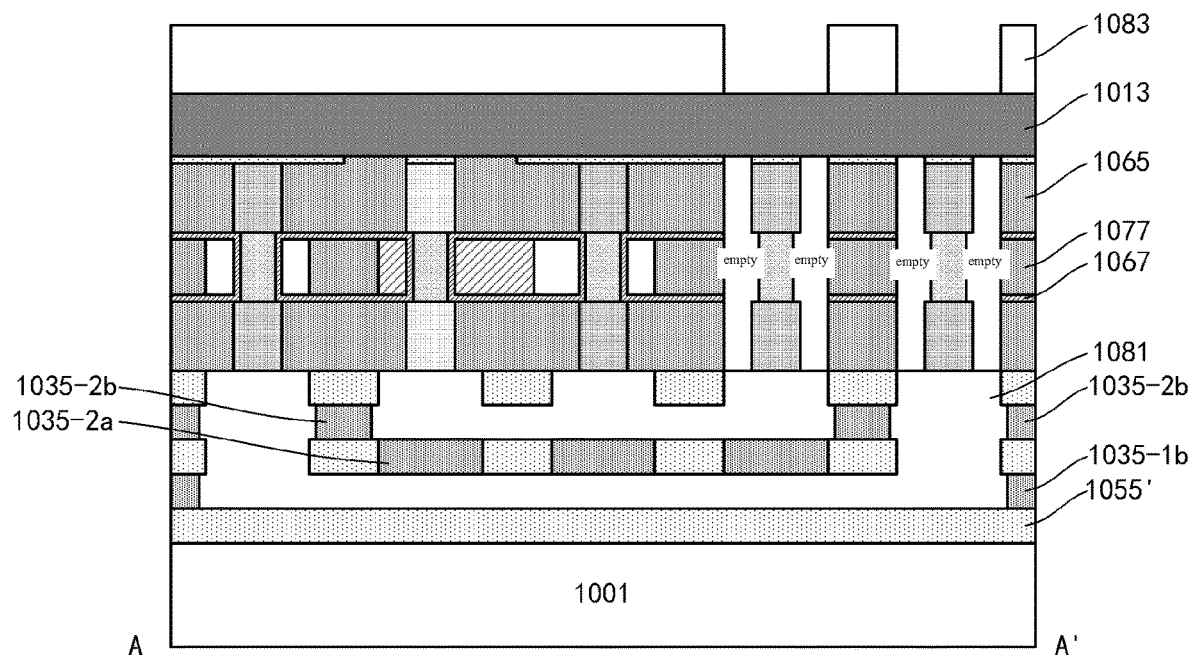
Figure 49C:
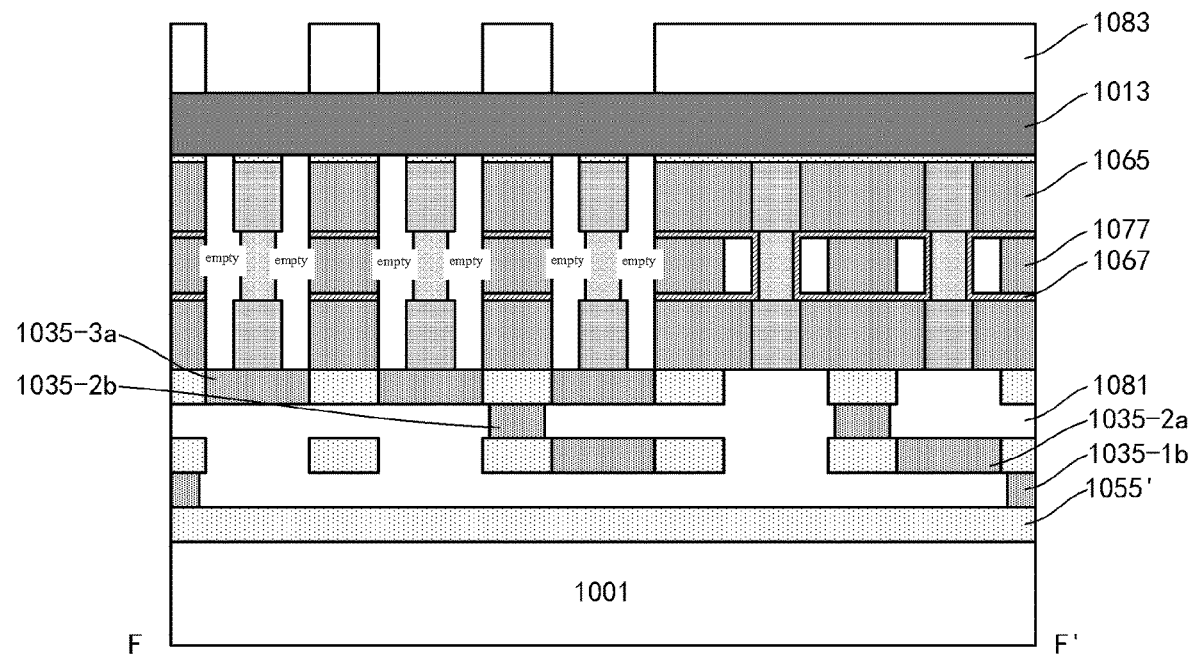
Figure 49D:
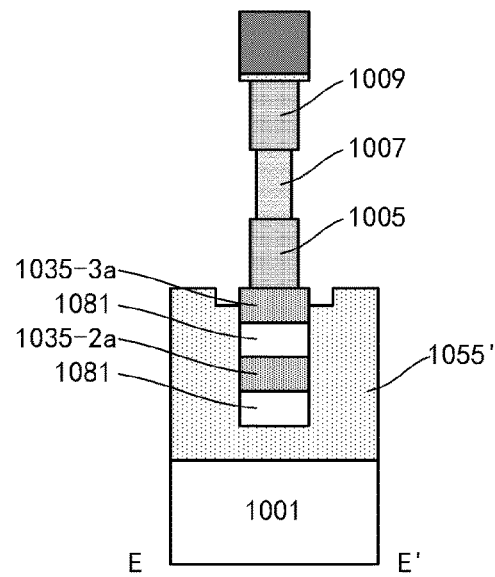
Figure 50A:
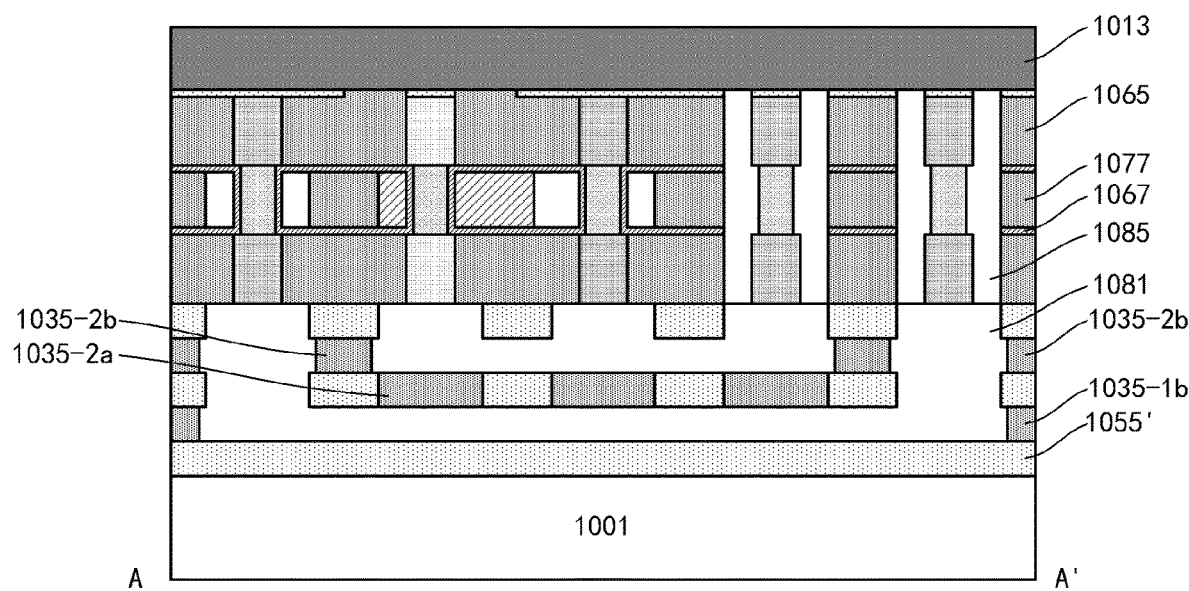
Figure 50B:
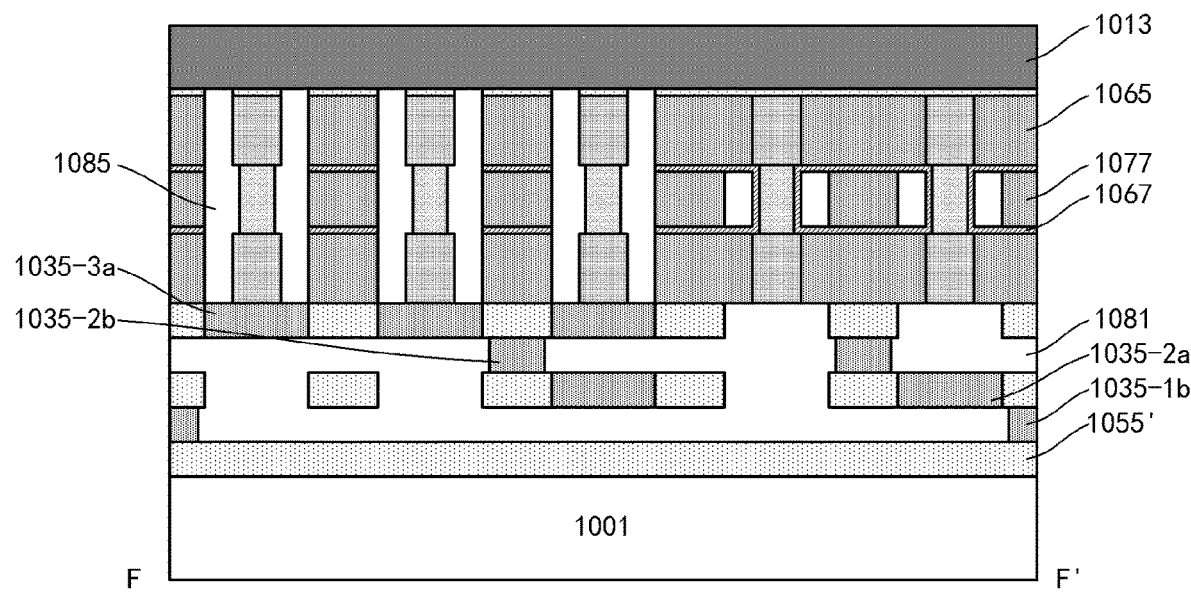
Figure 50C:
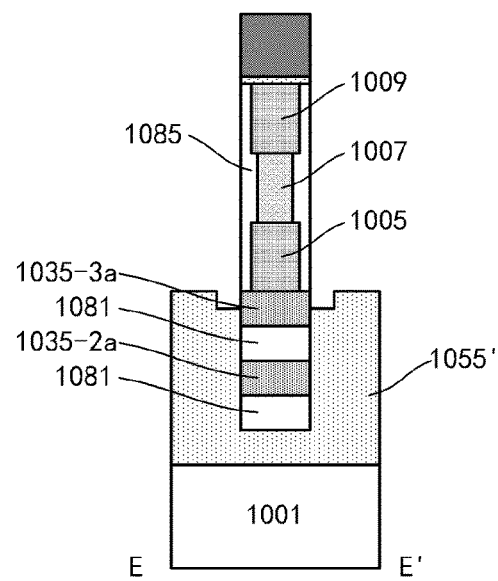
Figure 50D:
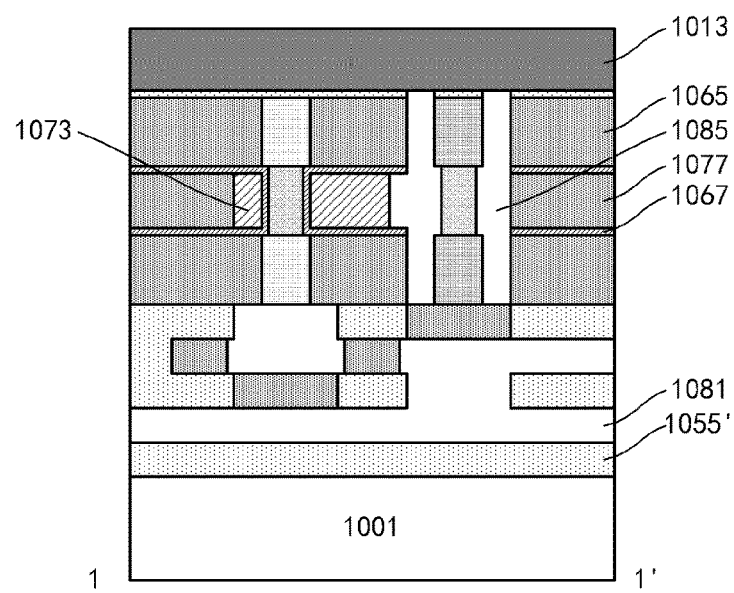

For the first stack, the dielectric layer in the first stack may be supplemented to achieve electrical isolation. For example, as shown in FIG. 48, an oxide may be deposited on the structure shown in FIGS. 47(a), 47(b), and 47(c), and the deposited oxide may be etched back to form a dielectric layer 1055'. Before the etch back, the deposited oxide may be planarized such as CMP, and the CMP may stop at the second sub-layer 1013 of nitride. A top surface of the etched back dielectric layer 1055' may be located near the boundary between the first stack and the second stack, to expose the protective layer 1079.

Next, contact plugs may be manufactured. Such contact plugs may be connected to the interconnection structure in the first stack or may be connected to the gate electrodes, so as to apply electrical signals. As described above, these contact plugs may be formed by replacing or converting a part of the active region into a conductive material, so that these contact plugs may be self-aligned to the gate electrodes to be connected or the via holes in the interconnection structure.

Currently, a periphery of each active region is covered by the protective layer 1079. The contact plug may be formed by removing the protective layer 1079 around the active region to be converted or replaced with the contact plug, and silification processing the active region exposed thereby.

For example, as shown in FIGS. 49(a), 49(b), 49(c), and 49(d), a photoresist 1083 may be formed on the structure shown in FIG. 48. A series of openings may be formed in the photoresist 1083 by photolithography, and these openings are located at nodes where contact plugs need to be formed. The exposed protective layer 1079 may be removed by selective etching through the openings in the photoresist 1083, and the gate dielectric layer, the gate electrodes, etc. exposed due to the removal of the protective layer 1079 may be sequentially removed, so as to expose the sidewalls of the corresponding active regions. After that, the photoresist 1083 may be removed.

Due to this etching, the gate electrodes which may otherwise be connected between the active regions with exposed sidewalls and the adjacent active regions are also cut off. As described above, the connections between the gate electrodes are determined according to a connection layout of the circuit. In order to compensate for the cut off of the gate electrodes, as shown in FIGS. 50(a), 50(b), 50(c) and 50(d), the gaps of the first stack under the hard mask layer may be filled with a semiconductor material 1085, such as deposited polysilicon or amorphous silicon, which may also be replaced or converted into a conductive material later.

After that, as shown in FIGS. 51(a), 51(b), 51(c), and 51(d), a silification process may be performed to convert the semiconductor material not covered by the protective layer 1079 into a conductive silicide, so as to be used as contact plugs 1087. Regarding the silification process, reference may be made to the description above, which may not be repeated here.

Figure 51A:
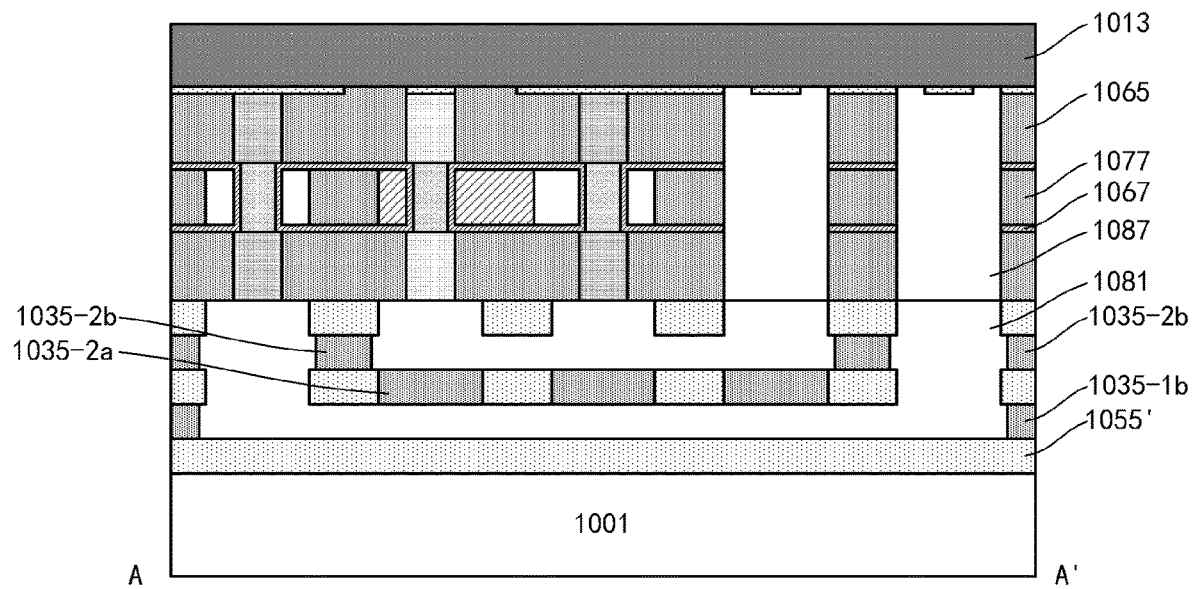
Figure 51B:
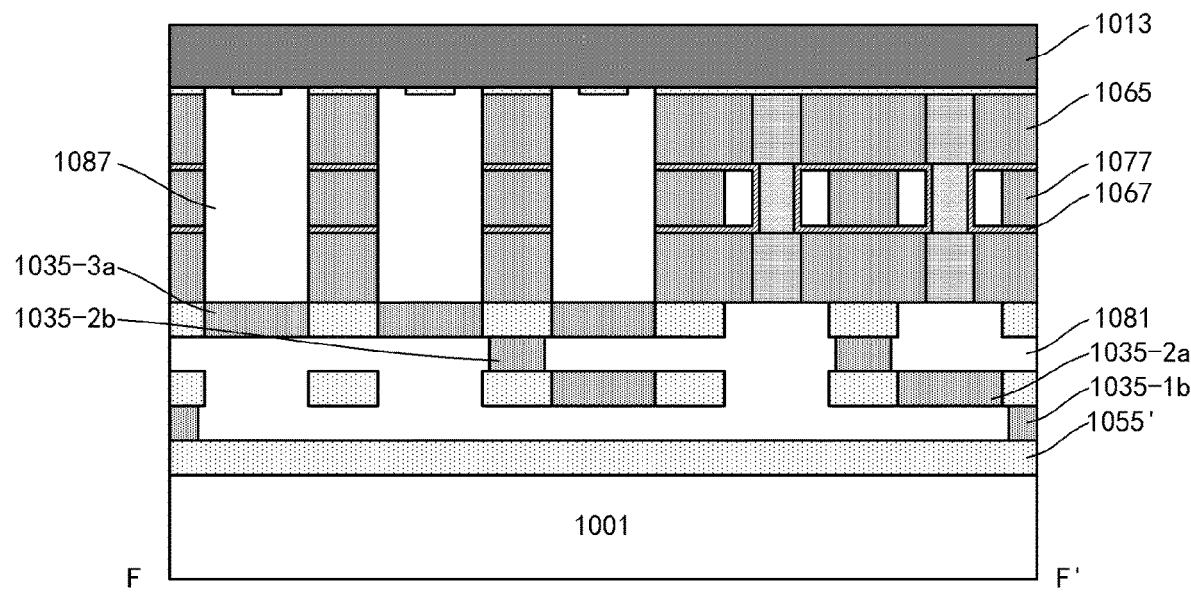
Figure 51C:
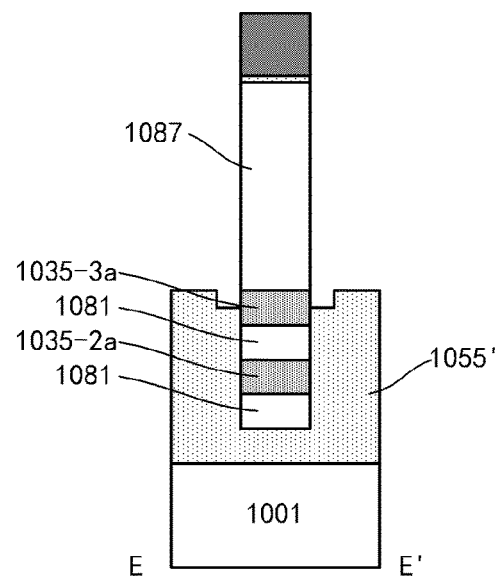
Figure 51D:
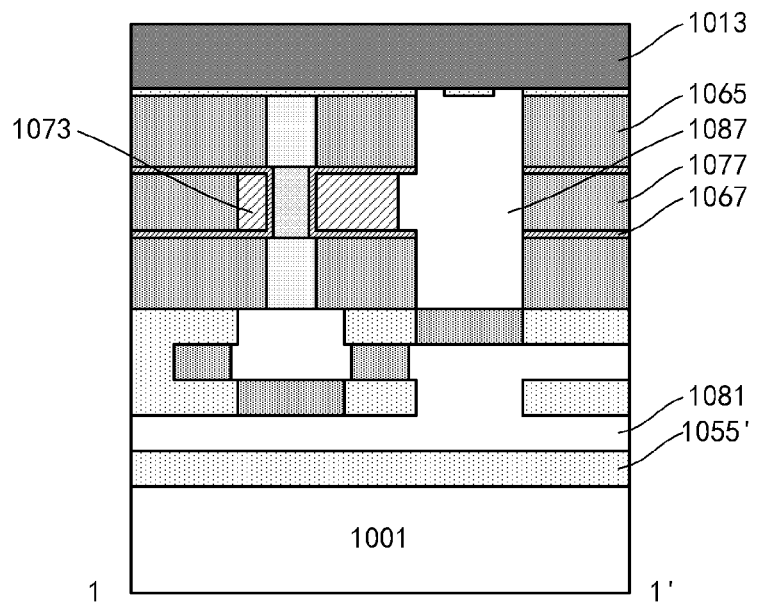

As shown in FIG. 51(a), a part of the contact plugs may be in contact with the interconnection structure below, to apply electrical signals to the interconnection structure. In addition, as shown in FIGS. 51(b), 51(c) and 51(d), a part of the contact plugs is electrically isolated from the interconnection structure below through the insulating portions 1035-3a, and the contact plugs may be used to apply electrical signals to the gate electrodes. As shown in FIG. 51(d), a laterally extending part of the contact plug 1087 contacts the gate electrode 1073. As described above, this laterally extending part is aligned with the bridging portion in the grid pattern of the hard mask layer, and is located at a position where the gate electrode originally locates.

Through the above processing, connections between the lower source/drain regions and the gate electrodes of the device are achieved. In addition, for the upper source/drain regions and the contact plugs of the device, contact portions may be formed above the device. For example, as shown in FIGS. 52(a), 52(b), 52(c) and 52(d), a dielectric layer such as oxide (here, still shown as 1055') may be deposited to fill the gaps in the structure, so as to achieve electrical isolation among devices. In addition, contact portions 1091 penetrating the hard mask layer and/or the dielectric layer 1055' may be formed to apply electrical signals to the upper source/drain regions and the contact plugs of the device. These contact portions may be formed by etching holes and filling the holes with a conductive material such as metal.

Although a vertical semiconductor device is described above as an example, however, the disclosed technology is not limited to this, but may be applied to other forms of devices, such as a FinFET or a planar semiconductor device.

FIGS. 53 to 66(b) show schematic diagrams of some stages in a process for manufacturing a FinFET according to the embodiments of the disclosed technology. In the following, differences from the above-mentioned embodiments will be mainly described, and the repeated descriptions with the above-mentioned embodiments may be simplified or omitted.

Figure 53:
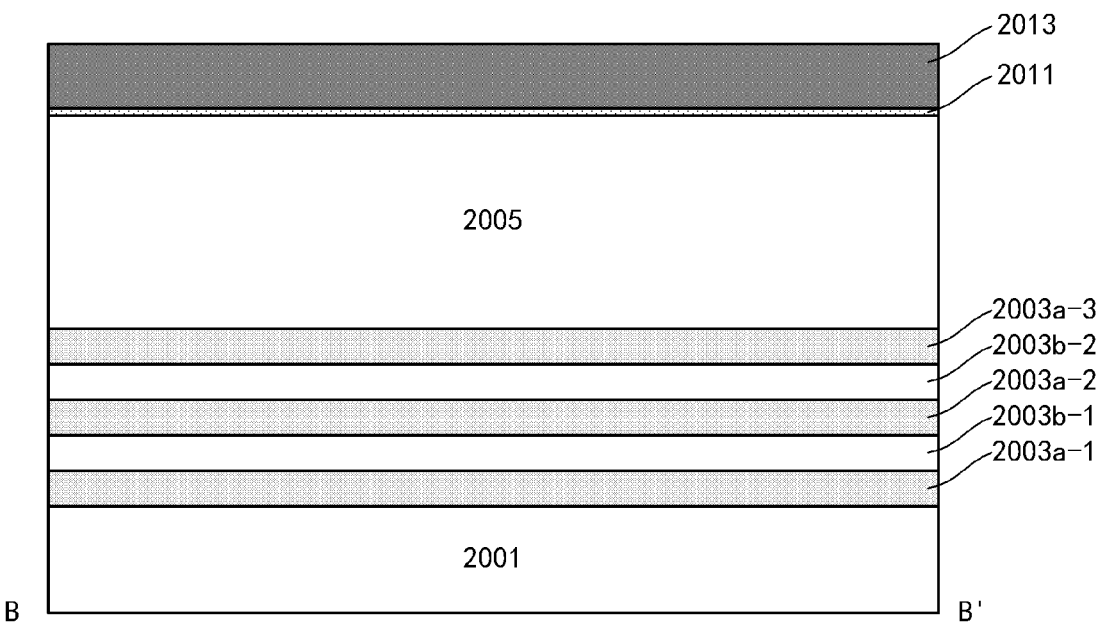
FIGS. 53 to 66(*b*) show schematic diagrams of some stages in a process for manufacturing a FinFET according to the embodiments of the disclosed technology, in which FIGS. 54(*a*), 59(*a*), 60(*a*), 62(*a*), 63(*a*), 64(*a*), 65(*a*), 66(*a*) are top views, FIGS. 53, 54(*b*), 55(*b*), 56, 59(*c*), 60(*c*), 63(*c*), 64(*c*) are cross-sectional views along line BB', FIGS. 55(*a*), 57(*a*), 59(*b*), 60(*b*), 61, 62(*b*), 63(*b*), 64(*b*), 65(*b*), 66(*b*) are cross-sectional views along line AA', FIG. 57(*b*) is a cross-sectional view along line FF', FIGS. 57(*d*), 58, 59 (*d*) are cross-sectional views along line GG', FIG. 65(*c*) is a cross-sectional view along a HH' line, and FIG. 57(*c*) is a cross-sectional view along line 1-1'.

As shown in FIG. 53, a first stack of alternately arranged first sacrificial layers 2003a-1, 2003a-2, 2003a-3 and second sacrificial layers 2003b-1, 2003b-2 may be formed on a substrate 2001. For details about the substrate 2001, the first sacrificial layers 2003a-1, 2003a-2, 2003a-3, and the second sacrificial layers 2003b-1, 2003b-2, reference may be made to the above description of the substrate 1001, the first sacrificial layers 1003a-1, 1003a-2, 1003a-3, and the second sacrificial layers 1003b-1, 1003b-2. In addition, as described above, before forming the first stack, a contact layer may be provided on the substrate.

A fin precursor layer 2005 may be formed on the first stack by, for example, epitaxial growth. The fin precursor layer 2005 may include a suitable semiconductor material such as Si, in order to subsequently form a fin being used as an active region of the FinFET. The fin precursor layer 2005 may be formed to have a certain height, such as about 20 nm to100 nm.

A hard mask layer may be formed on the fin precursor layer 2005. For example, the hard mask layer may include a first sub-layer 2011 and a second sub-layer 2013. For details of the first sub-layer 2011 and the second sub-layer 2013, reference may be made to the above description of the first sub-layer 1011 and the second sub-layer 1013.

Figure 54A:
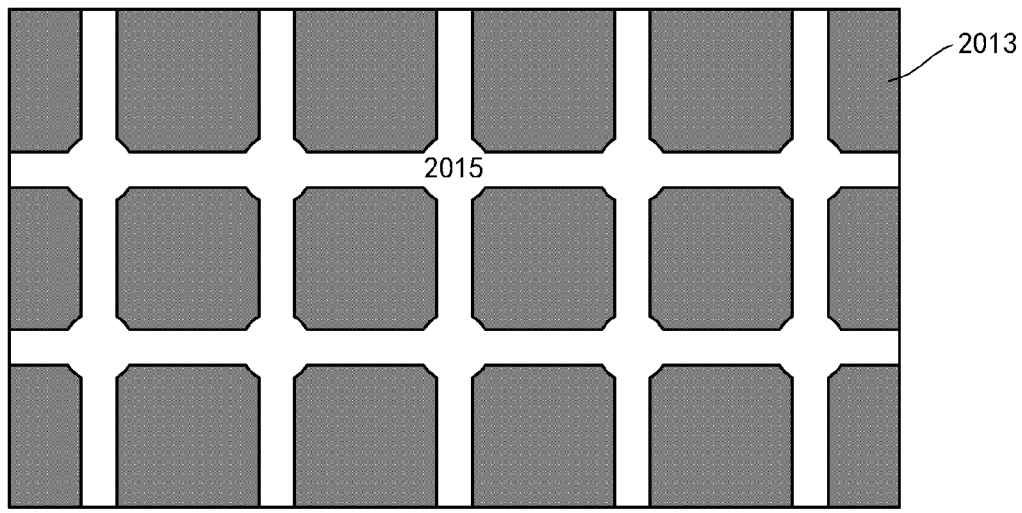
Figure 54B:
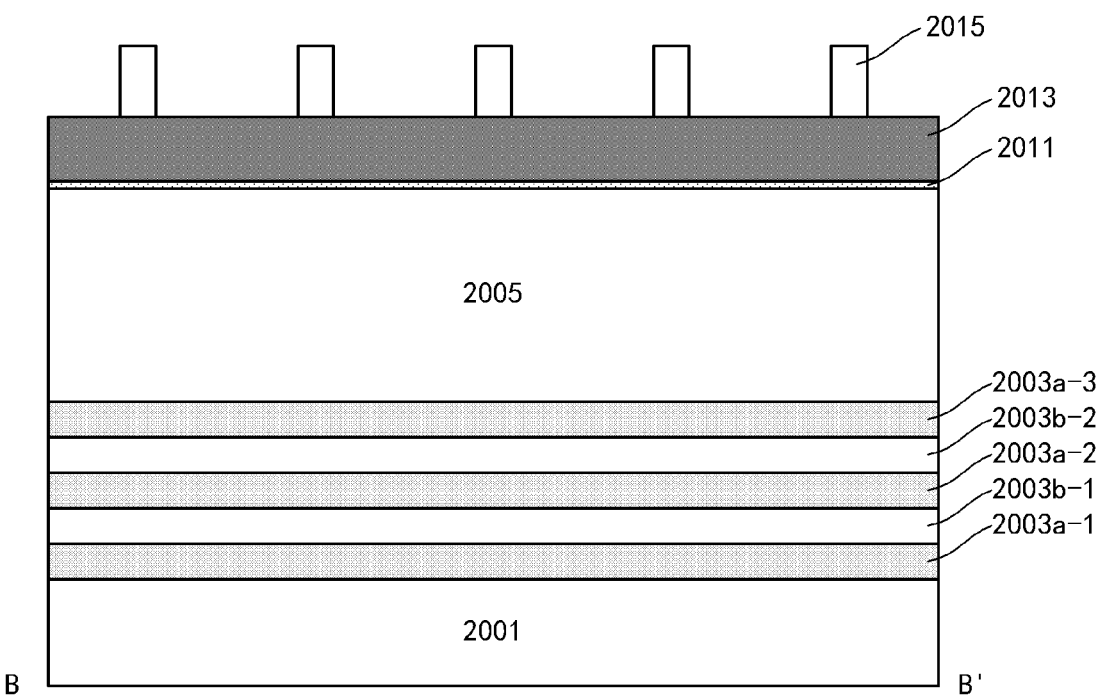

Similar to the embodiment described above, a grid pattern may be defined in the first stack and the fin precursor layer 2005. To this end, as shown in FIG. 54(a) and FIG. 54(b), a photoresist 2015 with a grid pattern may be formed. For details of the photoresist 2015 and its grid pattern, reference may be made to the details of the photoresist 1015 and its grid pattern described above.

It should be pointed out here that, in this example, the photoresist 2015 is shown as each node portion in the grid pattern is thicker than each bridging portion in the grid pattern, which is similar to the photoresist 1015 described above. This is advantageous for subsequently manufacturing a contact to a source/drain region formed at each node. However, the disclosed technology is not limited to this. A line width of the node portion may be substantially the same as a line width of the bridging portion. For example, the grid pattern may be defined by straight lines that intersect each other with a uniform thickness.

Next, an active region may be defined.

Figure 55A:
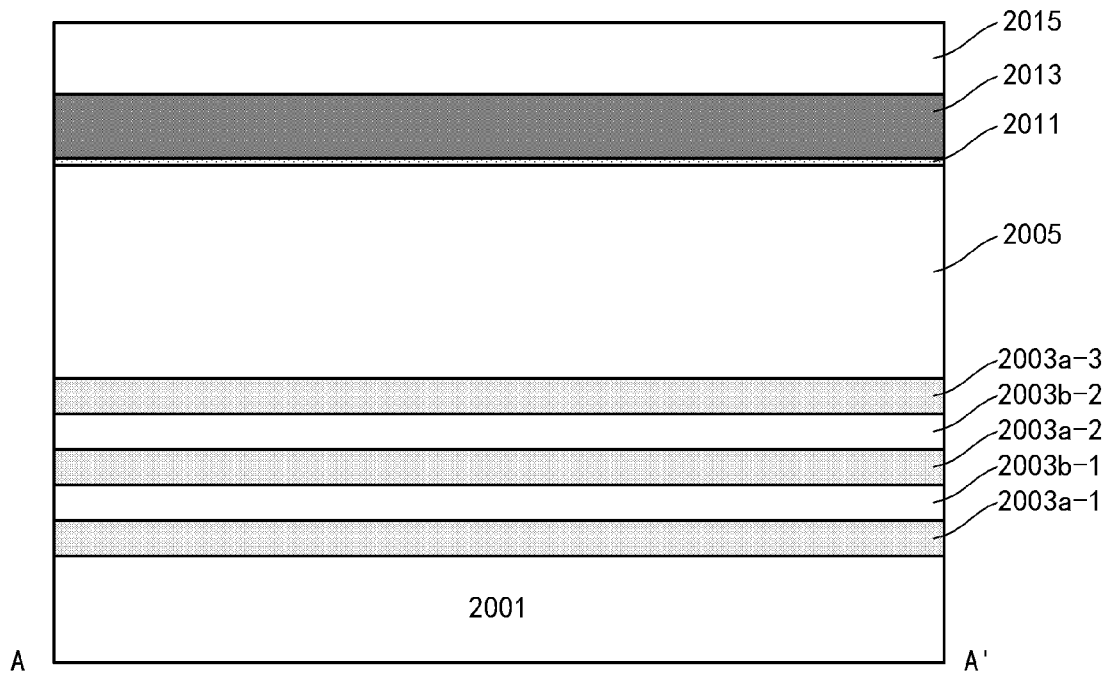
Figure 55B:
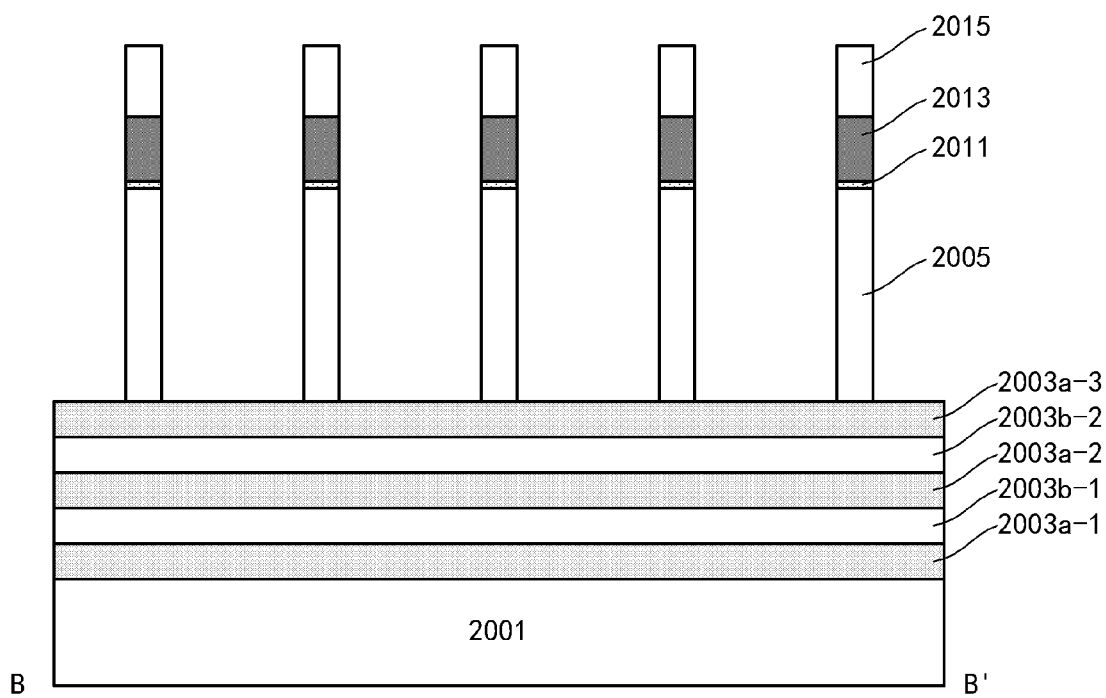

Similar to the embodiment described above, the pattern of the photoresist 2015 may be transferred to the hard mask layer, and then transferred to the fin precursor layer 2005 below. Specifically, as shown in FIG. 55(a) and FIG. 55(b), the patterned photoresist 2015 may be used as a mask, and the hard mask layer (2013, 2011) and the fin precursor layer 2005 may be selectively etched in sequence, such as RIE. For example, RIE may be performed in the direction substantially perpendicular to a surface of the substrate, and may stop at a top surface of the first stack. Thus, the fin precursor layer 2005 may exhibit the same grid pattern as the hard mask layer. Edges of the grid (lines extending in a row or column direction) may define the positions of fins. More specifically, an approximate middle portion of the bridging portion of the fin precursor layer 2005 may be used as a channel region, and portions on both sides of the channel region (a node portion and bridging portions with a certain length around the node portion) may be used as source/drain regions. After that, the photoresist 2015 may be removed.

Figure 56:
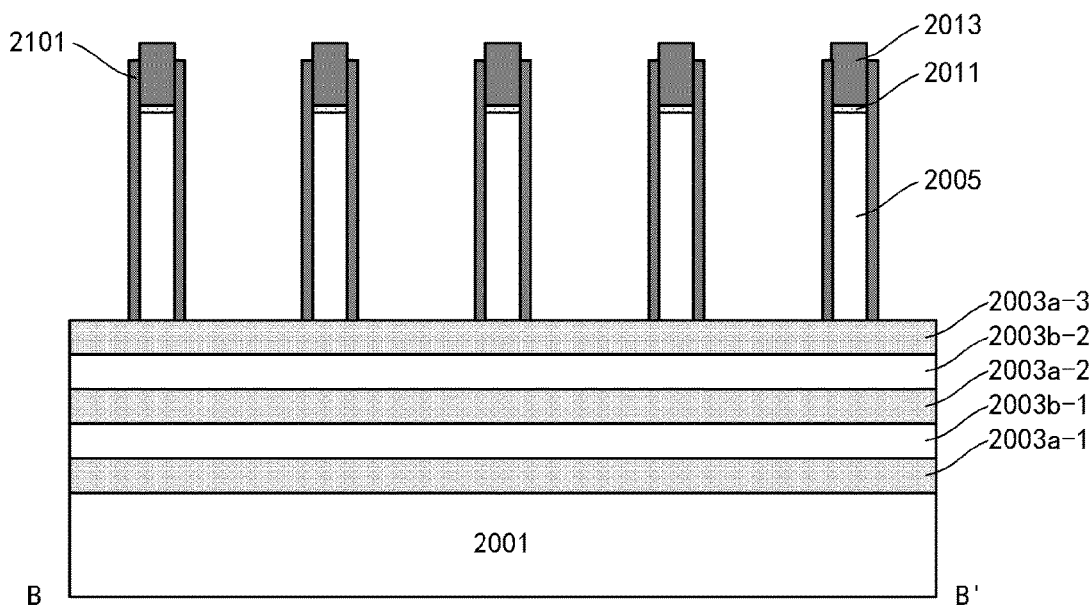
Figure 57A:
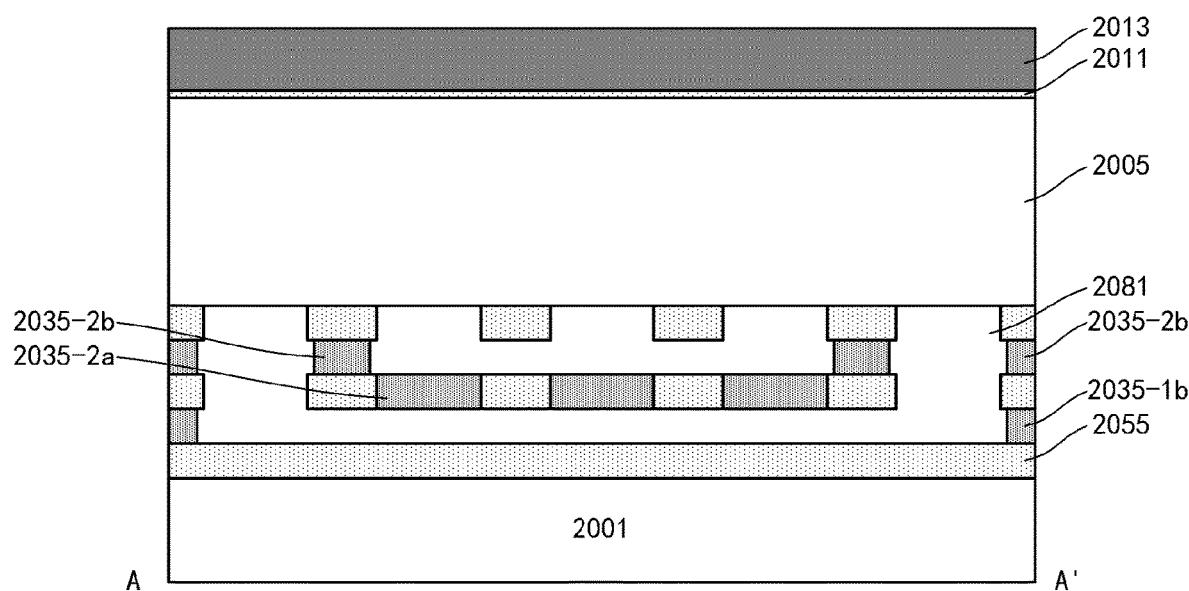
Figure 57B:
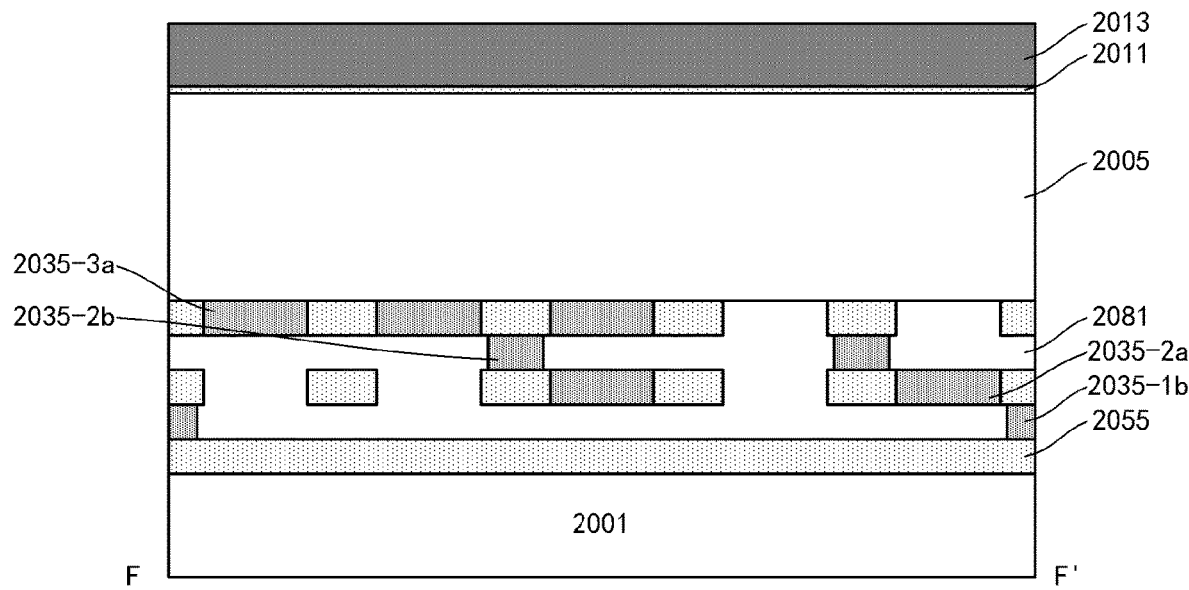
Figure 57C:
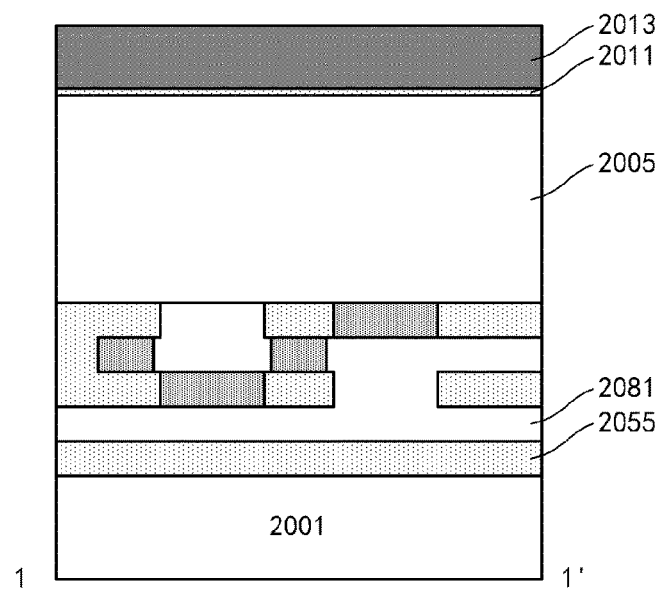
Figure 57D:
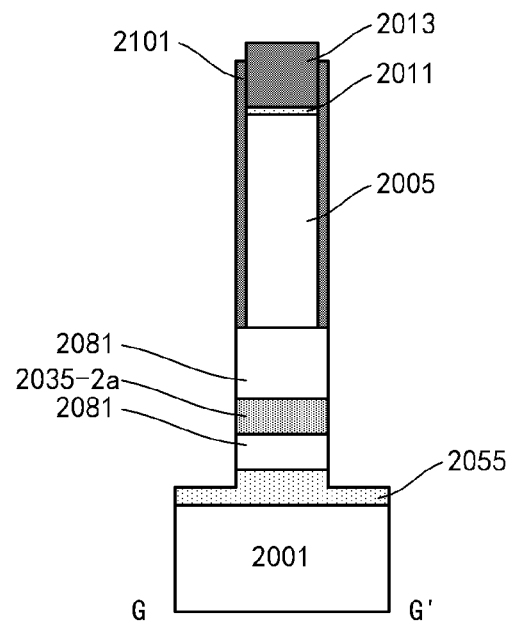

In addition, in order to avoid affecting the fin precursor layer 2005 (in this example, the fin precursor layer 2005 and the second sacrificial layer in the first stack are Si) when the first stack is subsequently processed, a protective layer may be formed on a surface of the fin precursor layer 2005. For example, as shown in FIG. 56, a protective layer 2101 may be formed on sidewalls of the fin precursor layer 2005 according to a spaces formation process. For example, the protective layer 2101 may include nitride, and may have a thickness of about 1 nm to 10 nm.

Next, an interconnection structure may be defined in the first stack according to the EFEF process described above. For this, reference may be made to the above description in conjunction with FIGS. 8(a) to 47(c). However, the processes related to source/drain doping and metal gate formation described above in conjunction with FIGS. 33(a) to 45 may be omitted here.

Thus, structures shown in FIGS. 57(a), 57(b), 57(c), and 57(d) may be obtained. As shown in the drawings, an interconnection path 2081 of silicide is formed in the first stack, which includes a via hole in the via layer and a conductive channel in the interconnection layer. For details of the interconnection path 2081, reference may be made to the description of the suicide 1081 described above. In addition, the drawings also show insulating portions 2035-2a, 2035-3a, 2035-1b, 2035-2b in the first stack, and a dielectric layer 2055 in the first stack. For details about the insulating portions 2035-2a, 2035-3a, 2035-1b, 2035-2b and the dielectric layer 2055, reference may be made to the description of the insulating portions 1035-2a, 1035-3a, 1035-1b, 1035-2b, and the dielectric layer 1055 described above.

Figure 58:
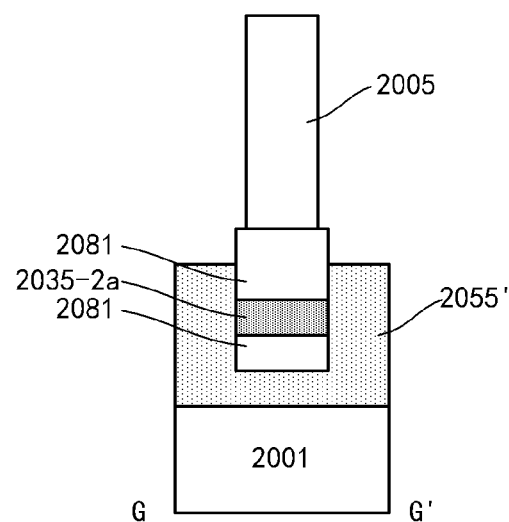

After defining the interconnection structure, the device may be manufactured. To this end, as shown in FIG. 58, the protective layer 2101 may be removed by selective etching. When the protective layer 2101 is removed, the second sub-layer 2013, which is also nitride in this example, may also be removed.

In addition, a dielectric may be filled in the first stack, to achieve electrical isolation. For example, an oxide may be deposited and the deposited oxide may be etched back to form a dielectric layer 2055'. Before etch back, the deposited oxide may be planarized, such as CMP. A top surface of the etched back dielectric layer 2055' may be located near a boundary between the first stack and the second stack, for example, lower than the boundary.

The fin precursor layer 2005 may extend vertically relative to the structure below, which is similar to a fin. There are various technologies in the art to manufacture a FinFET based on fins, and the following description is only an example.

Currently, the fin precursor layer 2005 is continuous, that is, the active regions of each device are connected together. The fin precursor layer 2005 may be separated into different active regions according to a layout design of the devices. It is possible to form gate electrodes that intersect these active regions (fins) to manufacture the devices. According to the embodiments of the disclosed technology, the separation of the active regions of the devices and the manufacture of the gate electrodes may be combined.

For example, as shown in FIGS. 59(a), 59(b), 59(c), and 59(d), sacrificial gates intersecting each bridging portion of the fin precursor layer 2005 may be formed on the dielectric layer 2055'. For example, a sacrificial gate dielectric layer 2103 and the sacrificial gate electrode layer 2105 may be formed on the dielectric layer 2055' by, for example, deposition. For example, the sacrificial gate dielectric layer 2103 may include oxide with a thickness of about 1 nm to 5 nm; the sacrificial gate electrode layer 2105 may include amorphous silicon or polysilicon, and a top surface of the sacrificial gate electrode layer 2105 may be higher than a top surface of the fin precursor layer 2005, so as to cover sidewalls and a top surface of each bridge portion. To facilitate patterning, a hard mask layer 2107 may be formed on the sacrificial gate electrode layer 2105 by, for example, deposition. For example, the hard mask layer 2107 may include nitride and have a thickness of about 10 nm to 150 nm. The hard mask layer 2107 and the sacrificial gate electrode layer 2105 may be patterned into a desired shape through a photoresist by selective etching such as RIE, for example, the desired shape may be stripes that intersect (for example, perpendicular to) each bridging portion. The etching may stop at the sacrificial gate dielectric layer 2103 of oxide.

Figure 59A:
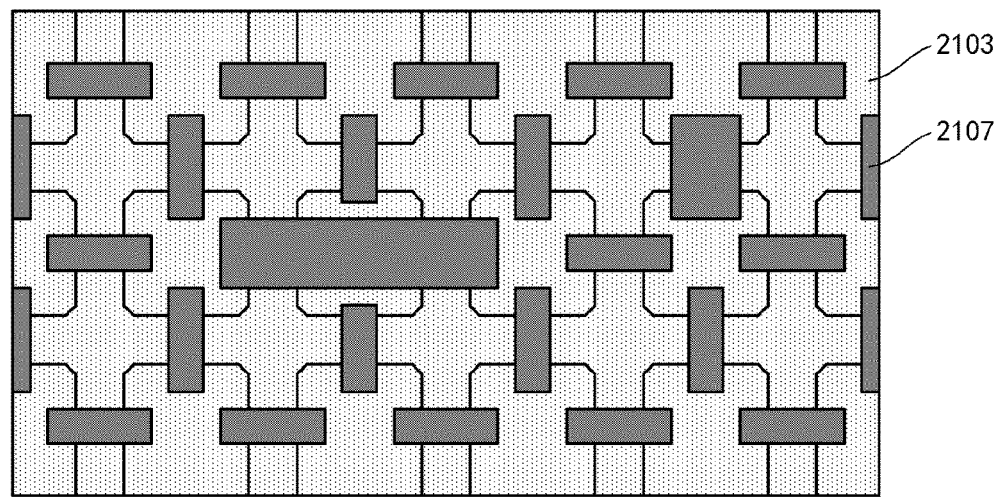

As shown in FIG. 59(a), in an approximate middle portion of each bridging portion of the fin precursor layer 2005, a sacrificial gate intersecting the bridging portion is formed. According to the layout design, some of the sacrificial gates may be connected together. It should be pointed out here that, these sacrificial gates are not necessarily replaced by real gates subsequently, rather, some of the sacrificial gates may define isolation positions between the active regions.

Figure 59B:
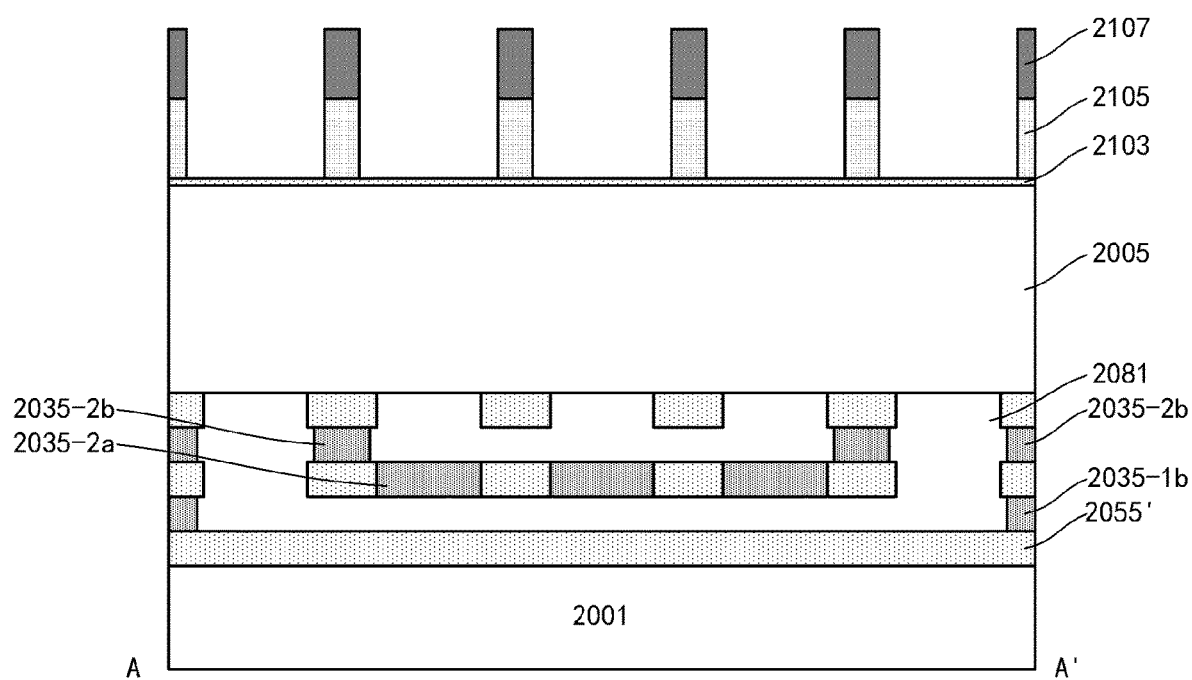
Figure 59C:
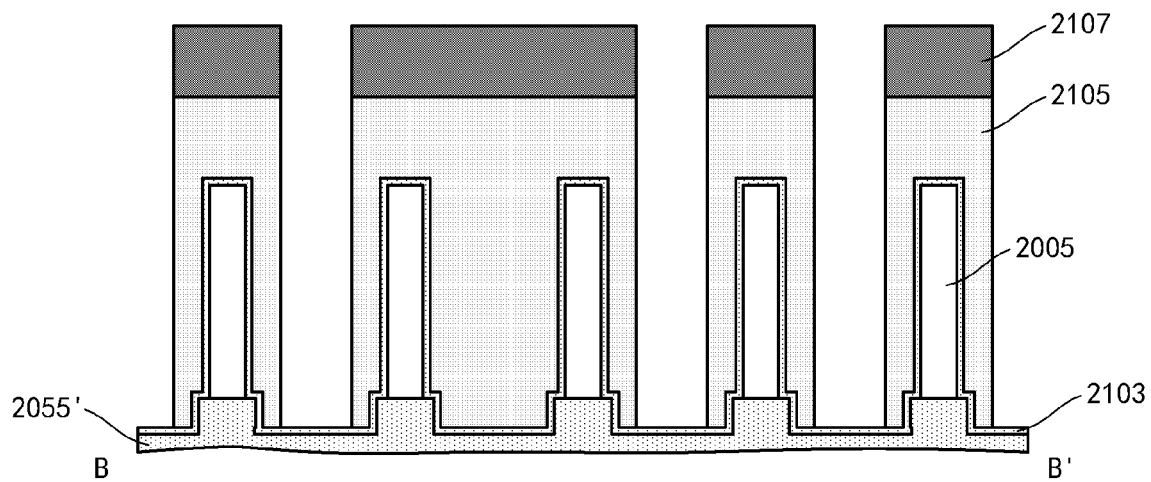
Figure 59D:
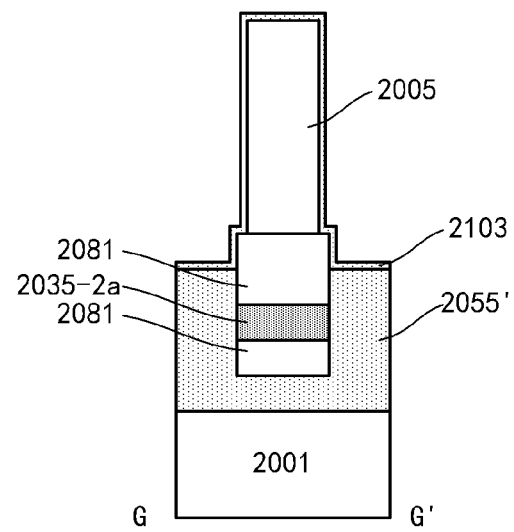

In FIG. 59(b), the structure in the first stack is not shown only for ease of illustration. Regarding the structure in the first stack, reference may be made to the relevant description in the above-mentioned embodiment.

Figure 60A:
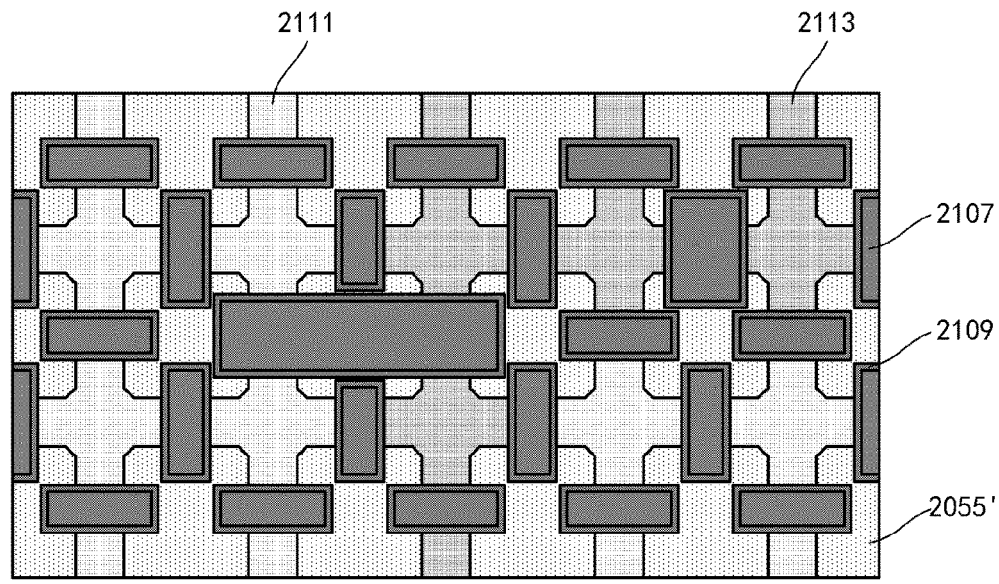
Figure 60B:
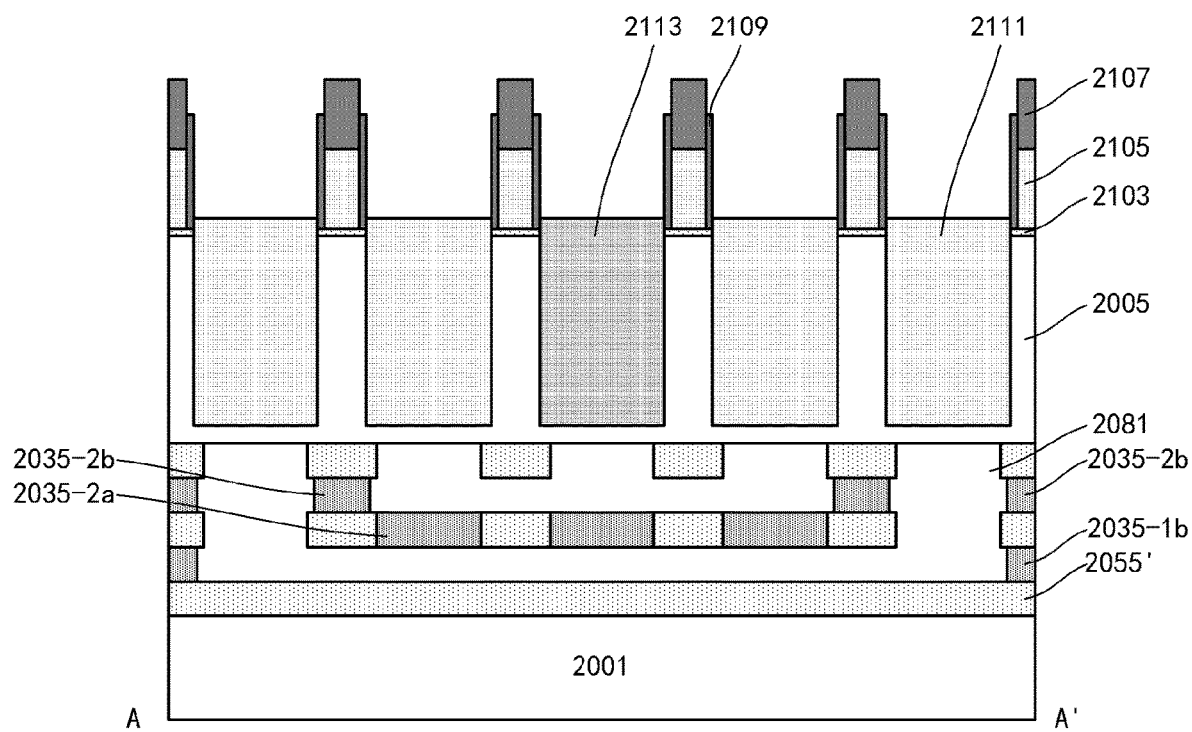
Figure 60C:
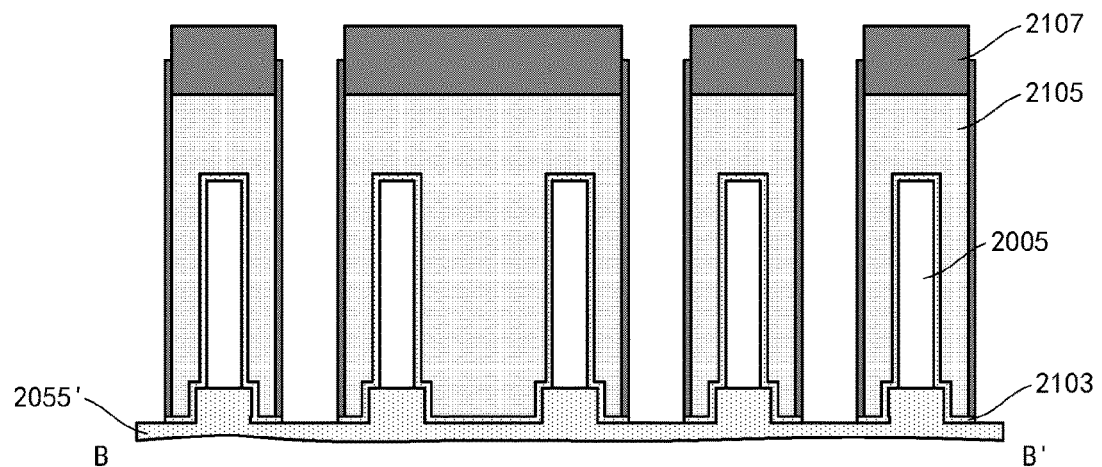

Then, as shown in FIGS. 60(a), 60(b), and 60(c), gate spacers 2109 may be formed on sidewalls of a sacrificial gate. For example, the gate spacers 2109 may include nitride. There are many ways to form the gate spacer in the art, which may not be repeated here. It should be pointed out here that, the gate spacers 2109 may also be formed on vertical sidewalls of the fin precursor layer 2005, but it is not shown in the drawings for convenience.

For example, ion implantation may be used to dope the fin precursor layer 2005 (especially a part of the fin precursor layer 2005 not covered by the sacrificial gates, mainly each node and a certain length of the bridge portions around the node) to form the source/drain regions. For n-type devices and p-type devices, different conductivity types may be doped respectively.

According to the embodiments of the disclosed technology, strain source/drain technology may be utilized. For example, a part of the fin precursor layer 2005 that is not covered by the sacrificial gate may be selectively etched, such as RIE, to partially remove the fin precursor layer 2005, and a part of the fin precursor layer 2005 may be left as a seed layer. Then, the source/drain regions may be formed on the remaining seed layer by, for example, epitaxial growth. The grown source/drain regions may have a material different from a material of the fin precursor layer 2005 (for example, have a lattice constant different from a lattice constant of the fin precursor layer 2005), so as to apply stress to the channel regions formed in the fin precursor layer 2005. For example, for n-type devices, the source/drain regions 2111 may include Si:C; and for p-type devices, the source/drain regions 2113 may include SiGe. The source/drain regions may be doped in-situ during growth.

In addition, annealing may be performed to diffuse the dopant, thereby improving electrical connections between the source/drain regions and via holes under the source/drain regions.

Next, a separation of the active regions and a replacement of the sacrificial gates may be performed.

Figure 61:
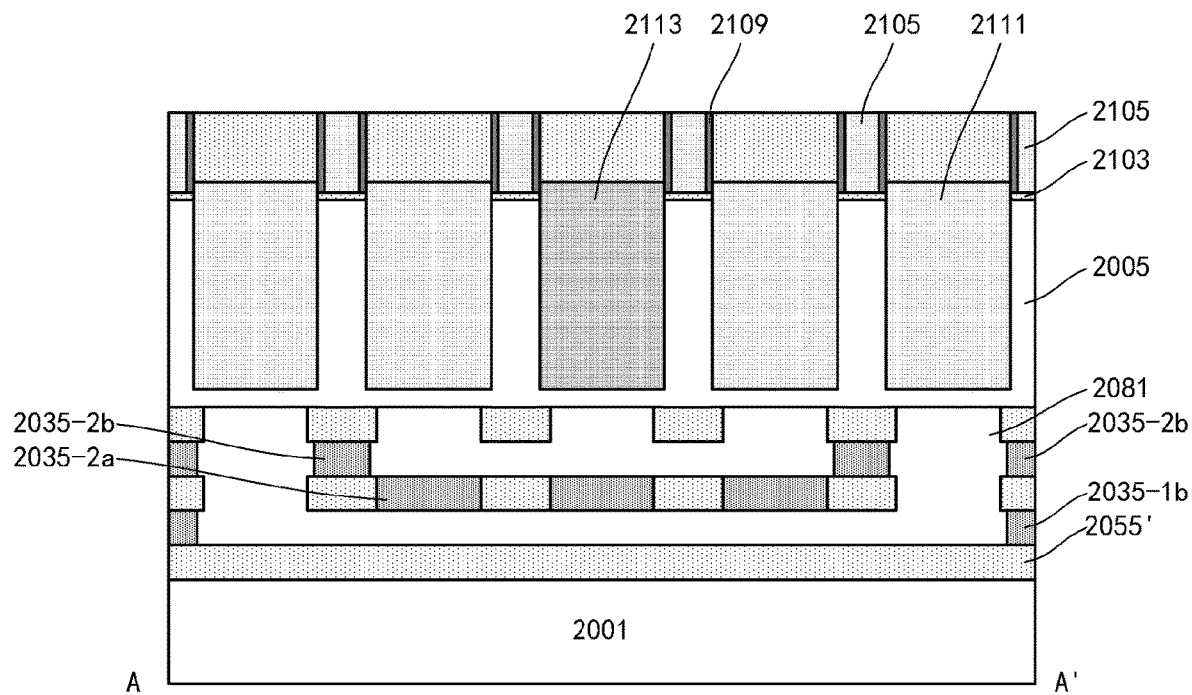

To this end, as shown in FIG. 61, an oxide may be deposited on the structure shown in FIGS. 60 (a), 60 (b) and 60 (c), and the deposited oxide may be planarized such as CMP (which may stop at the sacrificial gate 2105) to fill gaps between among devices. Here, the deposited oxide and the dielectric layer 2055' are still integrally shown as 2055'.

Figure 62A:
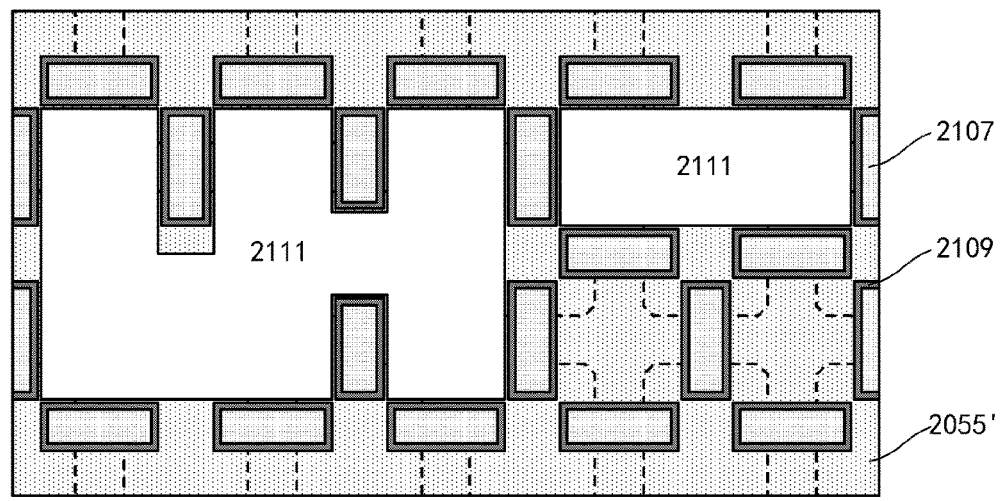
Figure 62B:
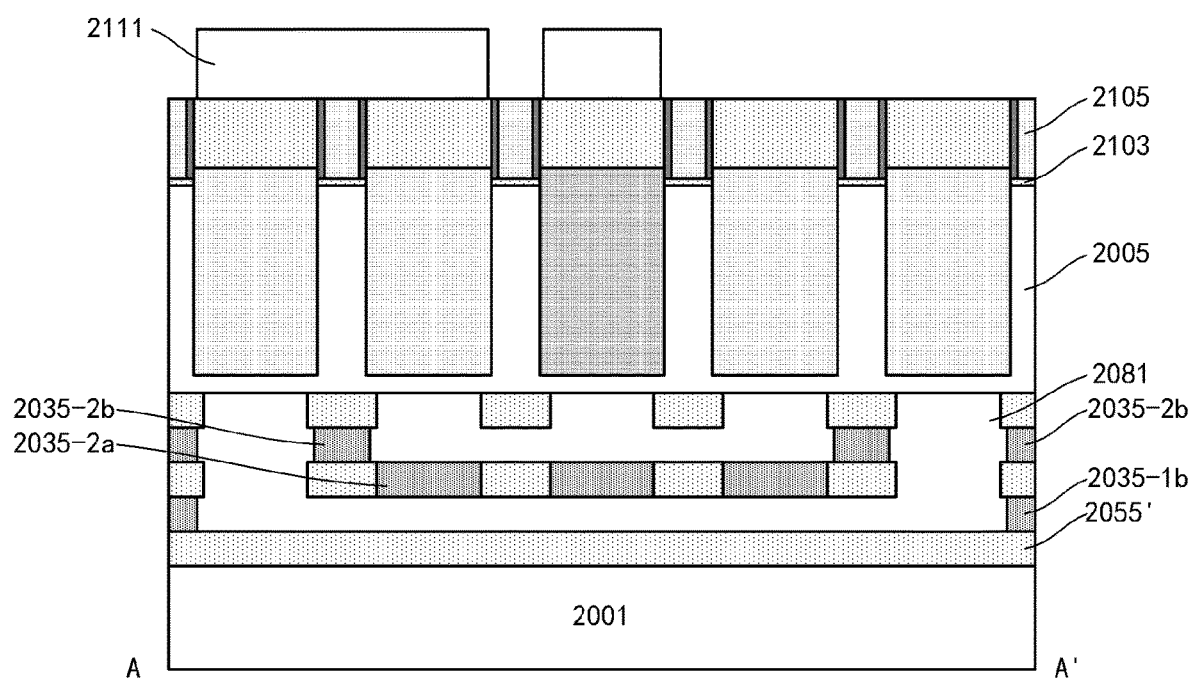
Figure 63A:
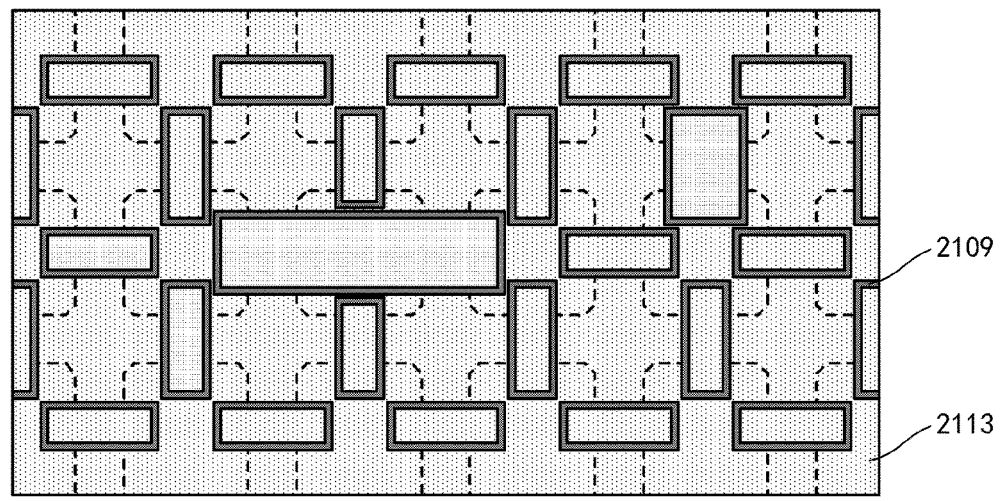
Figure 63B:
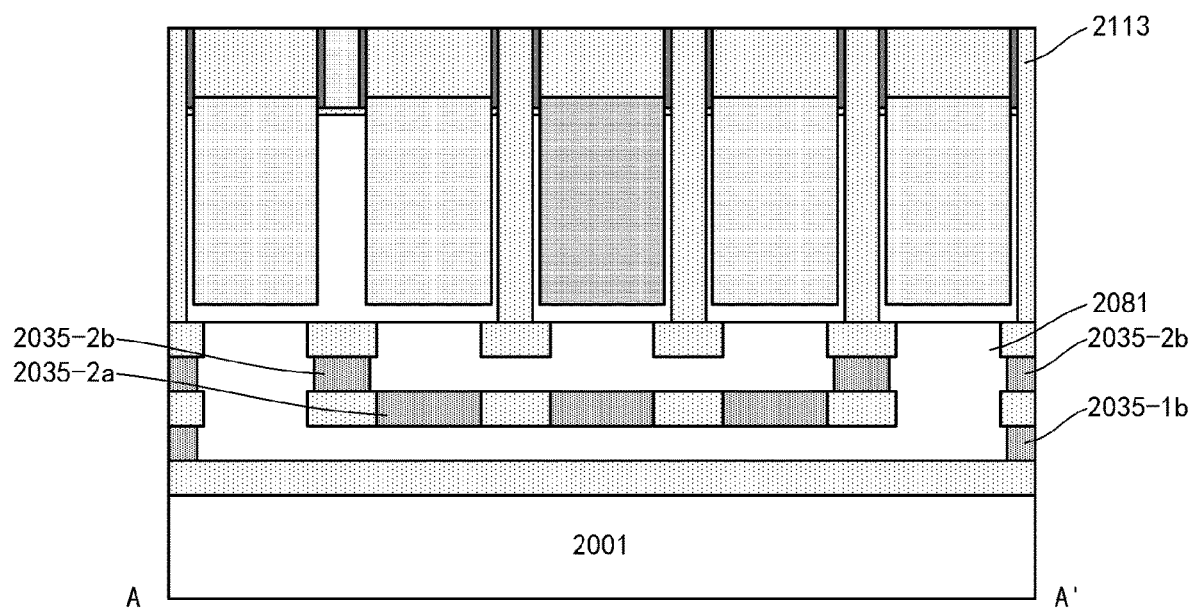
Figure 63C:
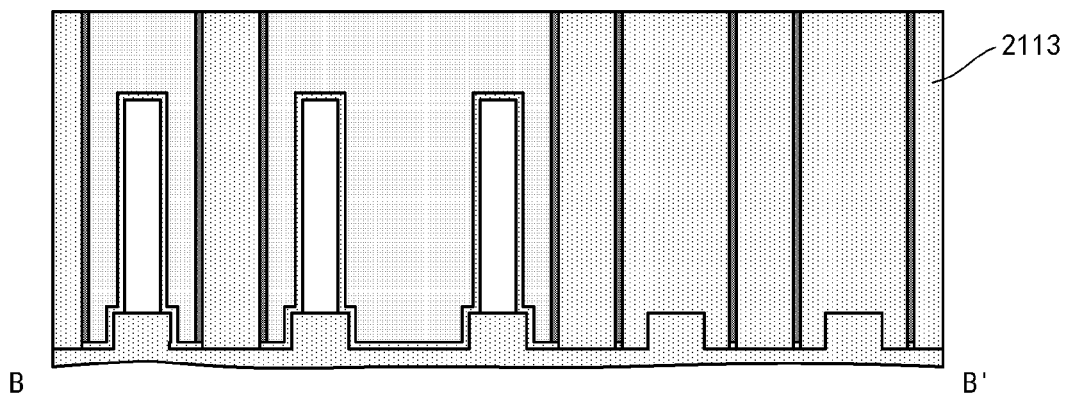

Then, as shown in FIGS. 62 (a) and 62 (b), a photoresist 2111 may be formed on the dielectric layer 2055', and patterned to cover sacrificial gates that need to be replaced with real gates and expose sacrificial gates that define isolation positions between the active regions according to the layout design. Next, as shown in FIGS. 63(a), 63(b) and 63(c), the photoresist 2111 may be used as a mask to selectively etch the sacrificial gate electrode layer 2105 and the sacrificial gate dielectric layer 2103 to expose the underlying fin precursor layer 2005 (the middle portion of the corresponding bridging portion). The exposed fin precursor layer 2005 may be selectively etched such as RIE, and the RIE may stop at the underlying dielectric layer 2055', so that the fin precursor layer 2005 is cut off at corresponding positions. After that, the photoresist 2111 may be removed. On an inner side of the corresponding sacrificial gate spacers, a dielectric such as oxide may be filled by deposition and then CMP to achieve electrical isolation. Here, the filled dielectric and the dielectric layer 2055' are integrally shown as 2113.

Figure 64A:
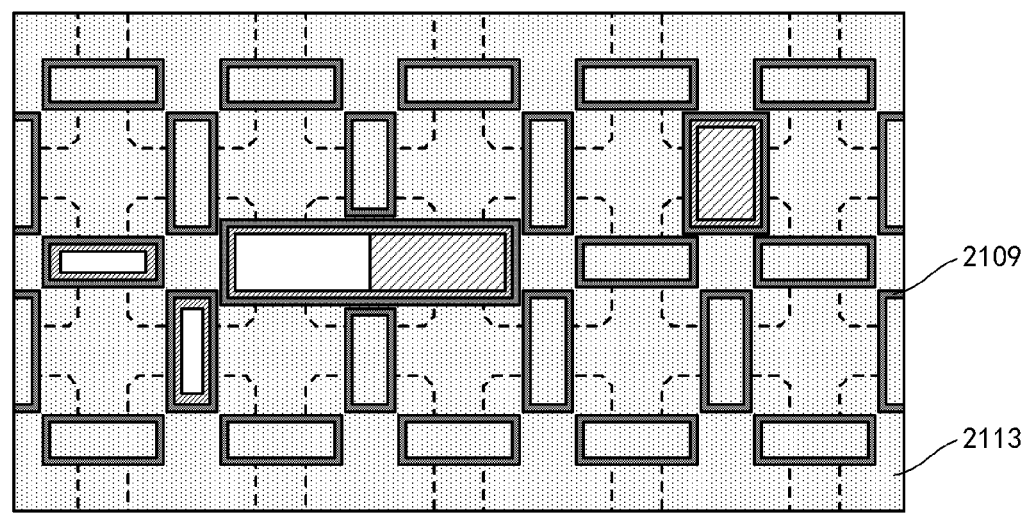
Figure 64B:
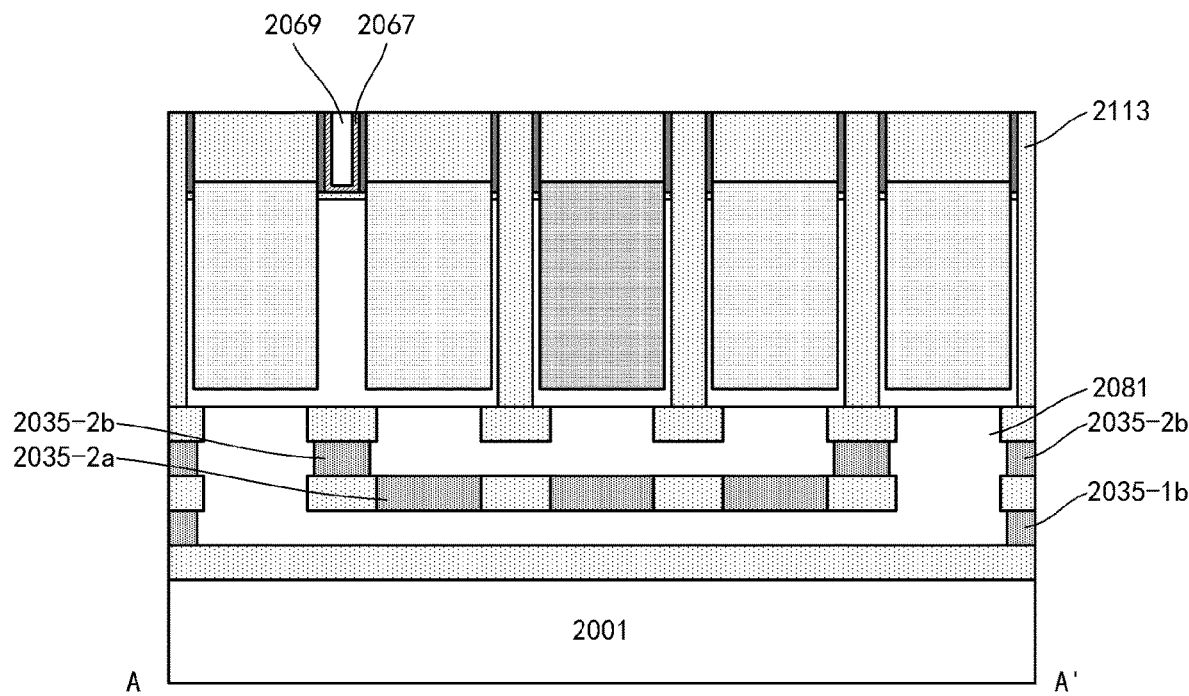
Figure 64C:
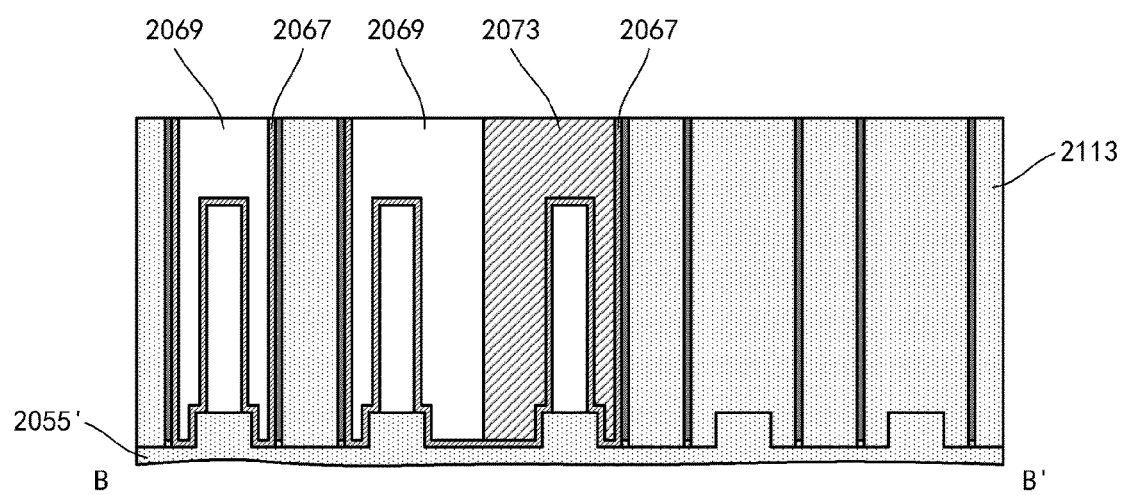

Next, the gate replacement may be performed. As shown in FIGS. 64(a), 64(b) and 64(c), the sacrificial gate electrode layer 2105 and the sacrificial gate dielectric layer 2103 may be removed by selective etching, and a gate dielectric layer 2067 and gate electrode layers 2069 and 2073 are formed in a space left by the removal of the sacrificial gate electrode layer 2105 and the sacrificial gate dielectric layer 2103. For details of the gate dielectric layer 2067 and the gate electrode layers 2069 and 2073, reference may be made to the above description of the gate dielectric layer 1067 and the gate electrode layers 1069 and 1073. There are various ways to perform gate replacement in the art, which may not be repeated here.

Figure 65A:
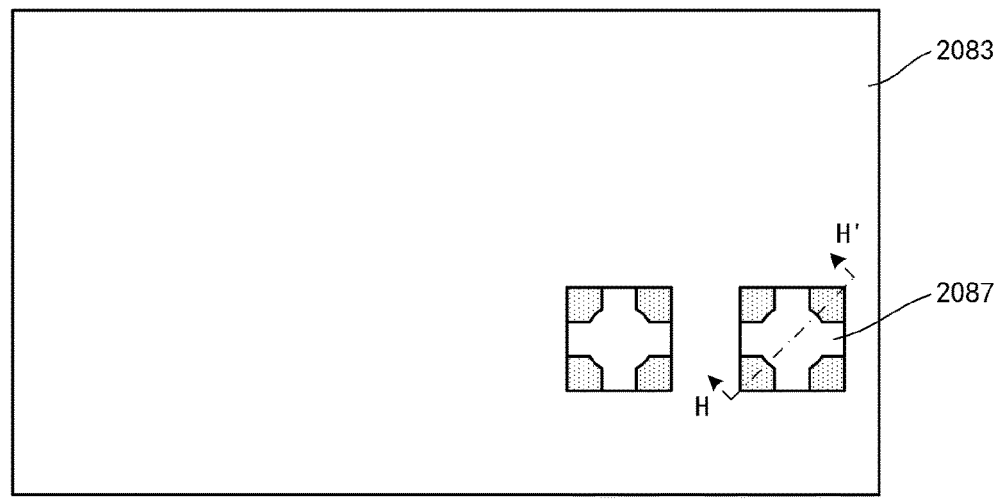
Figure 65B:
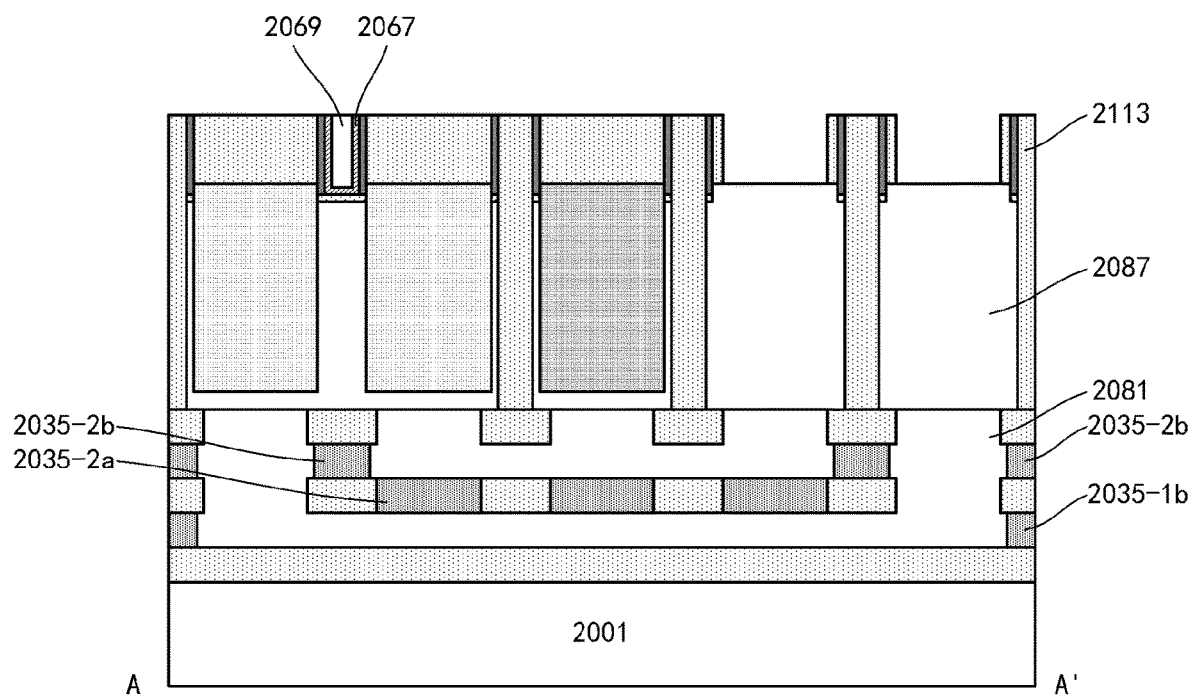
Figure 65C:
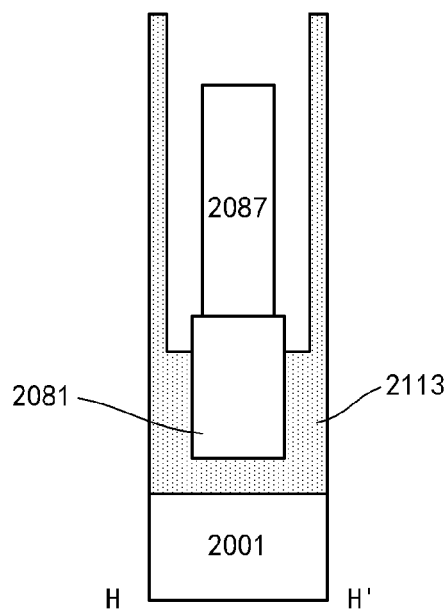

Similar to the above embodiments, some of the source/drain regions may define contact plugs. As shown in FIGS. 65(a), 65(b), and 65(c), a photoresist 2083 may be formed and patterned to have openings where contact plugs need to be formed. The dielectric layer 2113 may be recessed by selective etching such as RIE through the openings in the photoresist 2083, so as to expose the source/drain regions at the corresponding positions. The exposed source/drain regions may be converted into contact plugs 2087 through a silicification processing. For details of the silicification processing, reference may be made to the above description.

Figure 66A:
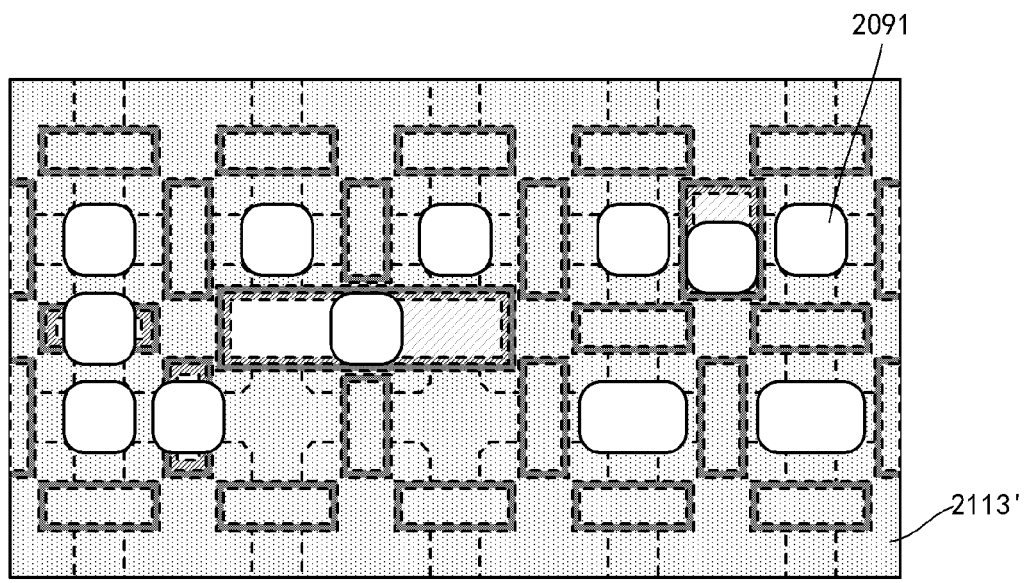
Figure 66B:
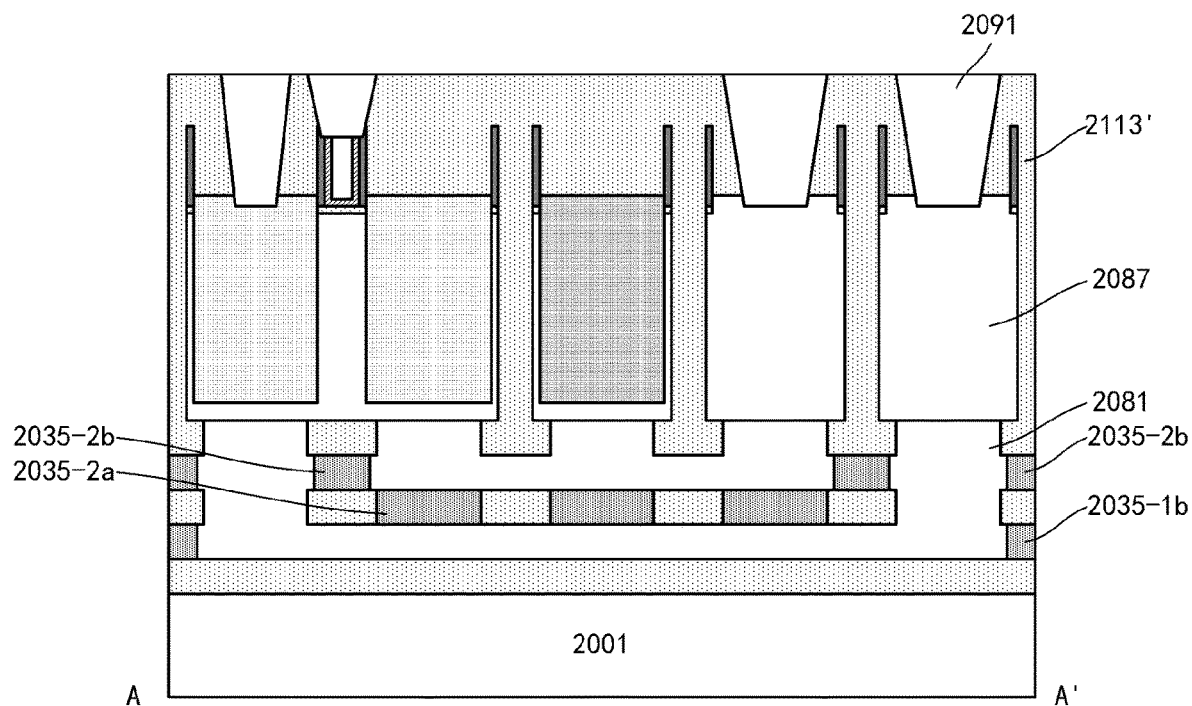

Connections between some of the source/drain regions of the devices and the interconnection structure are achieved through the above processing. In addition, for some source/drain regions, gate electrodes, and contact plugs of the devices, contact portions may be formed above the devices. For example, as shown in FIG. 66(a) and FIG. 66(b), a dielectric such as an oxide (here, shown as 2113' integrally with the dielectric layer 2113) may be deposited to fill the gaps in the structure to achieve inter-device electrical isolation. In addition, contact portions 2091 penetrating the dielectric layer 2113' may be formed. Since electrical connections to some source/drain regions may be achieved through the interconnection structure under the devices, an area of metal interconnections above the devices may be made more abundant, which is beneficial to the miniaturization of the devices.

FIGS. 67 to 70(*b*) show schematic diagrams of some stages in a process for manufacturing a planar semiconductor device according to the embodiments of the disclosed technology. In the following, differences from the above-mentioned embodiments may be mainly described, and the overlapping descriptions with the above-mentioned embodiments may be simplified or omitted.

Figure 67:
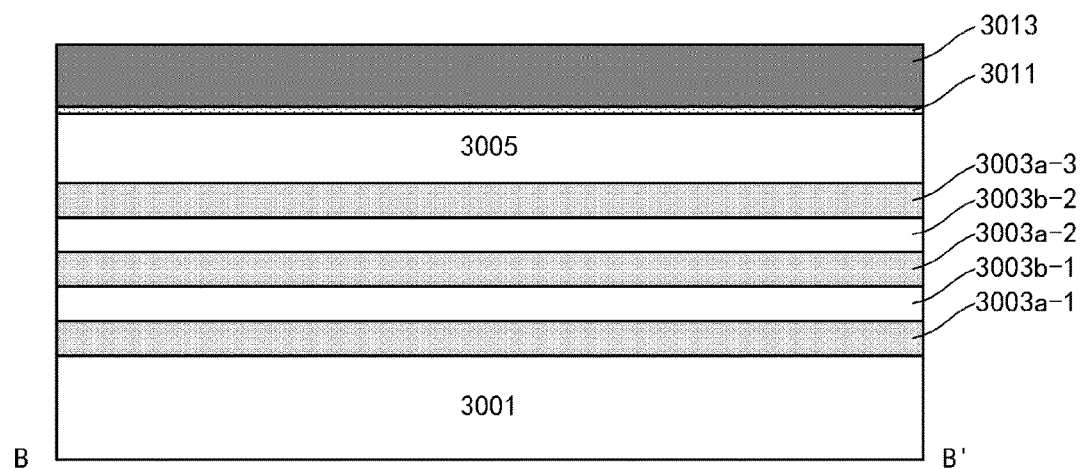
FIGS. 67 to 70(*b*) show schematic diagrams of some stages in a process for manufacturing a planar semiconductor device according to the embodiments of the disclosed technology, in which FIGS. 68(*a*), 69(*a*), 70(*a*) are top views.

As shown in FIG. 67, a first stack of alternately arranged first sacrificial layers 3003*a*-1, 3003*a*-2, 3003*a*-3 and second sacrificial layers 3003*b*-1, 3003*b*-2 may be formed on a substrate 3001. For details about the substrate 3001 and the first sacrificial layers 3003*a*-1, 3003*a*-2, 3003*a*-3 and the second sacrificial layers 3003*b*-1, 3003*b*-2, reference may be made to the above description of the substrate 1001 and the first sacrificial layers 1003*a*-1, 1003*a*-2, 1003*a*-3 and the second sacrificial layers 1003*b*-1, 1003*b*-2.

An active layer 3005 may be formed on the first stack by, for example, epitaxial growth. The active layer 3005 may include a suitable semiconductor material such as Si. Compared with the fin precursor layer 2005, the active layer 3005 may be relatively thin, for example, about 5 nm to 70 nm.

Figure 68A:
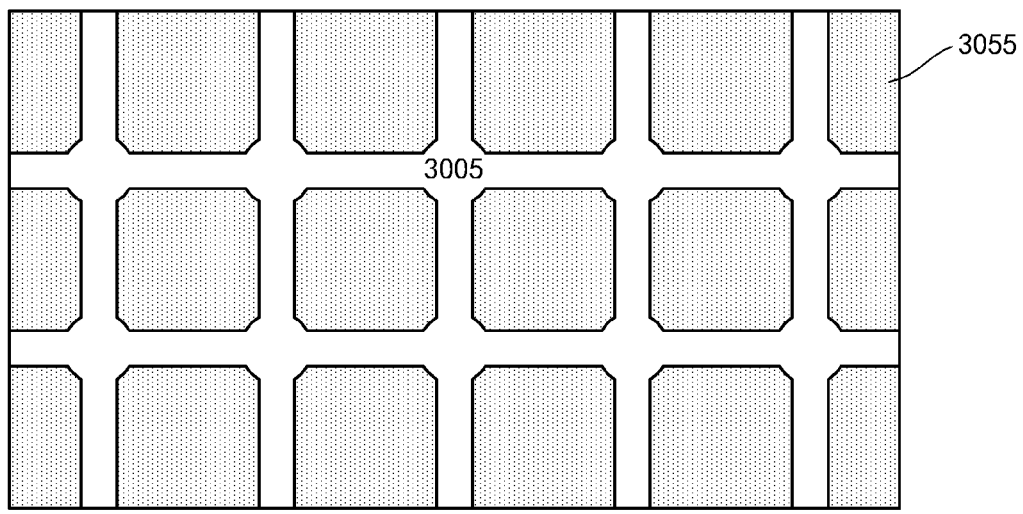
Figure 68B:
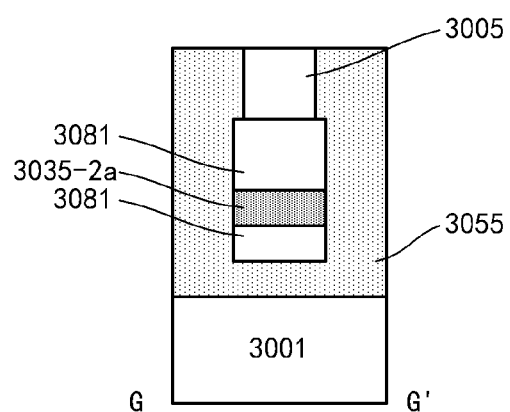

Similar to the embodiments described above, a grid pattern may be defined in the first stack and the active layer 3005. For this, reference may be made to the above description in conjunction with FIGS. 54(*a*) to 57(*d*). Then, as described above in conjunction with FIG. 58, a protective layer on sidewalls of the grid pattern of the active layer 3005 may be removed, and a dielectric layer 3055 may be formed. A difference from the above-mentioned embodiments is that when the dielectric layer 3055 is formed, CMP may stop on a top surface of the active layer 3005 without re-etching the dielectric layer 3055, so as to obtain the structure as shown in FIG. 68(*a*) and FIG. 68(*b*). That is, in this embodiment, the active layer 3005 does not need to be relatively protruding as in the FinFET. Regarding the 3081, 3035-2*a* shown in the drawings, reference may be made to the above description about 1081, 1035-2*a*.

After that, a device may be manufactured based on the active layer 3005. The process for manufacturing the device may be substantially the same as the process for manufacturing the FinFET described above, except that forms of the active regions are different.

Figure 69A:
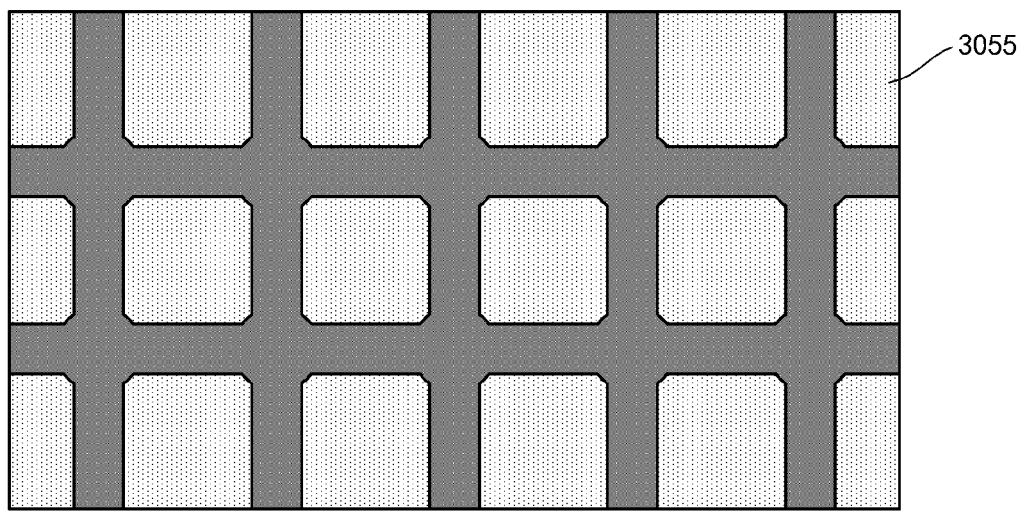
Figure 69B:
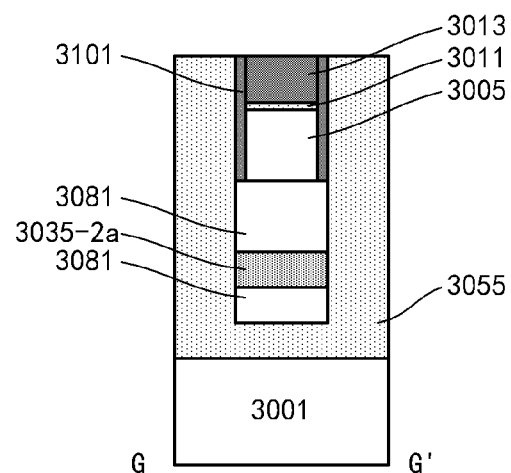
Figure 70A:
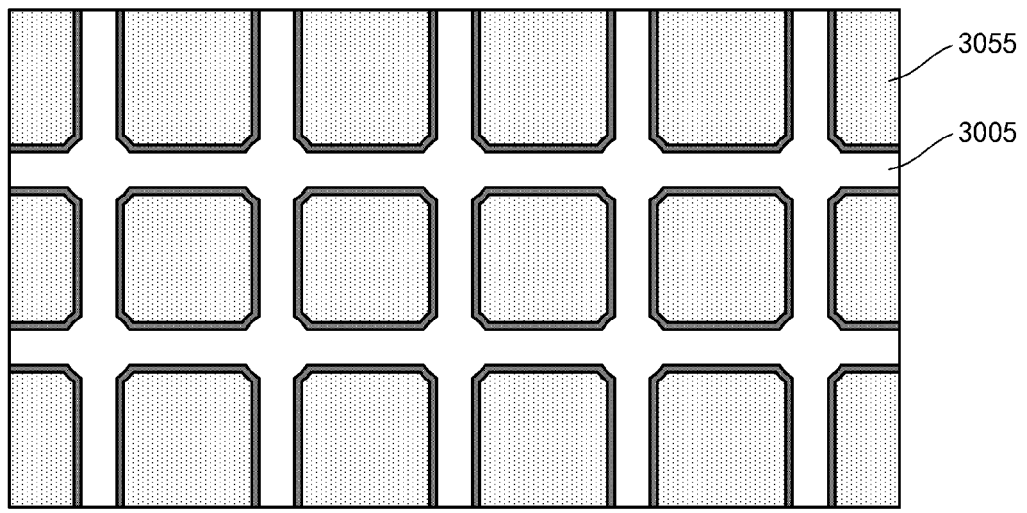
Figure 70B:
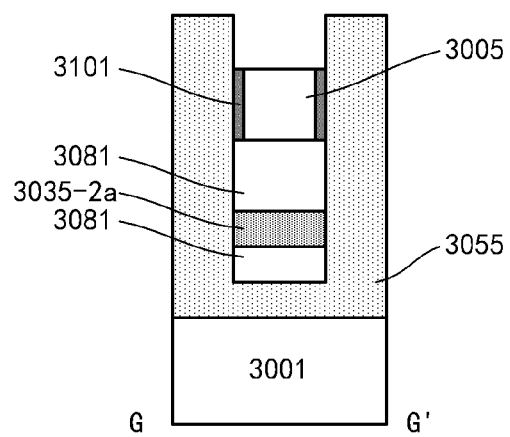

According to the embodiments of the disclosed technology, as shown in FIG. 69(*a*) and FIG. 69(*b*), after defining the grid pattern as described above in conjunction with FIGS. 54(*a*) to 57(*d*), the protective layer 3101 on the sidewalls of the active layer 3005 in the grid pattern may not be removed. Regarding the protective layer 3101, reference may be made to the description of the protective layer 2101 above. With the protective layer 3101 remaining, a dielectric layer 3055 is formed. When the dielectric layer 3055 is formed, CMP may stop at a second sub-layer 3013 of the hard mask layer. This may reduce a damage of CMP to the active layer 3005. After that, as shown in FIG. 70(*a*) and FIG. 70(*b*), the second sub-layer 3013 and the protective layer 3101 of nitride may be etched back by selective etching to expose the first sub-layer 3011 underneath. In order to accurately control an amount of etch-back, ALE may be used. Then, the first sub-layer 3013 may be selectively etched to expose a surface of the active layer 3005.

After that, a device may be manufactured based on the active layer 3005. Regarding the first sub-layer 3011 and the second sub-layer 3013, reference may be made to the description of the first sub-layer 1011 and the second sub-layer 1013 above.

The interconnection structure and circuit according to the embodiments of the disclosed technology may be applied to various electronic apparatuses. For example, an integrated circuit (IC) may be formed based on such an interconnection structure or circuit, and an electronic apparatus may be constructed therefrom. Therefore, the disclosed technology also provides an electronic apparatus including the above-mentioned semiconductor device. The electronic apparatus may also include components such as a display screen matched with the integrated circuit and a wireless transceiver matched with the integrated circuit. Such electronic apparatus may include a smart phone, a computer, a tablet computer (PCs), a wearable smart apparatus, a mobile power supply, and so on.

According to the embodiments of the disclosed technology, a method for manufacturing a system on chip (SoC) is also provided. The method may include the methods described above. Specifically, a plurality of types of devices may be integrated on the chip, at least some of which are manufactured according to the method of the disclosed technology.

According to the embodiments of the disclosed technology, the following aspects

What is claimed is:

1. An interconnection structure of a plurality of semiconductor devices formed on a substrate, wherein the interconnection structure is arranged under the plurality of semiconductor devices, and the interconnection structure comprises:
    at least one via layer and at least one interconnection layer alternately arranged in a direction from the semiconductor device to the substrate,
    wherein via holes in each via layer are arranged under a first group of source/drain regions in the plurality of semiconductor devices, and insulating portions in each via layer are arranged under a second group of source/drain regions in the plurality of semiconductor devices,
    wherein each interconnection layer comprises conductive nodes respectively arranged under at least a part of the plurality of semiconductor devices, and in a same interconnection layer, a conductive channel is provided between at least one conductive node and at least another node; and
    wherein the via holes in each via layer and the conductive nodes in each interconnection layer corresponding to the via holes at least partially overlap with each other in the direction from the semiconductor device to the substrate.

2. The interconnection structure according to claim 1, wherein the via holes in each via layer and the corresponding conductive nodes in each interconnection layer are substantially aligned with each other in the direction from the semiconductor device to the substrate.

3. The interconnection structure according to claim 1, wherein the plurality of semiconductor devices comprise at least one of a vertical semiconductor device, a planar semiconductor device, or a fin field effect transistor.

4. The interconnection structure according to claim 1, wherein at least one via hole in each via layer, the corresponding conductive nodes in each interconnection layer, and source/drain regions of corresponding semiconductor devices are substantially aligned with each other in the direction from the semiconductor device to the substrate.

5. The interconnection structure according to claim 1, wherein the direction from the semiconductor device to the substrate is a direction substantially perpendicular to a surface of the substrate.

6. The interconnection structure according to claim 1, wherein the via holes in each via layer are substantially coplanar, and the conductive nodes and the conductive channels in each interconnection layer are substantially coplanar.

7. The interconnection structure according to claim 1, wherein the insulating portions in each via layer and the corresponding conductive nodes in each interconnection layer at least partially overlap with each other in the direction from the semiconductor device to the substrate.

8. The interconnection structure according to claim 7, wherein the via holes in each via layer and the corresponding conductive nodes in each interconnection layer are substantially aligned with each other in the direction from the semiconductor device to the substrate; and
wherein the insulating portions in each via layer and the corresponding conductive nodes in each interconnection layer are substantially aligned with each other in the direction from the semiconductor device to the substrate;
wherein the via holes in each via layer, the corresponding conductive nodes in each interconnection layer, and the source/drain regions of corresponding semiconductor devices are substantially aligned with each other in the direction from the semiconductor device to the substrate, and the insulating portions in each via layer, the corresponding conductive nodes in each interconnection layer, and the source/drain regions of the corresponding semiconductor devices are substantially aligned with each other in the direction from the semiconductor device to the substrate;
wherein a layout of the via holes and the insulating portions in each via layer is substantially the same as a layout of the conductive nodes in each interconnection layer;
wherein the via holes and insulating portions in each via layer are substantially coplanar, and the conductive nodes and conductive channels in each interconnection layer are substantially coplanar;
wherein an insulating material of the insulating portions is different from an insulating material of an interlayer dielectric layer in the interconnection structure;
wherein the via holes and the insulating portions have substantially a same lateral dimension.

9. The interconnection structure according to claim 1, wherein each conductive node in each interconnection layer has a main body portion arranged under the corresponding semiconductor device and an extension portion extending from the main body portion toward an adjacent conductive node; and
wherein extension portions facing each other of each pair of adjacent conductive nodes extend substantially along a same straight line; and
wherein extension portions facing each other of at least one pair of adjacent conductive nodes extend to be connected to each other to form at least a part of the conductive channels.

10. The interconnection structure according to claim 9, wherein the extension portion has a thickness that is smaller than a thickness of the main body portion;
wherein an insulating portion is located between the extension portions facing each other of at least one pair of adjacent conductive nodes, and the insulating portion and the extension portions extend substantially along a same straight line;
wherein at least one main body portion in each interconnection layer is substantially aligned with source/drain regions of a corresponding semiconductor device in the direction from the semiconductor device to the substrate;
wherein each semiconductor device is a vertical semiconductor device, and in a top view, the extension portion extends beyond an outer periphery of an active region of a corresponding semiconductor device;
wherein the via holes in each via layer are respectively located at positions of at least a part of points in a two-dimensional lattice arranged in rows and columns, and the main body portions in each interconnection layer are located at positions of at least a part of the points in the two-dimensional lattice, and the extension portions in each interconnection layer extend in a row direction or a column direction.

11. The interconnection structure according to claim 10, wherein an insulating material of the insulating portion is different from an insulating material of an interlayer dielectric layer in the interconnection structure;
wherein the insulating portion and the extension portions are substantially aligned in a direction of the straight line;
wherein a cross section of the insulating portion perpendicular to the straight line has substantially a same shape as a cross section of the extension portions perpendicular to the straight line;
wherein the insulating portion is located at a substantially central position between main body portions on both sides of the insulating portion;
wherein in the top view, each interconnection layer has a grid pattern defined by the rows and columns.

12. The interconnection structure according to claim 1, wherein the via holes, the conductive nodes, and the conductive channels comprise a metal silicide;
wherein a channel material of at least a part of each semiconductor device is a single crystal semiconductor material.

13. An electronic apparatus comprising the interconnection structure according to claim 1.

14. A circuit, comprising:
a substrate;
an interconnection structure arranged on the substrate, wherein the interconnection structure comprises at least one via layer and at least one interconnection layer alternately arranged in a direction substantially perpendicular to a surface of the substrate, and an uppermost layer of the interconnection structure is a via layer; and
a plurality of semiconductor devices arranged on the interconnection structure;
wherein each via layer comprises via holes arranged at positions of at least a part of points in a two-dimensional lattice arranged in rows and columns;
each interconnection layer comprises main body portions arranged at positions of at least a part of points in a two-dimensional lattice, and extension portions extending from the main body portions in a row direction or a column direction, and the extension portions facing each other of at least a part of adjacent main body portions are in contact, and
source/drain regions of at least a part of the plurality of semiconductor devices are in contact with corresponding via holes in the uppermost via layer.

15. The circuit according to claim 14, wherein in each interconnection layer, an insulating portion is located between the extension portions facing each other extending from at least a part of adjacent main body portions, and the insulating portion and the extension portions extend in a same direction and are substantially coplanar.

16. The circuit according to claim 14, wherein the main body portion in each interconnection layer has a thickness that is greater than a thickness of the extension portion in each interconnection layer.

17. The circuit according to claim 14, wherein the via holes in each via layer are located at a first group of points in the two-dimensional lattice, and the insulating portions in each via layer are located at a second group of points different from the first group of points in the two-dimensional lattice, and the insulating portions and the via holes are substantially coplanar.

18. The circuit according to claim 14, wherein,
at least a part of the plurality of semiconductor devices are vertical semiconductor devices, comprising vertical active regions extending in a direction substantially perpendicular to the surface of the substrate at positions of at least a part of the points in the two-dimensional lattice; or
at least a part of the plurality of the semiconductor devices are planar semiconductor devices or fin field effect transistors, comprising horizontal active regions or fins extending in the row direction or the column direction.

19. The circuit according to claim 18, wherein each vertical semiconductor device comprises a gate electrode formed around a channel region in a vertical active region, and each gate electrode comprises a main body portion located at a corresponding point in the two-dimensional lattice and an extension portion extending from the main body portion in the row or column direction, extension portions facing each other of at least a part of the adjacent gate electrodes are in contact with each other.

20. The circuit according to claim 19, wherein the gate electrodes are substantially coplanar.

21. The circuit according to claim 18, wherein a horizontal active region of each planar semiconductor device or a fin of each fin field effect transistor comprises a channel region located between adjacent points in the two-dimensional lattice, and source/drain regions located on both sides of the channel region.

22. The circuit according to claim 21, wherein each planar semiconductor device or fin-type field-effect transistor comprises a gate electrode that extends in a direction crossing an extension direction of a corresponding horizontal active region or fin and overlaps a corresponding channel region in a vertical direction.

23. The circuit according to claim 22, wherein,
active regions of each of at least a part of the adjacent planar semiconductor devices or active regions of each of at least a part of the fin field effect transistors are electrically isolated by insulating portions between the active regions, and
wherein the circuit further comprises a dielectric spacer formed around each gate electrode and at least an upper sidewall of each insulating portion.

24. The circuit according to claim 14, further comprising: contact plugs located at a part of points in the two-dimensional lattice on the interconnection structure.

25. The circuit according to claim 24, further comprising: contact portions located at positions of at least a part of the points in the two-dimensional lattice on the plurality of semiconductor devices, and wherein the contact portions extend downwardly to contact the source/drain regions or the contact plugs of the corresponding semiconductor devices;
wherein at least a part of the plurality of the semiconductor devices are vertical semiconductor devices, comprising vertical active regions extending in the direction substantially perpendicular to the surface of the substrate at positions of at least a part of the points in the two-dimensional lattice, and wherein the contact plugs and the vertical active regions are substantially coplanar; or at least a part of the plurality of the semiconductor devices are planar semiconductor devices or a fin field effect transistors, comprising horizontal active regions or fins extending in the row direction or the column direction, and wherein the contact plugs and the source/drain regions in the horizontal active regions or fins are substantially coplanar;
wherein at least a part of the contact plugs are in contact with the uppermost via holes;
wherein at least a part of the plurality of the semiconductor devices are vertical semiconductor devices, comprising vertical active regions extending in the direction substantially perpendicular to the surface of the substrate at positions of at least a part of the points in the two-dimensional lattice, and wherein each vertical semiconductor device comprises a gate electrode formed around a channel region in the vertical active region, and at least a part of the contact plugs are in contact with the gate electrodes of the adjacent vertical semiconductor devices;
wherein the via hole comprises a metal silicide, the main body portion and the extension portion in the interconnection layer comprise a metal silicide, and the contact plug comprises a metal silicide.

26. The circuit according to claim 25, wherein each of the at least a part of the contact plugs comprises a main body portion located at a corresponding point in the two-dimensional lattice, and an extension portion extending in the row or column direction from the main body portion to the adjacent vertical semiconductor device, and the extension portion is in contact with the gate electrode of the adjacent vertical semiconductor device and is substantially coplanar with the gate electrode.

27. The circuit according to claim 14, further comprising: a hard mask layer arranged above the active region, wherein the hard mask layer has a grid pattern defined by the rows and the columns;
wherein the active region comprises a single crystal semiconductor material;
wherein the channel region of the semiconductor device comprises a single crystal semiconductor material.

28. An electronic apparatus comprising the circuit according to claim 14.

* * * * *